(12) United States Patent
Kirkpatrick et al.

(10) Patent No.: US 11,735,432 B2
(45) Date of Patent: *Aug. 22, 2023

(54) METHOD AND APPARATUS FOR FORMING SUBSTRATE SURFACES WITH EXPOSED CRYSTAL LATTICE USING ACCELERATED NEUTRAL ATOM BEAM

(71) Applicant: Exogenesis Corporation, Billerica, MA (US)

(72) Inventors: Sean R. Kirkpatrick, Littleton, MA (US); Kiet A. Chau, North Reading, MA (US); Thy Yam, Billerica, MA (US); Michael J. Walsh, Middleton, MA (US)

(73) Assignee: EXOGENESIS CORPORATION, Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/225,272

(22) Filed: Apr. 8, 2021

(65) Prior Publication Data
US 2021/0225661 A1    Jul. 22, 2021

Related U.S. Application Data

(63) Continuation of application No. 15/758,436, filed as application No. PCT/US2016/043628 on Jul. 22, 2016, now Pat. No. 11,004,692.

(Continued)

(51) Int. Cl.
*H01L 21/311* (2006.01)
*C03C 15/02* (2006.01)
(Continued)

(52) U.S. Cl.
CPC ........ *H01L 21/32134* (2013.01); *C03C 15/00* (2013.01); *C03C 15/025* (2013.01); *H01L 21/0234* (2013.01); *H01L 21/02115* (2013.01); *H01L 21/02167* (2013.01); *H01L 21/02227* (2013.01); *H01L 21/02238* (2013.01); *H01L 21/02252* (2013.01); *H01L 21/02274* (2013.01);
(Continued)

(58) Field of Classification Search
None
See application file for complete search history.

(56) References Cited

U.S. PATENT DOCUMENTS

| | | | |
|---|---|---|---|
| 3,644,770 | A | 2/1972 | Bell |
| 5,217,570 | A | 6/1993 | Kadomura |

(Continued)

FOREIGN PATENT DOCUMENTS

| | | |
|---|---|---|
| CN | 101625971 A | 1/2010 |
| CN | 102379005 A | 3/2012 |

(Continued)

*Primary Examiner* — Shamim Ahmed
(74) *Attorney, Agent, or Firm* — Burns & Levinson, LLP; Jerry Cohen

(57) ABSTRACT

A method for removing amorphous regions from a surface of a crystal substrate uses an accelerated neutral beam including reactive gas species for removing or reactively modifying material surfaces without sputtering. Accelerated neutral atom beam enabled surface reactions remove surface contaminants from substrate surfaces to create an interface region with exposed crystal lattice in preparation for next phase processing.

19 Claims, 30 Drawing Sheets

Related U.S. Application Data

(60) Provisional application No. 62/241,273, filed on Oct. 14, 2015.

(51) Int. Cl.
| | |
|---|---|
| *H01L 21/306* | (2006.01) |
| *H01L 21/3213* | (2006.01) |
| *H01L 21/02* | (2006.01) |
| *H01L 21/3065* | (2006.01) |
| *H01L 21/3105* | (2006.01) |
| *C03C 15/00* | (2006.01) |
| *H01L 21/265* | (2006.01) |
| *H01L 21/308* | (2006.01) |

(52) U.S. Cl.
CPC .. *H01L 21/02326* (2013.01); *H01L 21/26566* (2013.01); *H01L 21/3065* (2013.01); *H01L 21/3086* (2013.01); *H01L 21/30604* (2013.01); *H01L 21/3105* (2013.01); *H01L 21/31105* (2013.01); *H01L 21/31111* (2013.01); *H01L 21/31116* (2013.01); *H01J 2237/061* (2013.01); *H01J 2237/0812* (2013.01)

(56) References Cited

U.S. PATENT DOCUMENTS

| | | |
|---|---|---|
| 5,314,839 A | 5/1994 | Mizutani |
| 6,123,603 A | 9/2000 | Tada |
| 6,620,729 B1 | 9/2003 | May |
| 8,460,569 B2 | 6/2013 | Godet |
| 8,691,700 B2 | 4/2014 | Huatala et al. |
| 11,004,692 B2 | 5/2021 | Kirkpatrick et al. |
| 2003/0235385 A1 | 12/2003 | Taylor |
| 2006/0151435 A1 | 7/2006 | Taniguchi |
| 2010/0197142 A1 | 8/2010 | Randolph et al. |
| 2011/0042718 A1 | 2/2011 | Wang |
| 2012/0044596 A1 | 2/2012 | Ishibashi et al. |
| 2012/0045615 A1 | 2/2012 | Kirkpatrick et al. |
| 2013/0024004 A1* | 1/2013 | Khoury ............... C12N 13/00 623/23.72 |
| 2014/0256149 A1 | 9/2014 | Ranjan et al. |
| 2016/0004152 A1 | 1/2016 | Kirkpatrick |
| 2016/0359107 A1 | 12/2016 | Ohsawa et al. |

FOREIGN PATENT DOCUMENTS

| | | |
|---|---|---|
| JP | H09-246232 A | 9/1997 |
| JP | 2010-211879 A | 9/2010 |
| JP | 2013-137397 A | 9/2013 |

* cited by examiner

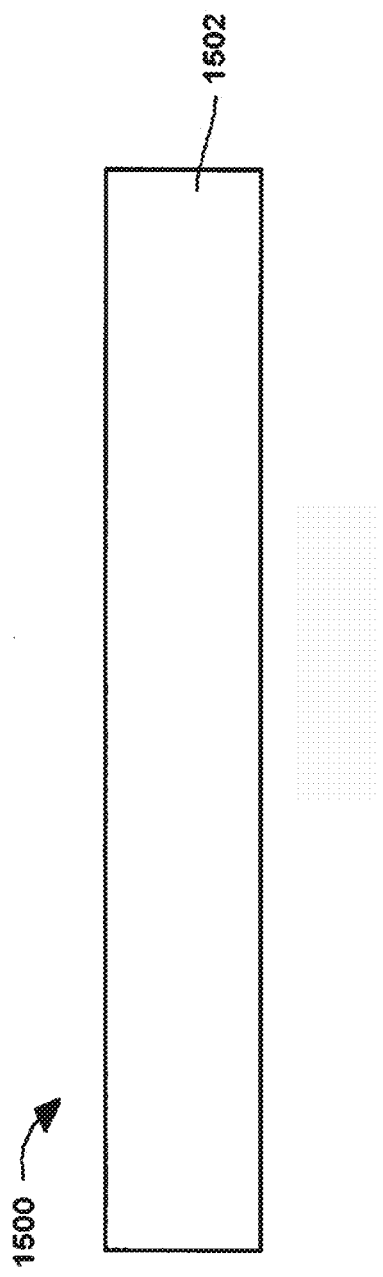
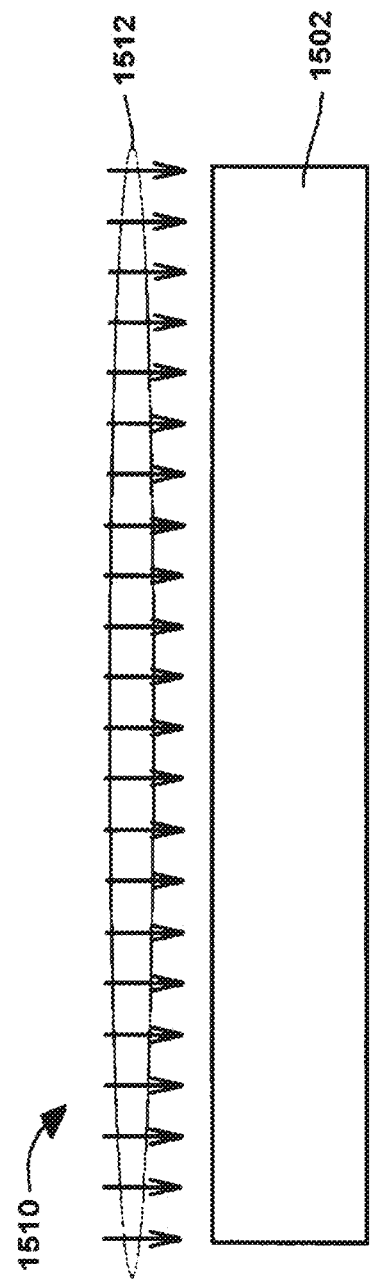

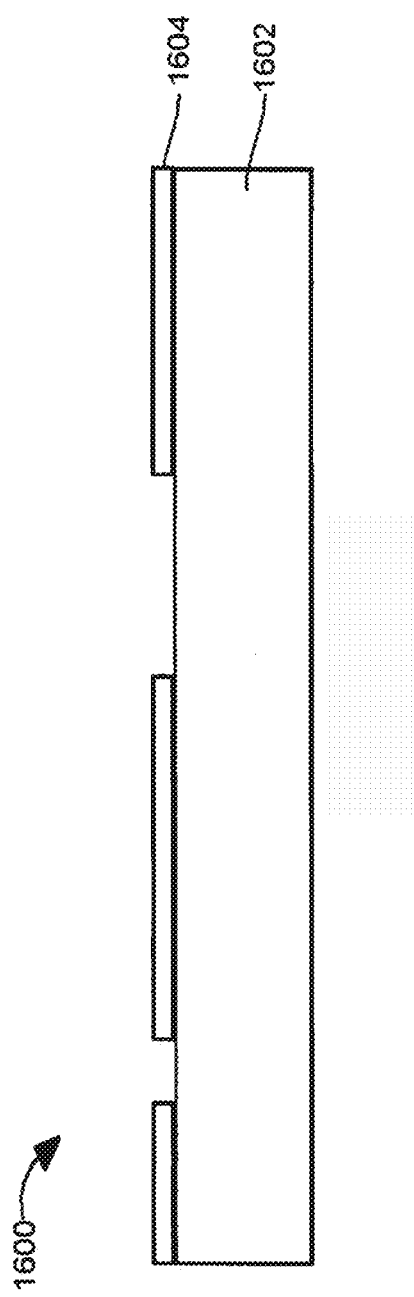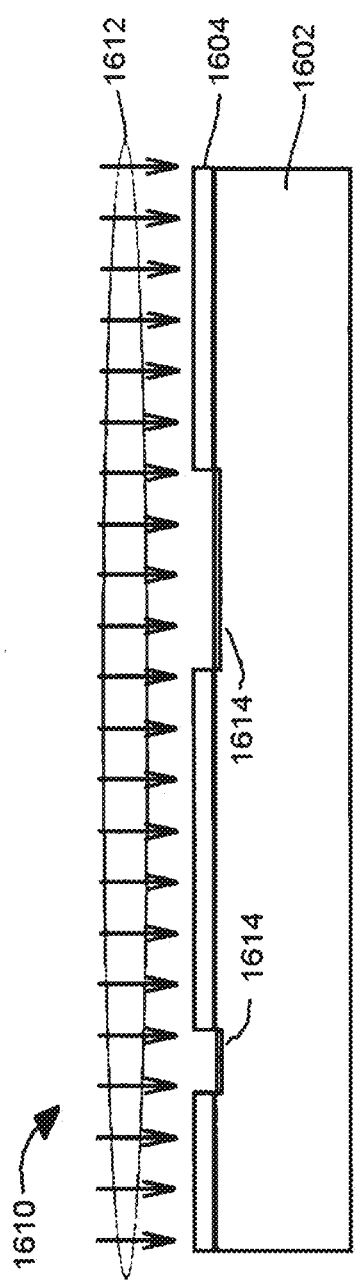

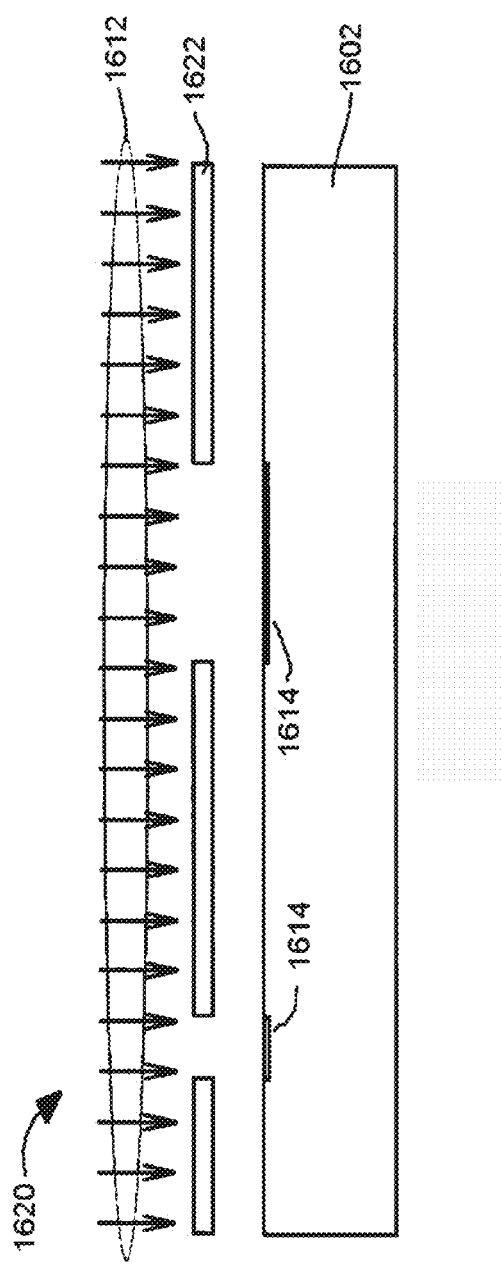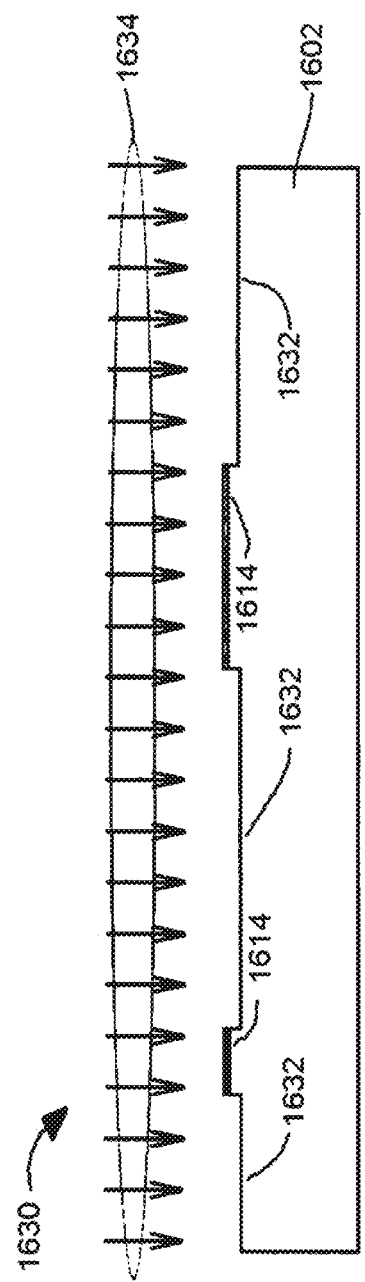

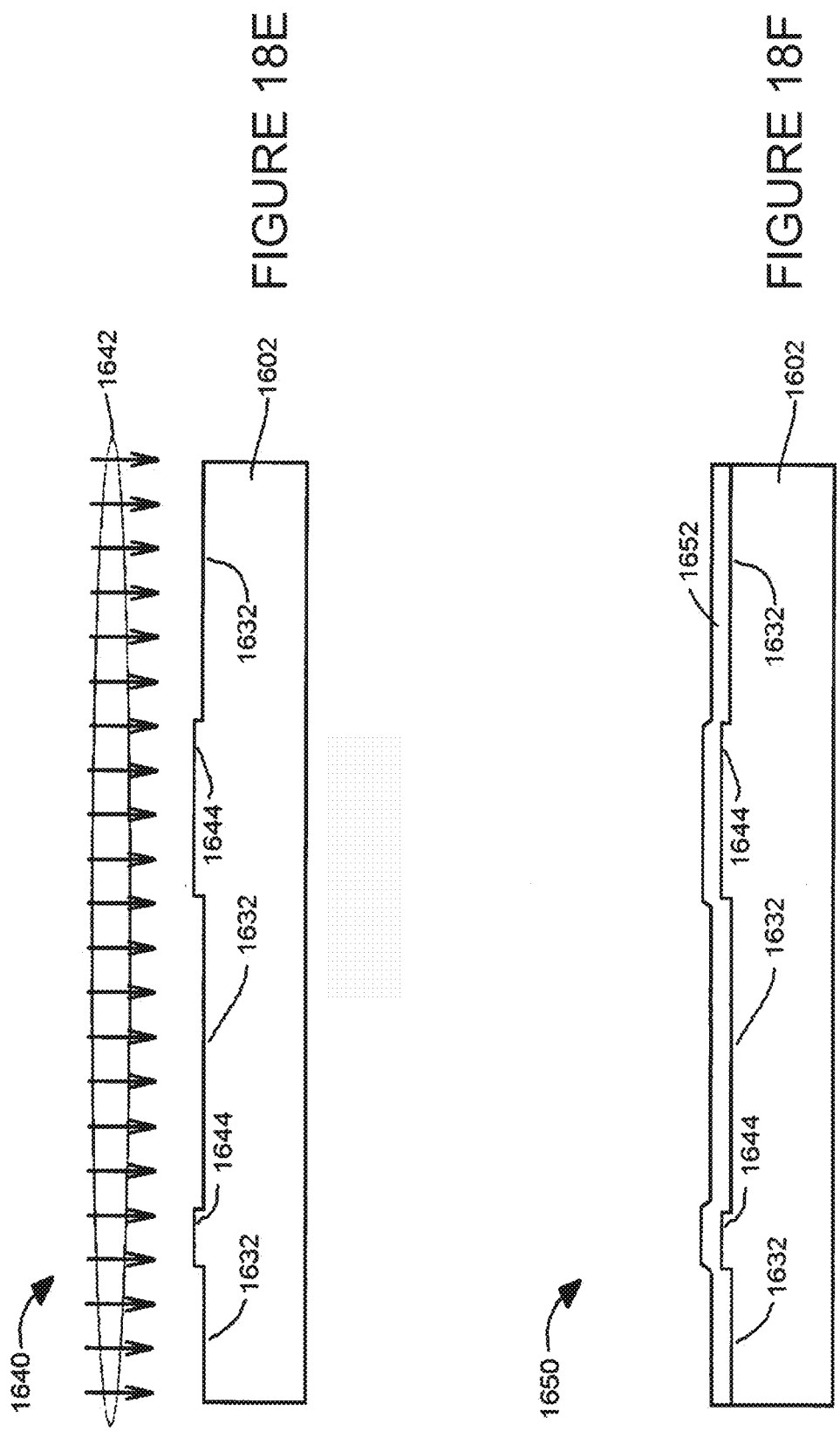

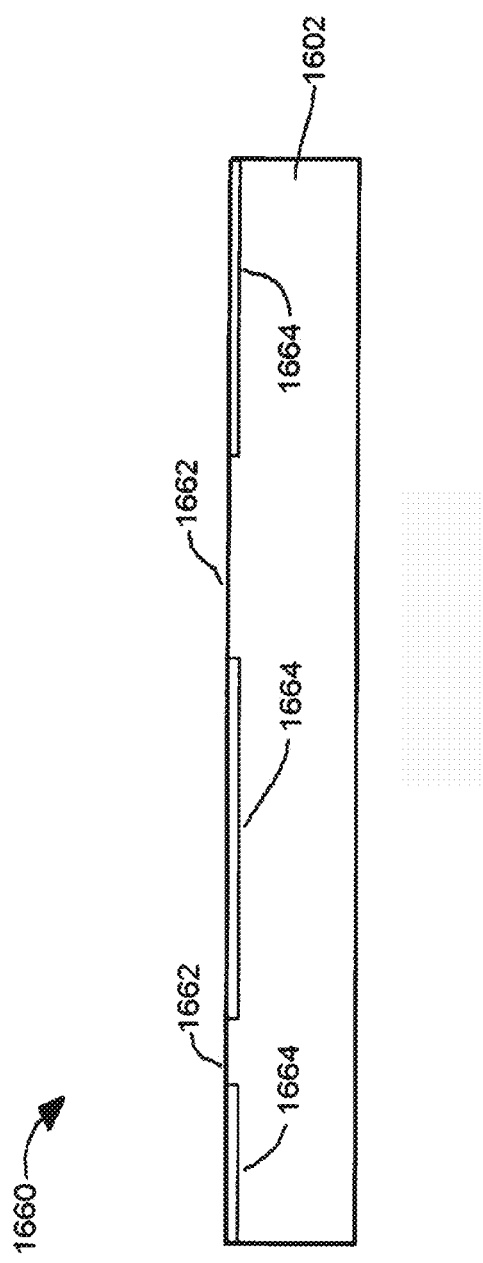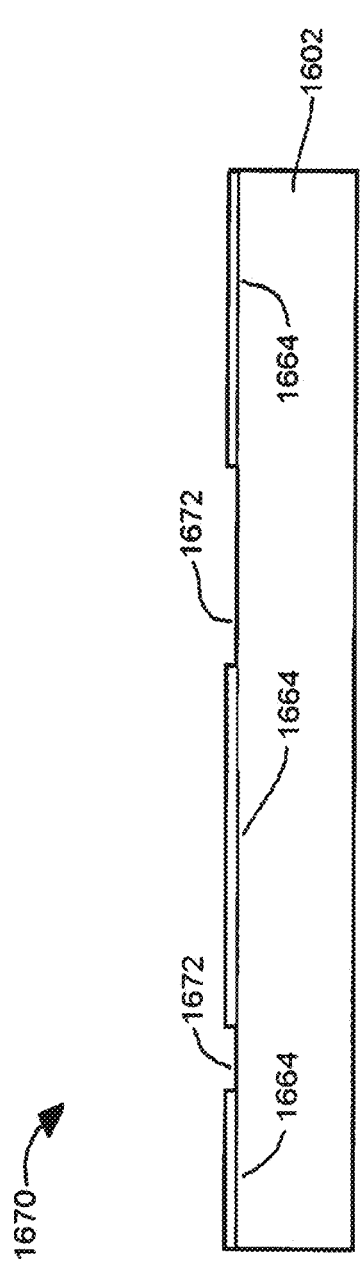

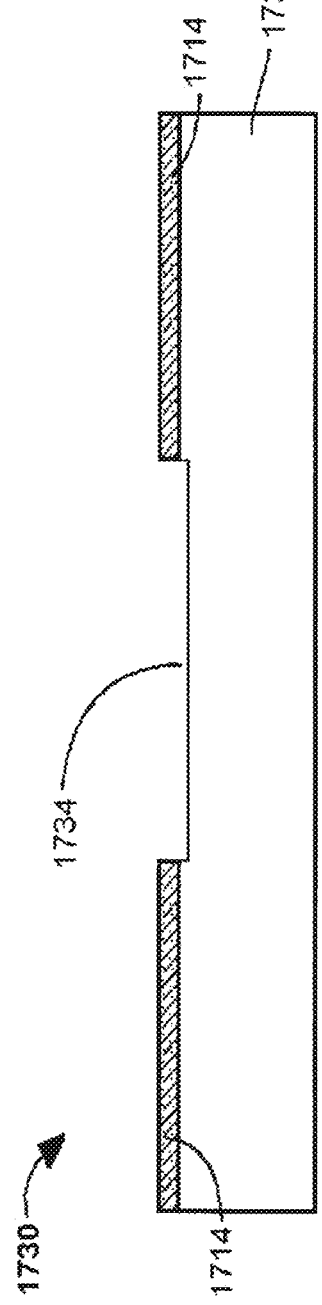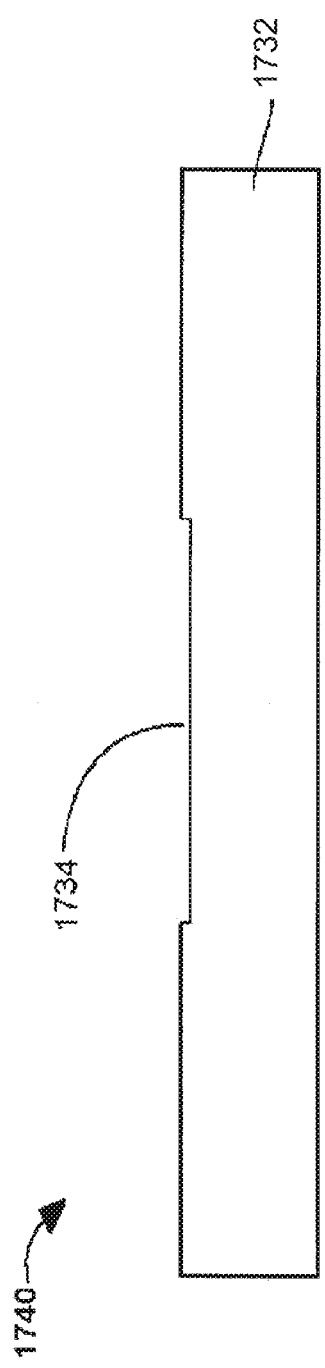

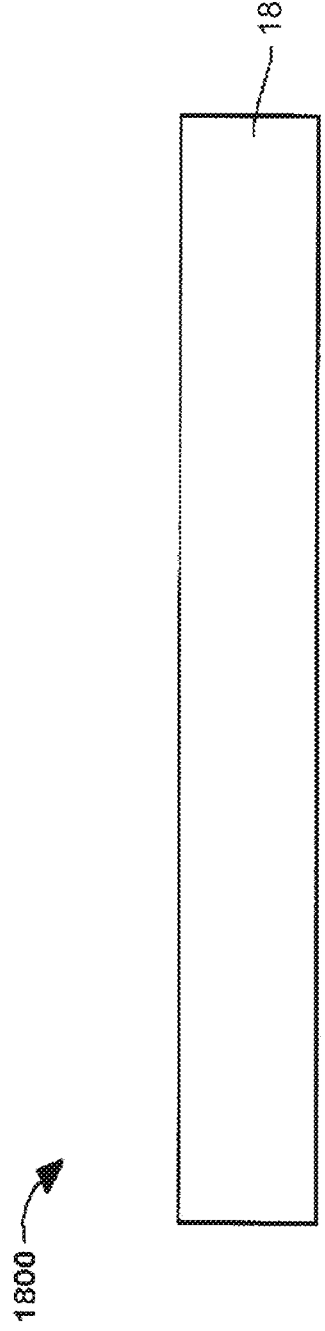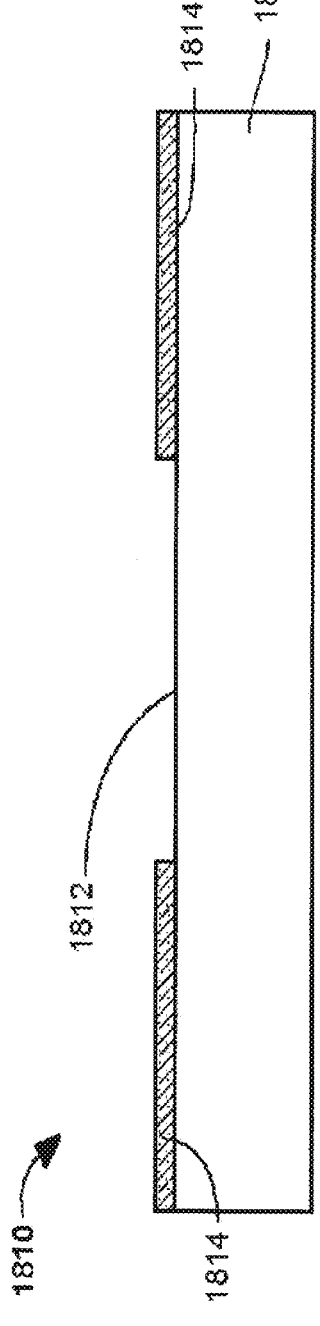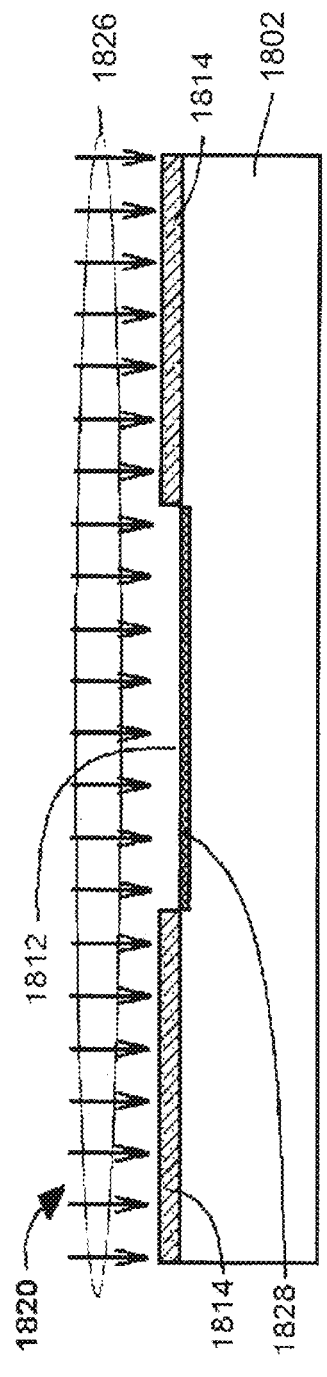

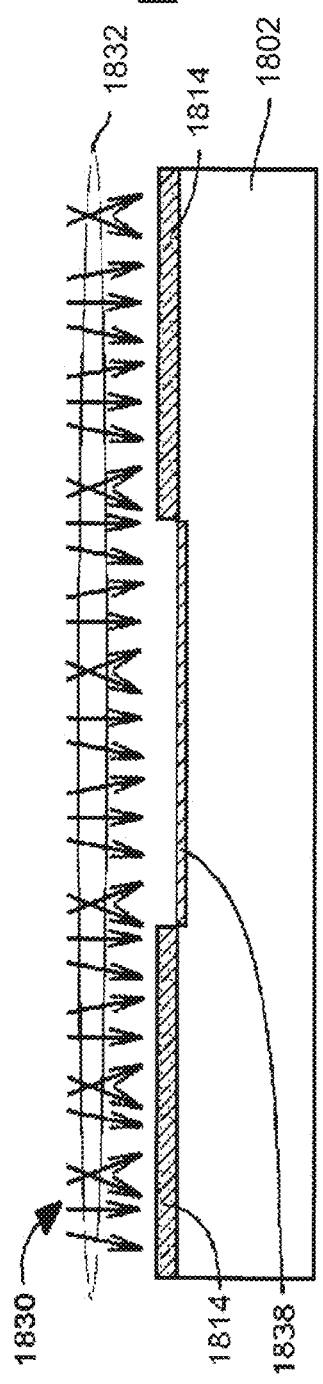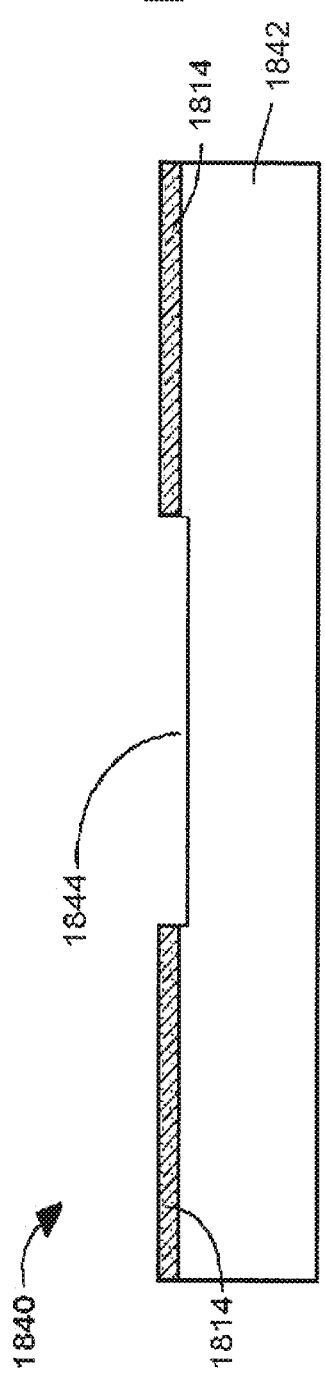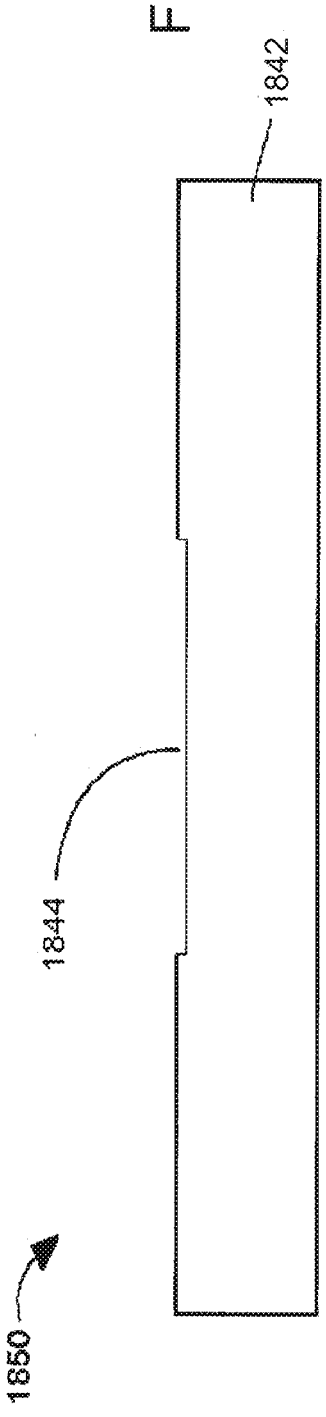

METHOD AND APPARATUS FOR FORMING SUBSTRATE SURFACES WITH EXPOSED CRYSTAL LATTICE USING ACCELERATED NEUTRAL ATOM BEAM

CROSS REFERENCE TO RELATED APPLICATIONS

This application is a Continuation In Part of U.S. patent application Ser. No. 15/758,436 entitled METHOD FOR ULTRA-SHALLOW ETCHING USING NEUTRAL BEAM PROCESSING BASED ON GAS CLUSTER ION BEAM TECHNOLOGY filed Mar. 8, 2018, which is a U.S. National Stage under 35 U.S.C. 371 of co-pending Application No. PCT/US2016/043628, filed Jul. 22, 2016, which in turn claims priority to U.S. Provisional Patent Application No. 62/241,273 filed Oct. 14, 2015. The contents of U.S. patent application Ser. No. 15/758,436, International Application No. PCT/US2016/043628 and U.S. Provisional Patent Application No. 62/241,273 are incorporated herein by reference in their entirety.

FIELD OF THE INVENTION

This invention relates generally to methods and apparatus for low energy, Neutral Beam processing and more specifically to high beam purity methods and systems for deriving an accelerated neutral monomer and/or neutral gas cluster beam from an accelerated gas cluster ion beam The invention also includes new or improved methods for controlled ultra-shallow etching and devices made by the methods.

BACKGROUND OF THE INVENTION

During the past decade, the gas cluster ion beam (GCIB) has become well known and widely used for a variety of surface and subsurface processing applications. Because gas cluster ions typically have a large mass, they tend to travel at relatively low velocities (compared to conventional ions) even when accelerated to substantial energies. These low velocities, combined with the inherently weak binding of the clusters, result in unique surface processing capabilities that lead to reduced surface penetration and reduced surface damage compared to conventional ion beams and diffuse plasmas.

Gas cluster ion beams have been employed to smooth, etch, clean, form deposits on, grow films on, or otherwise modify a wide variety of surfaces including for example, metals, semiconductors, and dielectric materials. In applications involving semiconductor and semiconductor-related materials, GCIBs have been employed to clean, smooth, etch, deposit and/or grow films including oxides and others. GCIBs have also been used to introduce doping and lattice-straining atomic species, materials for amorphizing surface layers, and to improve dopant solubility in semiconductor materials. In many cases such GCIB applications have been able to provide results superior to other technologies that employ conventional ions, ion beams, and plasmas. Semiconductor materials include a wide range of materials that may have their electrical properties manipulated by the introduction of dopant materials, and include (without limitation) silicon, germanium, diamond, silicon carbide, and also compound materials comprising group III-IV elements, and group II-VI elements. Because of the ease of forming GCIBs using argon (Ar) as a source gas and because of the inert properties of argon, many applications have been developed for processing the surfaces of implantable medical devices such as coronary stents, orthopedic prostheses, and other implantable medical devices using argon gas GCIBs. In semiconductor applications, a variety of source gases and source gas mixtures have been employed to form GCIBs containing electrical dopants and lattice-straining species, for reactive etching, physical etching, film deposition, film growth, and other useful processes. A variety of practical systems for introducing GCIB processing to a wide range of surface types are known. For example, U.S. Pat. No. 6,676,989 C1 issued to Kirkpatrick et al. teaches a GCIB processing system having a workpiece holder and manipulator suited for processing tubular or cylindrical workpieces such as vascular stents. In another example, U.S. Pat. No. 6,491,800 B2 issued to Kirkpatrick et al. teaches a GCIB processing system having workpiece holders and manipulators for processing other types of non-planar medical devices, including for example, hip joint prostheses. A further example, U.S. Pat. No. 6,486,478 B1 issued to Libby et al. teaches an automated substrate loading/unloading system suitable for processing semiconductor wafers. U.S. Pat. No. 7,115,511 issued to Hautala, teaches the use of a mechanical scanner for scanning a workpiece relative to an un-scanned GCIB. In still another example, U.S. Pat. No. 7,105,199 B2 issued to Blinn et al. teaches the use of GCIB processing to improve the adhesion of drug coatings on medical devices and to modify the elution or release rate of a drug from the medical devices.

GCIB has been employed in etching and smoothing of crystalline and non-crystalline forms of materials such as diamonds and other gemstones. This has not been entirely successful in that at times the gemstone may undergo undesirable color changes as a result of the GCIB processing. It has not been clear whether this results from some form of surface or sub-surface damage to the gemstone materials, or might be due to the formation of a roughened interface between the etched and/or smoothed surface layer resulting from the GCIB processing and the underlying unmodified bulk of the material, or is perhaps due to damage due to surface electrical charging induced by the cluster ions. Whatever the cause of the negative side effects of the GCIB processing, a processing technique for etching and/or smoothing of natural and synthetic gemstone materials that does not introduce undesired degradation of the appearance and esthetic appeal of the gems is desirable. GCIB processing has been indicated as a possible technique for smoothing and/or planarizing surfaces of optical materials such as lenses, reflecting optical surfaces, optical windows, optical panels for display and touch-screen panels, prismatic devices, transparent substrates for photo-masks and the like, optical waveguides, electro-optical devices, and other optical devices.

Materials for optical devices include a wide variety of glasses, quartz, sapphire, diamond, and other hard, transparent materials. Conventional polishing and planarizing including mechanical, chemical-mechanical, and other techniques have not produced adequate surfaces for the most demanding applications. GCIB processing has in many cases been shown to be capable of smoothing and/or planarizing optical surfaces to a degree not obtainable by conventional polishing techniques, but alternative techniques that do not result in a rough interface between the smoothed surface and the underlying bulk material are needed to avoid creation of scattering layers embedded in the optical material.

Although GCIB processing has been employed successfully for many applications, there are new and existing application needs not fully met by GCIB or other state of the art methods and apparatus. In many situations, while a GCIB can produce dramatic atomic-scale smoothing of an initially somewhat rough surface, the ultimate smoothing that can be achieved is often less than the required smoothness, and in other situations GCIB processing can result in roughening moderately smooth surfaces rather than smoothing them further.

Other needs/opportunities also exist as recognized and resolved through embodiments of the present invention. In the field of drug-eluting medical implants, GCIB processing has been successful in treating surfaces of drug coatings on medical implants to bind the coating to a substrate or to modify the rate at which drugs are eluted from the coating following implantation into a patient. However, it has been noted that in some cases where GCIB has been used to process drug coatings (which are often very thin and may comprise very expensive drugs), there may occur a weight loss of the drug coating (indicative of drug loss or removal) as a result of the GCIB processing. For the particular cases where such loss occurs (certain drugs and using certain processing parameters) the occurrence is generally undesirable and having a process with the ability to avoid the weight loss, while still obtaining satisfactory control of the drug elution rate, is preferable.

In semiconductor applications, GCIBs have been employed with varying degrees of success in many surface-processing improvements, however opportunities for improvement exist. In conventional GCIB processing, often the result, though significantly improved over earlier conventional technologies, is still not of the quality that is required by the most demanding applications. For example, in smoothing processes, for many materials the final degree of smoothness practically obtainable using GCIB processing does not always meet requirements. In applications where other materials are introduced into semiconductor materials (sometimes called GCIB infusion) for purposes of doping, lattice-straining, and other applications such as film deposition, film growth, and amorphization, the interface between the infused, grown, amorphized, or deposited material often has a roughness or non-uniformity at the interface between the irradiated layer and the underlying substrate that impairs optimal performance of the GCIB-modified layer.

Ions have long been favored for many processes because their electric charge facilitates their manipulation by electrostatic and magnetic fields. This introduces great flexibility in processing. However, in some applications, the charge that is inherent to any ion (including gas cluster ions in a GCIB) may produce undesirable effects in the processed surfaces. GCIB has a distinct advantage over conventional ion beams in that a gas cluster ion with a single or small multiple charge enables the transport and control of a much larger mass-flow (a cluster may consist of hundreds or thousands of molecules) compared to a conventional ion (a single atom, molecule, or molecular fragment.) Particularly in the case of insulating materials, surfaces processed using ions often suffer from charge-induced damage resulting from abrupt discharge of accumulated charges, or production of damaging electrical field-induced stress in the material (again resulting from accumulated charges.) In many such cases, GCIBs have an advantage due to their relatively low charge per mass, but in some instances may not eliminate the target-charging problem Furthermore, moderate to high current intensity ion beams may suffer from a significant space charge-induced defocusing of the beam that tends to inhibit transporting a well-focused beam over long distances. Again, due to their lower charge per mass relative to conventional ion beams, GCIBs have an advantage, but they do not fully eliminate the space charge transport problem.

A further instance of need or opportunity arises from the fact that although the use of beams of neutral molecules or atoms provides benefit in some surface processing applications and in space charge-free beam transport, it has not generally been easy and economical to produce intense beams of neutral molecules or atoms except for the case of nozzle jets, where the energies are generally on the order of a few milli-electron-volts per atom or molecule, and thus have limited processing capabilities.

In U.S. Pat. No. 4,935,623 of Hughes Electronics Corporation, Knauer has taught a method for forming beams of energetic (1 to 10 eV) charged and/or neutral atoms. Knauer forms a conventional GCIB and directs it at grazing angles against solid surfaces such as silicon plates, which dissociates the cluster ions, resulting in a forward-scattered beam of atoms and conventional ions. This results in an intense but unfocused beam of neutral atoms and ions that may be used for processing, or that following electrostatic separation of the ions may be used for processing as a neutral atom beam by requiring the scattering of the GCIB off of a solid surface to produce dissociation, a significant problem is introduced by the Knauer techniques. Across a wide range of beam energies, a GCIB produces strong sputtering in surfaces that it strikes. It has been clearly shown (see for example Aoki, T and Matsuo, J, "Molecular dynamics simulations of surface smoothing and sputtering process with glancing-angle gas cluster ion beams," Nucl. Instr. & Meth. in Phys. Research B 257 (2007), pp. 645-648) that even at grazing angles as employed by Knauer, GCIBs produce considerable sputtering of solids, and thus the forward-scattered neutral beam is contaminated by sputtered ions and neutral atoms and other particles originating in the solid surface used for scattering/dissociation. In a multitude of applications including medical device processing applications and semiconductor processing applications, the presence of such sputtered material contaminating the forward-scattered beam renders it unsuitable for use.

In U.S. Pat. No. 7,060,989, Swenson et al. teach the use of a gas pressure cell having gas pressure higher than the beam generation pressure to modify the gas cluster ion energy distribution in a GCIB. The technique lowers the energy of gas cluster ions in a GCIB and modifies some of the surface processing characteristics of such modified GCIBs. Such gas modification of GCIB gas cluster ion energy distribution is helpful, but does not reduce problems caused by charges deposited in the workpiece by the ions in the GCIB and does not solve certain processing problems, as for example, the weight loss of drug coatings during GCIB processing. Although the techniques of Swenson et al. can improve the ultimate surface smoothing characteristics of a GCIB, the result is still less than ideal.

Gas clusters and gas cluster ion sizes are typically characterized by N, the number of atoms or molecules (depending on whether the gas is atomic or molecular and including variants such as ions, monomers, dimmers, trimers, ligands) comprising the individual cluster. Many of the advantages contributed by conventional GCIB processing are believed to derive from the low velocities of ions in the GCIB and from the fact that large, loosely bound clusters disintegrate on collision with a solid surface, causing transient heating and pressure but without excessive penetration, implantation, or damage to the substrate beneath the surface. Effects of such large clusters (having N monomers—as defined below—on the order of a few thousand or more) are generally limited to a few tens of Angstroms. However, it has been shown that smaller clusters (having N on the order of a few hundred to about a thousand) produce more damage to an impacted surface and are capable of producing discrete impact craters in a surface (see for example, Houzumi, H., et al. "Scanning tunneling microscopy observation of graphite surfaces irradiated with size-selected Ar cluster ion beams", Jpn. J. Appl. Phys. V44(8), (2005), p 6252 ff). This crater-forming effect can roughen and remove material from surfaces (etch) in undesirable competition with the surface smoothing effects of the larger clusters. In many other surface processing applications for which GCIB have been found useful, it is believed that the effects of large gas cluster ions and smaller gas cluster ions may compete in counter-productive ways to reduce processing performance. Unfortunately, the readily applied techniques for forming GCIBs all result in generation of beams having a broad distribution of cluster sizes having size, N, ranging from around 100 to as much as several tens of thousands. Often the mean and/or peak of the size distribution lies in the range of from several hundred to a few thousand, with distribution tails gradually diminishing to zero at the size extremes of the distribution. The cluster-ion size distribution and the mean cluster size, NMean, associated with the distribution is dependent on the source gas employed and can be significantly influenced by selection of the parameters of the nozzle used to form the cluster jet, by the pressure drop through the nozzle, and by the nozzle temperature, all according to conventional GCIB formation techniques. Most commercial GCIB processing tools routinely employ magnetic or occasionally electrostatic size separators to remove the smallest ions and clusters (monomers, dimers, trimers, etc. up to around N=10 or more), which are the most damaging. Such filters are often referred to as "monomer filters", although they typically also remove somewhat larger ions as well as the monomers. Certain electrostatic cluster ion size selectors (as for example the one employed in U.S. Pat. No. 4,935,623, by Knauer) require placing grids of electrical conductors into the beam, which introduces a strong disadvantage due to potential erosion of the grids by the beam, introducing beam contamination while reducing reliability and resulting in the need for additional maintenance to the apparatus. For that reason, monomer and low-mass filters are now typically of the magnetic type (see for examples, U.S. Pat. No. 6,635,883, to Torti et al. and U.S. Pat. No. 6,486,478, to Libby et al.) Aside from the smallest ions (monomers, dimers, etc.), which are effectively removed by magnetic filters, it appears that most GCIBs contain few or no gas cluster ions of sizes below about N=100. It may be that such sizes do not readily form or after forming are not stable. However, clusters in the range from about N=100 to a few hundred seem to be present in the beams of most commercial GCIB processing tools. Values of NMean in the range of from a few hundred to several thousand are commonly encountered when using conventional techniques. Because, for a given acceleration potential the intermediate size clusters travel much faster than the larger clusters, they are more likely to produce craters, rough interfaces, and other undesirable effects, and probably contribute to less than ideal processing when present in a GCIB.

Accelerated neutral atom beam (ANAB) technology using non-reactive gas species can be used to effectively remove surface materials by sputtering. Sputtering is the physical removal of surface atoms due to impact collisions from arriving accelerated ANAB atoms with enough energy to remove surface atoms. The processed surface is left with a residual, controlled depth, amorphous region due to ballistic impacts that do not result in surface atom removal. This amorphous region has been found to provide numerous useful benefits to the substrate surface such as high surface energy, surface passivation and improved attachment of deposited layers. However, there are situations where the next phase of substrate processing requires that the substrate crystal lattice be exposed, such as epitaxial growth with oriented lattice initiation to match the underlying substrate. For these applications, the amorphous region must be removed.

It is therefore an object of this invention to provide a method for using accelerated neutral atom beam (ANAB) technology for formation of substrate surfaces with exposed crystal lattice.

It is another object of this invention to provides highly controlled nano-depth processing capability using ANAB technology for modifying material surfaces.

It is another object of the present invention to provide ANAB beams with reactive gas species for processing of substrate surfaces.

It is yet another object of the present invention to perform reactive chemistry by incorporating reactive species into an ANAB flux for removing or reactively modifying material surfaces without sputtering.

It is another object of the present invention to use ANAB enabled surface reactions to remove surface contaminants, oxides etc. from substrate surfaces to create an interface region with exposed crystal lattice in preparation for next phase processing.

SUMMARY OF THE INVENTION

The objects set forth above as well as further and other objects and advantages of the present invention are achieved by the various embodiments of the invention described herein below.

Accelerated Neutral Beams are generated and employed to treat the surfaces of various materials (including metals and various materials such as semiconductor materials and dielectric materials as may for example be employed in microfabrication of integrated circuits or micro-mechanical devices) so as to form very shallow—1 to 10 nm or even less—amorphous and/or oxidized layers near the surfaces of such materials. These treated layers are modified in a way that facilitates chemical etching of materials that are otherwise not easily or controllably chemically etched. Thus, chemical etching can be performed using the original unmodified material to act as the etch-stopping layer for the process, making the etch depth controlled by the processing depth of the accelerated Neutral Beam This avoids over-etching and undercutting and other directional etching problems that often interfere with obtaining desired chemical etching results in many materials. Since the depth of penetration of an accelerated Neutral Beam can be controlled to be a preselected depth of from less than 1 nm to as much as 10 nm by controlling dose and energy during processing, a range of very shallow etching depths can be reliably obtained. The process consists of choosing accelerated Neutral Beam parameters to amorphize and/or oxidize a predetermined depth of surface modification for the material selected, irradiating the surface of the material (optionally through a mask or patterned template to control patterning) to form a shallow modified layer, chemically etching the surface of the material, using an etchant that has a high differential etch rate for the modified versus the unmodified material, and using the unmodified material as the etch stop layer for the process. Very shallow, repeatable and controllable etching of a variety of materials is thus enabled. These accelerated Neutral Beams are generated by first forming a conventional accelerated GCM, then partly or essentially fully dissociating it by methods and operating conditions that do not introduce impurities into the beam, then separating the remaining charged portions of the beam from the neutral portion, and subsequently using the resulting accelerated Neutral Beam for workpiece processing. Depending on the degree of dissociation of the gas cluster ions, the Neutral Beam produced may be a mixture of neutral gas monomers and gas clusters or may essentially consist entirely or almost entirely of neutral gas monomers. It is preferred that the accelerated Neutral Beam is an essentially fully dissociated neutral monomer beam. An advantage of the Neutral Beams that may be produced by the methods and apparatus of the embodiments of this invention, is that they may be used to process electrically insulating materials without producing damage to the material due to charging of the surfaces of such materials by beam transported charges as commonly occurs for all ionized beams including GCIB. For example, in semiconductor and other electronic applications, ions often contribute to damaging or destructive charging of thin dielectric films such as oxides, nitrides, etc. The use of Neutral Beams can enable successful beam processing of polymer, dielectric, and/or other electrically insulating or high resistivity materials, coatings, and films in other applications where ion beams may produce unacceptable side effects due to surface charging or other charging effects. Examples include (without limitation) processing of corrosion inhibiting coatings, and irradiation cross-linking and/or polymerization of organic films. In other examples, Neutral Beam induced modifications of polymer or other dielectric materials (e.g. sterilization, smoothing, improving surface biocompatibility, and improving attachment of and/or control of elution rates of drugs) may enable the use of such materials in medical devices for implant and/or other medical/surgical applications. Further examples include Neutral Beam processing of glass, polymer, and ceramic bio-culture labware and/or environmental sampling surfaces where such beams may be used to improve surface characteristics like, for example, roughness, smoothness, hydrophilicity, and biocompatibility.

Since the parent GCIB, from which accelerated Neutral Beams may be formed by the methods and apparatus of embodiments of the invention, comprises ions, it is readily accelerated to desired energy and is readily focused using conventional ion beam techniques.

Upon subsequent dissociation and separation of the charged ions from the neutral particles, the Neutral Beam particles tend to retain their focused trajectories and may be transported for extensive distances with good effect.

When neutral gas clusters in a jet are ionized by electron bombardment, they become heated and/or excited. This may result in subsequent evaporation of monomers from the ionized gas cluster, after acceleration, as it travels down the beamline. Additionally, collisions of gas cluster ions with background gas molecules in the ionizer, accelerator and beamline regions, also heat and excite the gas cluster ions and may result in additional subsequent evolution of monomers from the gas cluster ions following acceleration. When these mechanisms for evolution of monomers are induced by electron bombardment and/or collision with background gas molecules (and/or other gas clusters) of the same gas from which the GCIB was formed, no contamination is contributed to the beam by the dissociation processes that results in evolving the monomers.

There are other mechanisms that can be employed for dissociating (or inducing evolution of monomers from) gas cluster ions in a GCIB without introducing contamination into the beam Some of these mechanisms may also be employed to dissociate neutral gas clusters in a neutral gas cluster beam One mechanism is laser irradiation of the cluster-ion beam using infra-red or other laser energy. Laser-induced heating of the gas cluster ions in the laser irradiated GCIB results in excitement and/or heating of the gas cluster ions and causes subsequent evolution of monomers from the beam Another mechanism is passing the beam through a thermally heated tube so that radiant thermal energy photons impact the gas cluster ions in beam The induced heating of the gas cluster ions by the radiant thermal energy in the tube results in excitement and/or heating of the gas cluster ions and causes subsequent evolution of monomers from the beam In another mechanism, crossing the gas cluster ion beam by a gas jet of the same gas or mixture as the source gas used in formation of the GCIB (or other non-contaminating gas) results in collisions of monomers of the gas in the gas jet with the gas clusters in the ion beam producing excitement and/or heating of the gas cluster ions in the beam and subsequent evolution of monomers from the excited gas cluster ions. By depending entirely on electron bombardment during initial ionization and/or collisions (with other cluster ions, or with background gas molecules of the same gas(es) as those used to form the GCIB) within the beam and/or laser or thermal radiation and/or crossed jet collisions of non-contaminating gas to produce the GCIB dissociation and/or fragmentation, contamination of the beam by collision with other materials is avoided.

Through the use of such non-contaminating methods of dissociation described above, the GCIB is dissociated or at least partially dissociated without introducing atoms to the dissociation products or residual clusters that are not part of the original source gas atoms.

By using a source gas for initial cluster formation that does not contain atoms which would be contaminants for the workpiece to be processed using the residual clusters or dissociation products, contamination of the workpiece is avoided. When argon or other noble gases are employed, the source gas materials are volatile and not chemically reactive, and upon subsequent irradiation of the workpiece using Neutral Beams these volatile non-reactive atoms are fully released from the workpiece. Thus for workpieces that are optical and gem materials including glasses, quartz, sapphire, diamond, and other hard, transparent materials such as lithium triborate (LBO), argon and other noble gases can serve as source gas materials without contributing contamination due to Neutral Beam irradiation. In other cases, other source gases may be employed, provided the source gas atomic constituents do not include atoms that would result in contamination of the workpiece. For example, for some glass workpieces, LBO, and various other optical materials are oxygen containing, and oxygen atoms may not serve as contaminants. In such cases oxygen-containing source gases may be employed without contamination.

As a neutral gas cluster jet from a nozzle travels through an ionizing region where electrons are directed to ionize the clusters, a cluster may remain un-ionized or may acquire a charge state, q, of one or more charges (by ejection of electrons from the cluster by an incident electron). The ionizer operating conditions influence the likelihood that a gas cluster will take on a particular charge state, with more intense ionizer conditions resulting in greater probability that a higher charge state will be achieved. More intense ionizer conditions resulting in higher ionization efficiency may result from higher electron flux and/or higher (within limits) electron energy. Once the gas cluster has been ionized, it is typically extracted from the ionizer, focused into a beam, and accelerated by falling through an electric field.

The amount of acceleration of the gas cluster ion is readily controlled by controlling the magnitude of the accelerating electric field. Typical commercial GCM processing tools generally provide for the gas cluster ions to be accelerated by an electric field having an adjustable accelerating potential, VAce, typically of, for example, from about 1 kV to 70 kV (but not limited to that range – VAcc up to 200 kV or even more may be feasible). Thus a singly charged gas cluster ion achieves an energy in the range of from 1 to 70 keV (or more if larger VAcc is used) and a multiply charged (for example, without limitation, charge state, q=3 electronic charges) gas cluster ion achieves an energy in the range of from 3 to 210 keV (or more for higher VAce). For other gas cluster ion charge states and acceleration potentials, the accelerated energy per cluster is qVAcc eV. From a given ionizer with a given ionization efficiency, gas cluster ions will have a distribution of charge states from zero (not ionized) to a higher number such as for example 6 (or with high ionizer efficiency, even more), and the most probable and mean values of the charge state distribution also increase with increased ionizer efficiency (higher electron flux and/or energy). Higher ionizer efficiency also results in increased numbers of gas cluster ions being formed in the ionizer. In many cases, GCIB processing throughput increases when operating the ionizer at high efficiency results in increased GCIB current. A downside of such operation is that multiple charge states that may occur on intermediate size gas cluster ions can increase crater and/or rough interface formation by those ions, and often such effects may operate counterproductively to the intent of the processing. Thus, for many GCIB surface processing recipes, selection of the ionizer operating parameters tends to involve more considerations than just maximizing beam current. In some processes, use of a "pressure cell" (see U.S. Pat. No. 7,060,989, to Swenson et al.) may be employed to permit operating an ionizer at high ionization efficiency while still obtaining acceptable beam processing performance by moderating the beam energy by gas collisions in an elevated pressure "pressure cell."

When the Neutral Beams are formed in embodiments of the present invention there is no downside to operating the ionizer at high efficiency—in fact such operation is sometimes preferred. When the ionizer is operated at high efficiency, there may be a wide range of charge states in the gas cluster ions produced by the ionizer. This results in a wide range of velocities in the gas cluster ions in the extraction region between the ionizer and the accelerating electrode, and also in the downstream beam This may result in an enhanced frequency of collisions between and among gas cluster ions in the beam that generally results in a higher degree of fragmentation of the largest gas cluster ions. Such fragmentation may result in a redistribution of the cluster sizes in the beam, skewing it toward the smaller cluster sizes. These cluster fragments retain energy in proportion to their new size (N) and so become less energetic while essentially retaining the accelerated velocity of the initial unfragmented gas cluster ion. The change of energy with retention of velocity following collisions has been experimentally verified (as for example reported in Toyoda, N. et al., "Cluster size dependence on energy and velocity distributions of gas cluster ions after collisions with residual gas," Nucl. Instr. & Meth. in Phys. Research B 257 (2007), pp 662-665). Fragmentation may also result in redistribution of charges in the cluster fragments. Some uncharged fragments likely result and multi-charged gas cluster ions may fragment into several charged gas cluster ions and perhaps some uncharged fragments. It is understood by the inventors that design of the focusing fields in the ionizer and the extraction region may enhance the focusing of the smaller gas cluster ions and monomer ions to increase the likelihood of collision with larger gas cluster ions in the beam extraction region and in the downstream beam, thus contributing to the dissociation and/or fragmenting of the gas cluster IOnS.

In an embodiment of the present invention, background gas pressure in the ionizer, acceleration region, and beamline may optionally be arranged to have a higher pressure than is normally utilized for good GCIB transmission. This can result in additional evolution of monomers from gas cluster ions (beyond that resulting from the heating and/or excitement resulting from the initial gas cluster ionization event). Pressure may be arranged so that gas cluster ions have a short enough mean-free-path and a long enough flight path between ionizer and workpiece that they must undergo multiple collisions with background gas molecules.

For a homogeneous gas cluster ion containing N monomers and having a charge state of q and which has been accelerated through an electric field potential drop of VAcc volts, the cluster will have an energy of approximately qVAcc/Nr eV per monomer, where Nr is the number of monomers in the cluster ion at the time of acceleration. Except for the smallest gas cluster ions, a collision of such an ion with a background gas monomer of the same gas as the cluster source gas will result in additional deposition of approximately qVAcc/Nr eV into the gas cluster ion. This energy is relatively small compared to the overall gas cluster ion energy (qVAcc) and generally results in excitation or heating of the cluster and in subsequent evolution of monomers from the cluster. It is believed that such collisions of larger clusters with background gas seldom fragment the cluster but rather heats and/or excites it to result in evolution of monomers by evaporation or similar mechanisms. Regardless of the source of the excitation that results in the evolution of a monomer or monomers from a gas cluster ion, the evolved monomer(s) have approximately the same energy per particle, qVAcc/Nr eV, and retain approximately the same velocity and trajectory as the gas cluster ion from which they have evolved. When such monomer evolutions occur from a gas cluster ion, whether they result from excitation or heating due to the original ionization event, a collision, or radiant heating, the charge has a high probability of remaining with the larger residual gas cluster ion. Thus, after a sequence of monomer evolutions, a large gas cluster ion may be reduced to a cloud of co-traveling monomers with perhaps a smaller residual gas cluster ion (or possibly several if fragmentation has also occurred). The co-traveling monomers following the original beam trajectory all have approximately the same velocity as that of the original gas cluster ion and each has energy of approximately qVAccNr eV. For small gas cluster ions, the energy of collision with a background gas monomer is likely to completely and violently dissociate the small gas cluster and it is uncertain whether in such cases the resulting monomers continue to travel with the beam or are ejected from the beam.

To avoid contamination of the beam by collisions with the background gas, it is preferred that the background gas be the same gas as the gas constituting the gas cluster ions. Nozzles for forming gas cluster jets are typically operated with high gas flow on the order of 100-600 sccm. The portion of this flow that does not condense into gas clusters raises the pressure in the source chamber. In addition to the gas transmitted through the skimmer aperture in the form of gas clusters, unclustered source gas from the source chamber can flow through the skimmer aperture to the downstream beamline or beam path chamber(s). Selecting the skimmer aperture diameter to provide an increased flow of unclustered source gas from the source chamber to the beamline is a convenient way to provide the added beamline pressure to induce background gas collisions with the GCIB. Because of the high source gas flow (unclustered gas through the skimmer aperture and gas transported to the target by the beam) atmospheric gases are quickly purged from the beamline. Alternatively, gas may be leaked into the beamline chamber, or as pointed out above, introduced as a jet crossing the GCIB path. In such case, the gas is preferably the same as the source gas (or inert or otherwise non-contaminating). In critical applications a residual gas analyzer can be employed in the beamline to confirm the quality of the background gas, when background gas collisions play a role in the evolution of monomers.

Prior to the GCIB reaching the workpiece, the remaining charged particles (gas cluster ions, particularly small and intermediate size gas cluster ions and some charged monomers, but also including any remaining large gas cluster ions) in the beam are separated from the neutral portion of the beam, leaving only a Neutral Beam for processing the workpiece.

In typical operation, the fraction of power in the Neutral Beam relative to that in the full (charged plus neutral) beam delivered at the processing target is in the range of from about 5% to 95%, so by the separation methods and apparatus disclosed herein it is possible to deliver that portion of the kinetic energy of the full accelerated charged beam to the target as a Neutral Beam.

The dissociation of the gas cluster ions and thus the production of high neutral monomer beam energy is facilitated by:

1) Operating at higher acceleration voltages. This increases qVAcc/N for any given cluster size; 2) Operating at high ionizer efficiency. This increases qVAcc/N for any given cluster size by increasing q and increases cluster-ion on cluster-ion collisions in the extraction region due to the differences in charge states between clusters; 3) Operating at a high ionizer, acceleration region, or beamline pressure or operating with a gas jet crossing the beam, or with a longer beam path, all of which increase the probability of background gas collisions for a gas cluster ion of any given size; 4) Operating with laser irradiation or thermal radiant heating of the beam, which directly promote evolution of monomers from the gas cluster ions; and 5) Operating at higher nozzle gas flow, which increases transport of gas, clustered and perhaps unclustered into the GCIB trajectory, which increases collisions resulting in greater evolution of monomers.

For producing background gas collisions, the product of the gas cluster ion beam path length from extraction region to workpiece times the pressure in that region contributes to the degree of dissociation of the gas cluster ions that occurs. For 30 kV acceleration, ionizer parameters that provide a mean gas cluster ion charge state of 1 or greater, and a pressure times beam path length of 6×10−3 torr-cm (0.8 pascal-cm) (at 25 deg C.) provides a Neutral Beam (after separation from the residual charged ions) that is essentially fully dissociated to neutral energetic monomers. It is convenient and customary to characterize the pressure times beam path length as a gas target thickness. 6×10−3 torr-cm (0.8 pascal-cm) corresponds to a gas target thickness of approximately $1.94 \times 10^{14}$ gas molecules/cm2. In one exemplary (not for limitation) embodiment the background gas pressure is 6×10−5 torr (8×10−3 pascal) and the beam path length is 100 cm, the acceleration potential is 30 kV, and in this case the Neutral Beam is observed to be essentially fully dissociated into monomers at the end of the beam path. This is without laser or radiant beam heating and without employing a gas jet crossing the beam. The fully dissociated accelerated Neutral Beam condition results from monomer evolution from cluster heating due to the cluster ionization event, collisions with residual gas monomers, and collisions between clusters in the beam. Using the dissociated Neutral Beam produces improved smoothing results on smoothing a gold film compared to the full beam In another application, using the dissociated Neutral Beam on a drug surface coating on a medical device, or on drug-polymer-mixture layer on a medical device or on a drug-poly-mixture body of a medical device provides improved drug attachment and modification of a drug elution rate without the drug weight loss that occurs when the full GCIB is used.

Measurement of the Neutral Beam cannot be made by current measurement as is convenient for gas cluster ion beams. A Neutral Beam power sensor is used to facilitate dosimetry when irradiating a workpiece with a Neutral Beam. The Neutral Beam sensor is a thermal sensor that intercepts the beam (or optionally a known sample of the beam). The rate of rise of temperature of the sensor is related to the energy flux resulting from energetic beam irradiation of the sensor. The thermal measurements must be made over a limited range of temperatures of the sensor to avoid errors due to thermal re-radiation of the energy incident on the sensor. For a GCIB process, the beam power (watts) is equal to the beam current (amps) times VAcc, the beam acceleration voltage. When a GCIB irradiates a workpiece for a period of time (seconds), the energy (joules) received by the workpiece is the product of the beam power and the irradiation time. The processing effect of such a beam when it processes an extended area is distributed over the area (for example, cm2. For ion beams, it has been conveniently conventional to specify a processing dose in terms of irradiated ions/cm2, where the ions are either known or assumed to have at the time of acceleration an average charge state, q, and to have been accelerated through a potential difference of, VAce volts, so that each ion carries an energy of q VAcc eV (an eV is approximately 1.6×10-19 joule). Thus an ion beam dose for an average charge state, q, accelerated by VAcc and specified in ions/cm2 corresponds to a readily calculated energy dose expressible in joules/cm2. For an accelerated Neutral Beam derived from an accelerated GCIB as utilized in embodiments of the present invention, the value of q at the time of acceleration and the value of VAcc is the same for both of the (later-formed and separated) charged and uncharged fractions of the beam The power in the two (neutral and charged) fractions of the GCIB divides proportional to the mass in each beam fraction. Thus, for the accelerated Neutral Beam as employed in embodiments of the invention, when equal areas are irradiated for equal times, the energy dose (joules/cm 2 deposited by the Neutral Beam is necessarily less than the energy dose deposited by the full GCIB. By using a thermal sensor to measure the power in the full GCIB, PG, and that in the Neutral Beam, PN, (which is commonly found to be from about 5% to about 95% that of the full GCIB) it is possible to calculate a compensation factor for use in the Neutral Beam processing dosimetry. When PN is equal to a PG, then the compensation factor is, $k=1/a$. Thus, if a workpiece is processed using a Neutral Beam derived from a GCIB, for a time duration is made to be k times greater than the processing duration for the full GCIB (including charged and neutral beam portions) required to achieve a dose of D ions/cm2 then the energy doses deposited in the workpiece by both the Neutral Beam and the full GCIB are the same (though the results may be different due to qualitative differences in the processing effects due to differences of particle sizes in the two beams.) As used herein, a Neutral Beam process dose compensated in this way is sometimes described as having an energy/cm2 equivalence of a dose of D ions/cm2.

Use of a Neutral Beam derived from a gas cluster ion beam in combination with a thermal power sensor for dosimetry in many cases has advantages compared with the use of the full gas cluster ion beam or an intercepted or diverted portion, which inevitably comprises a mixture of gas cluster ions and neutral gas clusters and/or neutral monomers, and which is conventionally measured for dosimetry purposes by using a beam current measurement. Some advantages are as follows:

1) The dosimetry can be more precise with the Neutral Beam using a thermal sensor for dosimetry because the total power of the beam is measured. With a GCIB employing the traditional beam current measurement for dosimetry, only the contribution of the ionized portion of the beam is measured and employed for dosimetry. Minute-to-minute and setup-to-setup changes to operating conditions of the GCIB apparatus may result in variations in the fraction of neutral monomers and neutral clusters in the GCIB. These variations can result in process variations that may be less controlled when the dosimetry is done by beam current measurement.

2) With a Neutral Beam, a wide variety of materials may be processed, including highly insulating materials and other materials that may be damaged by electrical charging effects, without the necessity of providing a source of target neutralizing electrons to prevent workpiece charging due to charge transported to the workpiece by an ionized beam When employed with conventional GCIB, target neutralization to reduce charging is seldom perfect, and the neutralizing electron source itself often introduces problems such as workpiece heating, contamination from evaporation or sputtering in the electron source, etc. Since a Neutral Beam does not transport charge to the workpiece, such problems are reduced.

3) There is no necessity for an additional device such as a large aperture high strength magnet to separate energetic monomer ions from the Neutral Beam In the case of conventional GCIB the risk of energetic monomer ions (and other small cluster ions) being transported to the workpiece, where they penetrate producing deep damage, is significant and an expensive magnetic filter is routinely required to separate such particles from the beam. In the case of the Neutral Beam apparatus disclosed herein, the separation of all ions from the beam to produce the Neutral Beam inherently removes all monomer ions.

As used herein, the term "drug" is intended to mean a therapeutic agent or a material that is active in a generally beneficial way, which can be released or eluted locally in the vicinity of an implantable medical device to facilitate implanting (for example, without limitation, by providing lubrication) the device, or to facilitate (for example, without limitation, through biological or biochemical activity) a favorable medical or physiological outcome of the implantation of the device. The meaning of "drug" is intended to include a mixture of a drug with a polymer that is employed for the purpose of binding or providing coherence to the drug, attaching the drug to the medical device, or for forming a barrier layer to control release or elution of the drug. A drug that has been modified by ion beam irradiation to densify, carbonize or partially carbonize, partially denature, cross-link or partially cross-link, or to at least partially polymerize molecules of the drug is intended to be included in the "drug" definition.

As used herein, the term "intermediate size", when referring to gas cluster size or gas cluster ion size is intended to mean sizes of from N=10 to N=1500.

As used herein, the terms "GCIB", "gas cluster ion beam" and "gas cluster ion" are intended to encompass not only ionized beams and ions, but also accelerated beams and ions that have had all or a portion of their charge states modified (including neutralized) following their acceleration. The terms "GCIB" and "gas cluster ion beam" are intended to encompass all beams that comprise accelerated gas clusters even though they may also comprise non-clustered particles. As used herein, the term "Neutral Beam" is intended to mean a beam of neutral gas clusters and/or neutral monomers derived from an accelerated gas cluster ion beam and wherein the acceleration results from acceleration of a gas cluster ion beam.

As used herein in referencing a particle in a gas or a particle in a beam, the term "monomer" refers equally to either a single atom or a single molecule. The terms "atom," "molecule," and "monomer" may be used interchangeably and all refer to the appropriate monomer that is characteristic of the gas under discussion (either a component of a cluster, a component of a cluster ion, or an atom or molecule). For example, a monatomic gas like argon may be referred to in terms of atoms, molecules, or monomers and each of those terms means a single atom. Likewise, in the case of a diatomic gas like nitrogen, it may be referred to in terms of atoms, molecules, or monomers, each term meaning a diatomic molecule.

Furthermore, a molecular gas like $CO_2$ or $B_2H_6$, may be referred to in terms of atoms, molecules, or monomers, each term meaning a polyatomic molecule. These conventions are used to simplify generic discussions of gases and gas clusters or gas cluster ions independent of whether they are monatomic, diatomic, or molecular in their gaseous form. In referring to a constituent of a molecule or of a solid material, "atom" has its conventional meaning.

One embodiment of the present invention provides a method for controlled shallow etching of a surface of a substrate comprising the steps of: providing a reduced pressure chamber; forming a gas cluster ion beam comprising gas cluster ions within the reduced pressure chamber; accelerating the gas cluster ions to form an accelerated gas cluster ion beam along a beam path within the reduced pressure chamber; promoting fragmentation and/or dissociation of at least a portion of the accelerated gas cluster ions along the beam path; removing charged particles from the beam path to form an accelerated neutral beam along the beam path in the reduced pressure chamber; holding the substrate in the beam path; treating a portion of a surface of the substrate by irradiating it with the accelerated neutral beam to form a shallow modified layer on the irradiated portion of the surface, the shallow modified layer, overlying unmodified substrate beneath; etching the surface having the shallow modified layer to preferentially remove material in the shallow modified layer on the surface and wherein the etching stops at the unmodified substrate beneath.

The step of removing may remove essentially all charged particles from the beam path. The removing step may form an accelerated neutral beam that is fully dissociated. The neutral beam may consist essentially of gas from the gas cluster ion beam. The treating step may include irradiating the substrate through openings in a patterned template and the shallow modified layer may be patterned. The etching step may produce an etched pattern on the substrate. The patterned template may be a hard mask or a photoresist mask in contact with the surface of the substrate. The step of promoting may include increasing the range of velocities of ions in the accelerated gas cluster ion beam. The step of promoting may include introducing one or more gaseous elements used in forming the gas cluster ion beam into the reduced pressure chamber to increase pressure along the beam path. The etching step may be done using a suitable chemical etchant that has a differential etching rate for the shallow modified layer and the unmodified substrate. The chemical etchant may comprise hydrofluoric acid. The treating step may further comprise scanning the substrate to treat extended portions of the surface with the accelerated neutral beam. The substrate surface may comprise a metal, a semiconductor, or a dielectric material. The shallow modified layer may have a depth of 6 nanometers or less. The shallow modified layer may have a thickness of from about 1 nanometer to about 3 nanometers. The gas cluster ions may comprise argon or another inert gas. The gas cluster ions may further comprise oxygen. The method may further comprise forming an oxygen containing layer on the portion of the substrate prior to the step of irradiating. The oxygen containing layer may be a less than 5 monolayers thick. The acceleration step may accelerate the gas cluster ions through a potential of from 5 to 50 kV.

The shallow modified layer may be an amorphized layer or an oxidized layer. Another embodiment of the present invention provides an etched semiconductor or metal or dielectric surface of a substrate, comprising a patterned etched feature with a depth of 6 nanometers or less. The patterned etched feature may have a depth of 3 nanometers or less. The feature may have an average roughness, Ra, of less than 10 Angstroms (1 nanometer).

The patterned etched feature may be caused to have a higher etch rate than the substrate, using an accelerated and focused neutral beam formed from a gas cluster ion beam.

According to an aspect of the present invention, accelerated neutral atom beam (ANAB) technology is used for formation of substrate surfaces with exposed crystal lattice. ANAB provides highly controlled nano-depth processing capability useful for modifying material surfaces. For this purpose, ANAB beams with reactive gas species are useful for processing of substrate surfaces. Reactive chemistry is performed when reactive species are incorporated into the ANAB flux for purposes of removing or reactively modifying material surfaces without sputtering. ANAB enabled surface reactions can be used to remove surface contaminants, oxides etc. from substrate surfaces to create an interface region with exposed crystal lattice in preparation for next phase processing. This can be accomplished in two ways:

1) Reductive processing, where gaseous species such as halogens are used to form an ANAB flux for purposes of reactively removing surface atoms thereby exposing the underlying crystalline surface interface region, ready for next step processing.

2) Additive processing, where gaseous species such as oxygen are used to form an ANAB flux for controlled depth, reactive interaction with the uppermost 1-3 nm of the substrate surface, thereby creating a stable oxide layer. This oxide behaves as a protective layer if the substrate is to be brought back to atmosphere before next step processing occurs. Atmospheric exposure of substrate surfaces subjects them to growth of native oxides, attachment of moisture molecules, organics etc. that must be removed before next stage processing occurs. To combat these problems, the ANAB generated oxide surface behaves as a stable protective layer of controlled thickness that can be chemically removed, exposing the surface crystal lattice immediately prior to next step processing.

According to an aspect of the present disclosure, a method for reactively preparing a surface of a substrate is provided. The method for reactively preparing a surface of a substrate includes steps of providing a reduced pressure chamber and forming a gas cluster ion beam within the reduced pressure chamber. In an illustrative embodiment the gas cluster ion beam includes halogen gas cluster ions. The method then includes steps of accelerating the halogen gas cluster ions to form an accelerated halogen gas cluster ion beam along a beam path within the reduced pressure chamber and promoting fragmentation and/or dissociation of at least a portion of the accelerated halogen gas cluster ions along the beam path. The method further includes steps of removing charged particles from the beam path to form an accelerated neutral halogen beam along the beam path in the reduced pressure chamber. According to an aspect of the present disclosure the substrate is held in the beam path. A portion of a surface of the substrate is then irradiated with the accelerated neutral halogen beam. According to this aspect of the present disclosure, the neutral halogen beam reactively removes surface atoms and exposes an underlying crystalline surface interface region of the substrate.

In an illustrative embodiment of the disclosed method for reactively preparing a surface of a substrate, the step of removing removes essentially all charged particles from the beam path. In another illustrative embodiment, the removing step forms an accelerated neutral beam that is fully dissociated. In another illustrative embodiment, the step of promoting includes increasing the range of velocities of ions in the accelerated gas cluster ion beam. In an illustrative embodiment, the step of promoting includes introducing one or more gaseous elements used in forming the gas cluster ion beam into the reduced pressure chamber to increase pressure along the beam path. In another illustrative embodiment, the acceleration step accelerates the gas cluster ions through a potential of from 5 kV to 50 kV.

According to another aspect of the present disclosure, a method for additively preparing a surface of a substrate is provided. The method for additively preparing a surface of a substrate includes steps of providing a reduced pressure chamber and forming a gas cluster ion beam within the reduced pressure chamber. In an illustrative embodiment, the gas cluster ion beam includes oxygen gas cluster ions. The method then includes steps of accelerating the oxygen gas cluster ions to form an accelerated oxygen gas cluster ion beam along a beam path within the reduced pressure chamber and promoting fragmentation and/or dissociation of at least a portion of the accelerated oxygen gas cluster ions along the beam path. The method further includes steps of removing charged particles from the beam path to form an accelerated neutral oxygen beam along the beam path in the reduced pressure chamber. According to an aspect of the present disclosure the substrate is held in the beam path. A portion of a surface of the substrate is then irradiated with the accelerated neutral oxygen beam. wherein the neutral oxygen beam reactively interacts with the substrate to form a stable oxide layer on the surface of the substrate.

In an illustrative embodiment of the disclosed method for additively preparing a surface of a substrate, the thickness of the stable oxide layer is controlled by controlling a dosage of the irradiating. In an illustrative embodiment, the thickness of the stable oxide layer is controlled to be 1-3 nm, for example.

In another illustrative embodiment, the disclosed method for additively preparing a surface of a substrate includes exposing the substrate to the atmosphere after the stable oxide layer is formed. In another illustrative embodiment, the disclosed method for additively preparing a surface of a substrate includes chemically removing the stable oxide layer, wherein the removing of the stable oxide layer exposes a surface crystal lattice of the of the substrate.

According to another illustrative embodiment of the disclosed method for additively preparing a surface of a substrate, the step of removing the stable oxide layer is performed immediately prior to next step processing. According to another illustrative embodiment, the removing step removes essentially all charged particles from the beam path. According to another illustrative embodiment, the removing step forms an accelerated neutral beam that is fully dissociated. According to another illustrative embodiment, the step of promoting includes increasing the range of velocities of ions in the accelerated gas cluster ion beam. According to another illustrative embodiment, the step of promoting includes introducing one or more gaseous elements used in forming the gas cluster ion beam into the reduced pressure chamber to increase pressure along the beam path. According to another illustrative embodiment, the acceleration step accelerates the gas cluster ions through a potential of from 5 kV to 50 kV.

BRIEF DESCRIPTION OF THE DRAWINGS

For a better understanding of the present invention, together with other and further objects thereof, reference is made to the accompanying drawings, wherein:

FIGS. 17A, 17B, 17C, and 17D are schematics that show steps in a process for using an accelerated Neutral Beam derived from a GCIB to form a SiC or SiCx layer on a silicon substrate; and FIGS. 18A, 18B, 18C, 18D, 18E, 18F, 18G, and 18H are schematics that show steps in a process for using an accelerated Neutral Beam derived from a GCIB to form a hard mask pattern on a substrate without the use of photoresists as is required for advanced micro-fabrication of some devices.

FIGS. 19A, 19B, 19C, 19D, and 19E are schematics that show steps in an embodiment of a process for using an accelerated Neutral Beam derived from a GCIB to form controlled ultra-shallow etched regions in materials as is required for advanced micro-fabrication of some devices.

FIGS. 20A, 20B, 20C, 20D, 20E, and 20F are schematics that show steps in an alternate embodiment of a process for using an accelerated Neutral Beam derived from a GCIB to form controlled ultra-shallow etched regions in materials as is required for advanced micro-fabrication of some devices.

DETAILED DESCRIPTION OF THE DRAWINGS

Figure 1:
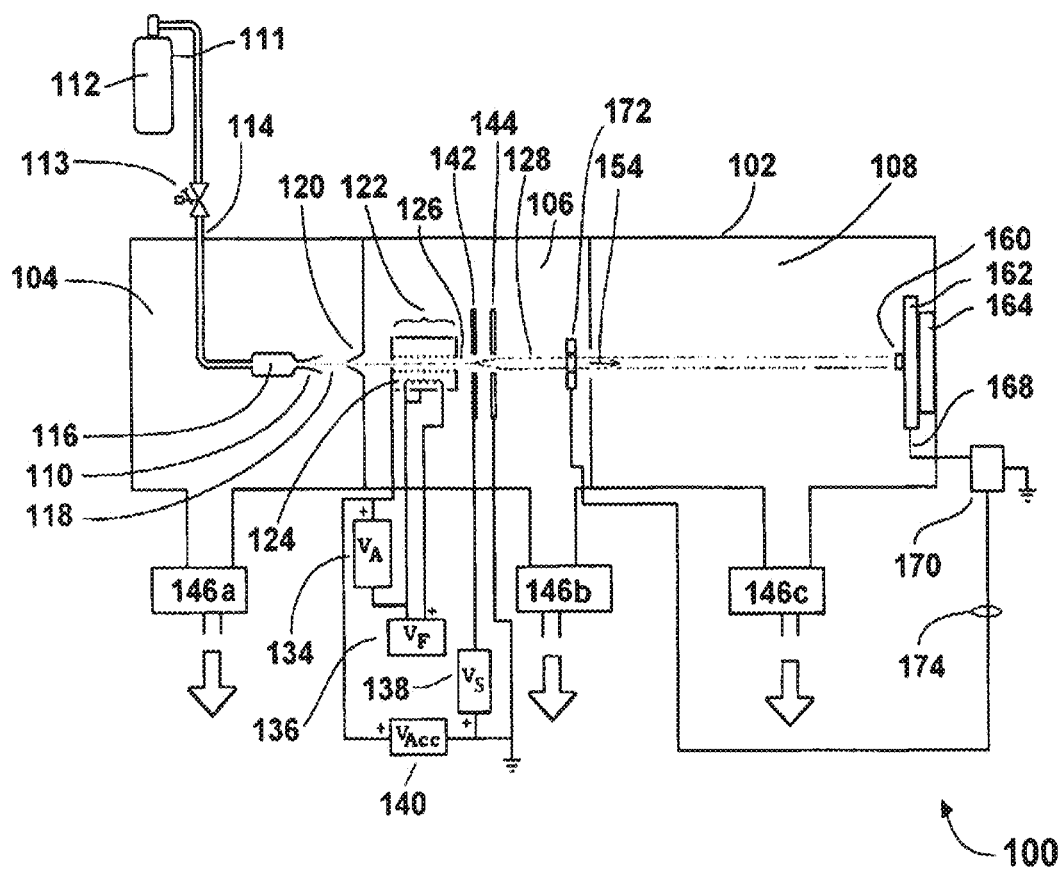
FIG. 1 is a schematic illustrating elements of a prior art apparatus for processing a workpiece using a GCIB.

Reference is now made to FIG. 1, which shows a schematic configuration for a prior art GCIB processing apparatus 100. A low-pressure vessel 102 has three fluidly connected chambers: a nozzle chamber 104, an ionization/acceleration chamber 106, and a processing chamber 108. The three chambers are evacuated by vacuum pumps 146a, 146b, and 146c, respectively. A pressurized condensable source gas 112 (for example argon) stored in a gas storage cylinder 111 flows through a gas metering valve 113 and a feed tube 114 into a stagnation chamber 116. Pressure (typically a few atmospheres) in the stagnation chamber 116 results in ejection of gas into the substantially lower pressure vacuum through a nozzle 110, resulting in formation of a supersonic gas jet 118. Cooling, resulting from the expansion in the jet, causes a portion of the gas jet 118 to condense into clusters, each consisting of from several to several thousand weakly bound atoms or molecules. A gas skimmer aperture 120 is employed to control flow of gas into the downstream chambers by partially separating gas molecules that have not condensed into a cluster jet from the cluster jet. Excessive pressure in the downstream chambers can be detrimental by interfering with the transport of gas cluster ions and by interfering with management of the high voltages that may be employed for beam formation and transport. Suitable condensable source gases 112 including but are not limited to argon and other condensable noble gases, nitrogen, carbon dioxide, oxygen, and many other gases and/or gas mixtures. After formation of the gas clusters in the supersonic gas jet 118, at least a portion of the gas clusters are ionized in an ionizer 122 that is typically an electron impact ionizer that produces electrons by thermal emission from one or more incandescent filaments 124 (or from other suitable electron sources) and accelerates and directs the electrons, enabling them to collide with gas clusters in the gas jet 118. Electron impacts with gas clusters eject electrons from some portion of the gas clusters, causing those clusters to become positively ionized. Some clusters may have more than one electron ejected and may become multiply ionized. Control of the number of electrons and their energies after acceleration typically influences the number of ionizations that may occur and the ratio between multiple and single ionizations of the gas clusters. A suppressor electrode 142, and grounded electrode 144 extract the cluster ions from the ionizer exit aperture 126, accelerate them to a desired energy (typically with acceleration potentials of from several hundred V to several tens of kV), and focuses them to form a GCIB 128. The region that the GCIB 128 traverses between the ionizer exit aperture 126 and the suppressor electrode 142 is referred to as the extraction region. The axis (determined at the nozzle 110), of the supersonic gas jet 118 containing gas clusters is substantially the same as the axis 154 of the GCIB 128. Filament power supply 136 provides filament voltage Vf to heat the ionizer filament 124. Anode power supply 134 provides anode voltage VA to accelerate thermoelectrons emitted from filament 124 to cause the thermoelectrons to irradiate the cluster-containing gas jet 118 to produce cluster ions. A suppression power supply 138 supplies suppression voltage Vs (on the order of several hundred to a few thousand volts) to bias suppressor electrode 142. Accelerator power supply 140 supplies acceleration voltage VAcc to bias the ionizer 122 with respect to suppressor electrode 142 and grounded electrode 144 so as to result in a total GCIB acceleration potential equal to VAcc. Suppressor electrode 142 serves to extract ions from the ionizer exit aperture 126 of ionizer 122 and to prevent undesired electrons from entering the ionizer 122 from downstream, and to form a focused GCIB 128.

A workpiece 160, which may (for example) be a medical device, a semiconductor material, an optical element, or other workpiece to be processed by GCIB processing, is held on a workpiece holder 162 that disposes the workpiece in the path of the GCIB 128. The workpiece holder is attached to but electrically insulated from the processing chamber 108 by an electrical insulator 164. Thus, GCIB 128 striking the workpiece 160 and the workpiece holder 162 flows through an electrical lead 168 to a dose processor 170. A beam gate 172 controls transmission of the GCIB 128 along axis 154 to the workpiece 160. The beam gate 172 typically has an open state and a closed state that is controlled by a linkage 174 that may be (for example) electrical, mechanical, or electromechanical. Dose processor 170 controls the open/closed state of the beam gate 172 to manage the GCIB dose received by the workpiece 160 and the workpiece holder 162. In operation, the dose processor 170 opens the beam gate 172 to initiate GCIB irradiation of the workpiece 160. Dose processor 170 typically integrates GCIB electrical current arriving at the workpiece 160 and workpiece holder 162 to calculate an accumulated GCIB irradiation dose. At a predetermined dose, the dose processor 170 closes the beam gate 172, terminating processing when the predetermined dose has been achieved.

In the following description, for simplification of the drawings, item numbers from earlier figures may appear in subsequent figures without discussion. Likewise, items discussed in relation to earlier figures may appear in subsequent figures without item numbers or additional description. In such cases items with like numbers are like items and have the previously described features and functions and illustration of items without item numbers shown in the present figure refer to like items having the same functions as the like items illustrated in earlier numbered figures.

Figure 2:
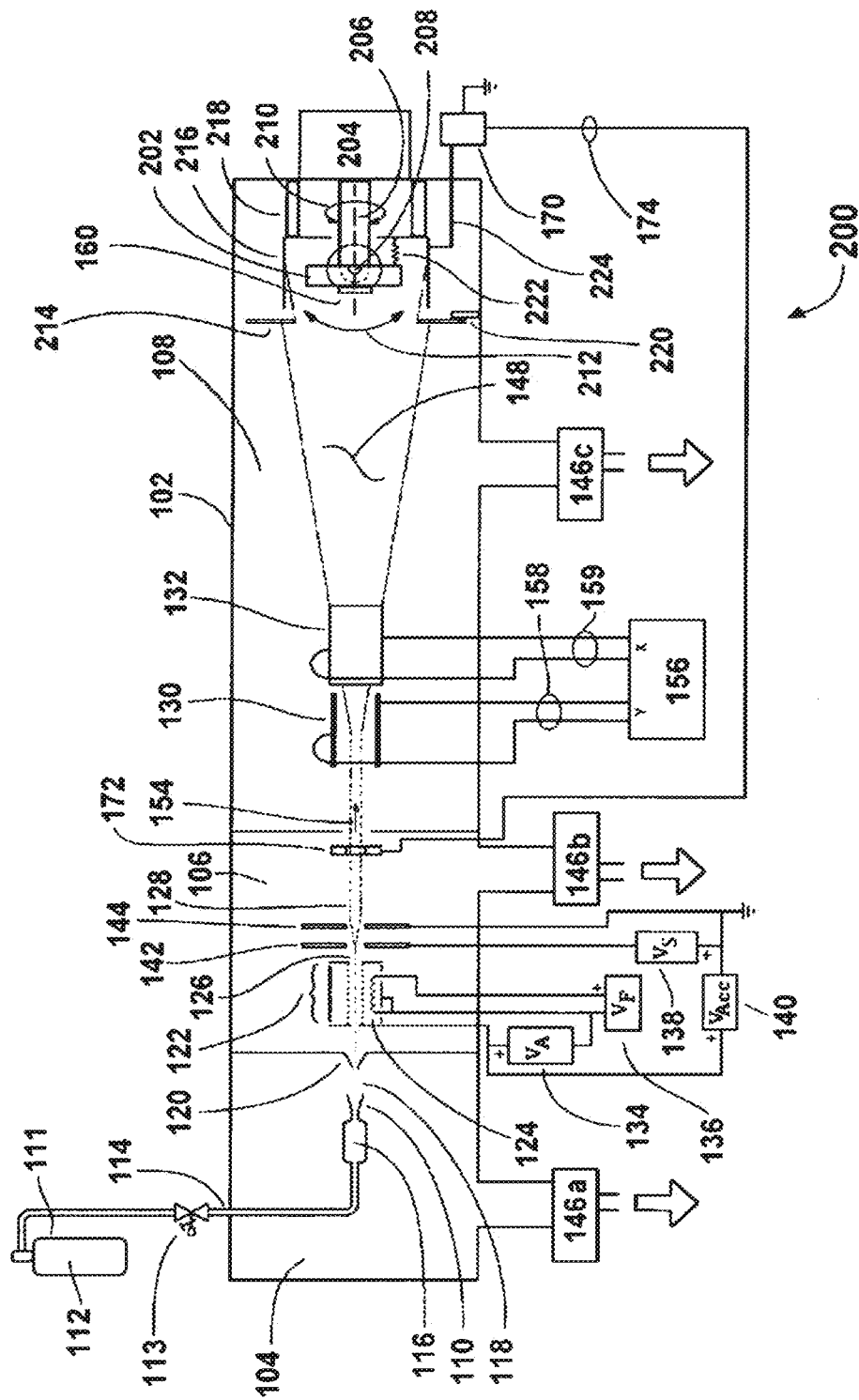
FIG. 2 is a schematic illustrating elements of another prior art apparatus for workpiece processing using a GCIB, wherein scanning of the ion beam and manipulation of the workpiece is employed.

FIG. 2 shows a schematic illustrating elements of another prior art GCIB processing apparatus 200 for workpiece processing using a GCIB, wherein scanning of the ion beam and manipulation of the workpiece is employed. A workpiece 160 to be processed by the GCIB processing apparatus 200 is held on a workpiece holder 202, disposed in the path of the GCIB 128. In order to accomplish uniform processing of the workpiece 160, the workpiece holder 202 is designed to manipulate workpiece 160, as may be required for uniform processing.

Any workpiece surfaces that are non-planar, for example, spherical or cup-like, rounded, irregular, or other un-flat configuration, may be oriented within a range of angles with respect to the beam incidence to obtain optimal GCIB processing of the workpiece surfaces. The workpiece holder 202 can be fully articulated for orienting all non-planar surfaces to be processed in suitable alignment with the GCIB 128 to provide processing optimization and uniformity. More specifically, when the workpiece 160 being processed is non-planar, the workpiece holder 202 may be rotated in a rotary motion 210 and articulated in articulation motion 212 by an articulation/rotation mechanism 204. The articulation/rotation mechanism 204 may permit 360 degrees of device rotation about longitudinal axis 206 (which is coaxial with the axis 154 of the GCIB 128) and sufficient articulation about an axis 208 perpendicular to axis 206 to maintain the workpiece surface to within a desired range of beam incidence.

Under certain conditions, depending upon the size of the workpiece 160, a scanning system may be desirable to produce uniform irradiation of a large workpiece. Although often not necessary for GCIB processing, two pairs of orthogonally oriented electrostatic scan plates 130 and 132 may be utilized to produce a raster or other scanning pattern over an extended processing area. When such beam scanning is performed, a scan generator 156 provides X-axis scanning signal voltages to the pair of scan plates 132 through lead pair 159 and Y-axis scanning signal voltages to the pair of scan plates 130 through lead pair 158. The scanning signal voltages are commonly triangular waves of different frequencies that cause the GCIB 128 to be converted into a scanned GCIB 148, which scans the entire surface of the workpiece 160. A scanned beam-defining aperture 214 defines a scanned area. The scanned beam-defining aperture 214 is electrically conductive and is electrically connected to the low-pressure vessel 102 wall and supported by support member 220. The workpiece holder 202 is electrically connected via a flexible electrical lead 222 to a faraday cup 216 that surrounds the workpiece 160 and the workpiece holder 202 and collects all the current passing through the defining aperture 214. The workpiece holder 202 is electrically isolated from the articulation/rotation mechanism 204 and the faraday cup 216 is electrically isolated from and mounted to the low-pressure vessel 102 by insulators 218. Accordingly, all current from the scanned GCIB 148, which passes through the scanned beam-defining aperture 214 is collected in the faraday cup 216 and flows through electrical lead 224 to the dose processor 170. In operation, the dose processor 170 opens the beam gate 172 to initiate GCIB irradiation of the workpiece 160. The dose processor 170 typically integrates GCIB electrical current arriving at the workpiece 160 and workpiece holder 202 and faraday cup 216 to calculate an accumulated GCIB irradiation dose per unit area. At a predetermined dose, the dose processor 170 closes the beam gate 172, terminating processing when the predetermined dose has been achieved. During the accumulation of the predetermined dose, the workpiece 160 may be manipulated by the articulation/rotation mechanism 204 to ensure processing of all desired surfaces.

Figure 3:
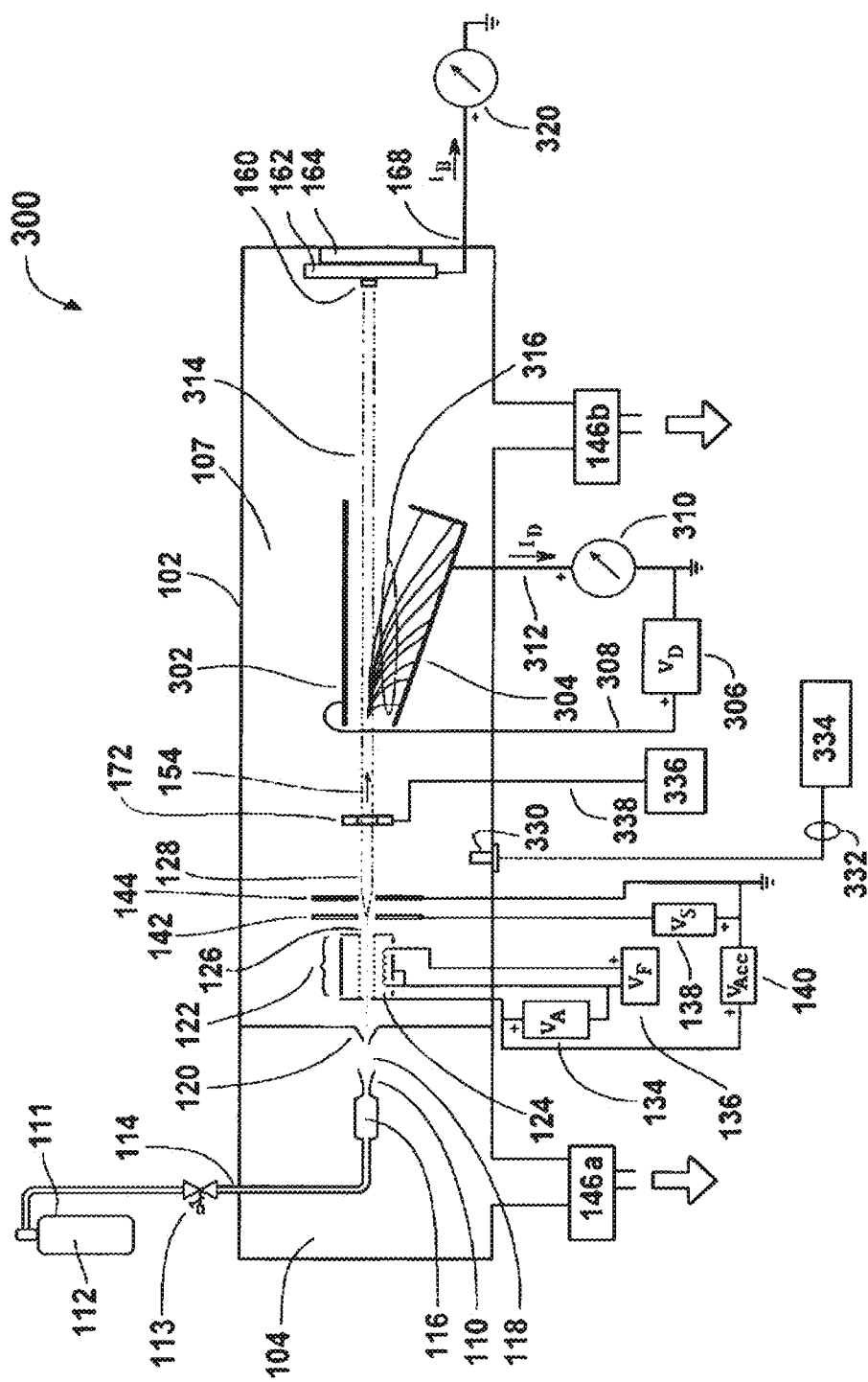
FIG. 3 is a schematic of an apparatus according to an embodiment of the invention, which uses electrostatic deflection plates to separate the charged and uncharged beam components.

FIG. 3 is a schematic of a Neutral Beam processing apparatus 300 according to an embodiment of the invention, which uses electrostatic deflection plates to separate the charged and uncharged portions of a GCIB. A beamline chamber 107 encloses the ionizer and accelerator regions and the workpiece processing regions. The beamline chamber 107 has high conductance and so the pressure is substantially uniform throughout. A vacuum pump 146b evacuates the beamline chamber 107. Gas flows into the beamline chamber 107 in the form of clustered and unclustered gas transported by the gas jet 118 and in the form of additional unclustered gas that leaks through the gas skimmer aperture 120. A pressure sensor 330 transmits pressure data from the beamline chamber 107 through an electrical cable 332 to a pressure sensor controller 334, which measures and displays pressure in the beamline chamber 107. The pressure in the beamline chamber 107 depends on the balance of gas flow into the beamline chamber 107 and the pumping speed of the vacuum pump 146b. By selection of the diameter of the gas skimmer aperture 120, the flow of source gas 112 through the nozzle 110, and the pumping speed of the vacuum pump 146b, the pressure in the beamline chamber 107 equilibrates at a pressure, PB, determined by design and by nozzle flow. The GCIB flight path from grounded electrode 144 to workpiece holder 162, is for example, 100 cm. By design and adjustment PB may be approximately $6 \times 10^{-5}$ torr ($8 \times 10^{-3}$ pascal). Thus the product of pressure and beam path length is approximately $6 \times 10^{-3}$ torr-cm (0.8 pascal-cm) and the gas target thickness for the beam is approximately $1.94 \times 10^{14}$ gas molecules per cm2 which combined with monomer evolution due to the initial ionization of the gas clusters in the ionizer 122 and collisions that occur between gas cluster ions in the GCIB 128 is observed to be effective for dissociating the gas cluster ions in the GCIB 128 and results in a fully dissociated accelerated Neutral Beam 314. VAcc may be for example 30 kV and the GCIB 128 is accelerated by that potential. A pair of deflection plates (302 and 304) is disposed about the axis 154 of the GCIB 128. A deflector power supply 306 provides a positive deflection voltage Vo to deflection plate 302 via electrical lead 308. Deflection plate 304 is connected to electrical ground by electrical lead 312 and through current sensor/display 310. Deflector power supply 306 is manually controllable. Vo may be adjusted from zero to a voltage sufficient to completely deflect the ionized portion 316 of the GCIB 128 onto the deflection plate 304 (for example a few thousand volts). When the ionized portion 316 of the GCIB 128 is deflected onto the deflection plate 304, the resulting current, Io flows through electrical lead 312 and current sensor/display 310 for indication. When Vo is zero, the GCIB 128 is undeflected and travels to the workpiece 160 and the workpiece holder 162. The GCIB beam current 1B is collected on the workpiece 160 and the workpiece holder 162 and flows through electrical lead 168 and current sensor/display 320 to electrical ground. 1B is indicated on the current sensor/display 320. A beam gate 172 is controlled through a linkage 338 by beam gate controller 336. Beam gate controller 336 may be manual or may be electrically or mechanically timed by a preset value to open the beam gate 172 for a predetermined interval. In use, Vo is set to zero, and the beam current, IB, striking the workpiece holder is measured. Based on previous experience for a given GCIB process recipe, an initial irradiation time for a given process is determined based on the measured current, IB. Vo is increased until all measured beam current is transferred from 1B to Io and Io no longer increases with increasing Vo. At this point a Neutral Beam 314 comprising energetic dissociated components of the initial GCIB 128 irradiates the workpiece holder 162. The beam gate 172 is then closed and the workpiece 160 placed onto the workpiece holder 162 by conventional workpiece loading means (not shown). The beam gate 172 is opened for the predetermined initial radiation time. After the irradiation interval, the workpiece may be examined and the processing time adjusted as necessary to calibrate the desired duration of Neutral Beam processing based on the measured GCIB beam current IB. Following such a calibration process, additional workpieces may be processed using the calibrated exposure duration.

The Neutral Beam 314 contains a repeatable fraction of the initial energy of the accelerated GCIB 128. The remaining ionized portion 316 of the original GCIB 128 has been removed from the Neutral Beam 314 and is collected by the grounded deflection plate 304. The ionized portion 316 that is removed from the Neutral Beam 314 may include monomer ions and gas cluster ions including intermediate size gas cluster ions. Because of the monomer evaporation mechanisms due to cluster heating during the ionization process, intra-beam collisions, background gas collisions, and other causes (all of which result in erosion of clusters) the Neutral Beam substantially consists of neutral monomers, while the separated charged particles are predominately cluster ions. The inventors have confirmed this by suitable measurements that include re-ionizing the Neutral Beam and measuring the charge to mass ratio of the resulting ions. The separated charged beam components largely consist of cluster ions of intermediate size as well as monomer ions and perhaps some large cluster ions. As will be shown below, certain superior process results are obtained by processing workpieces using this Neutral Beam.

Figure 4:
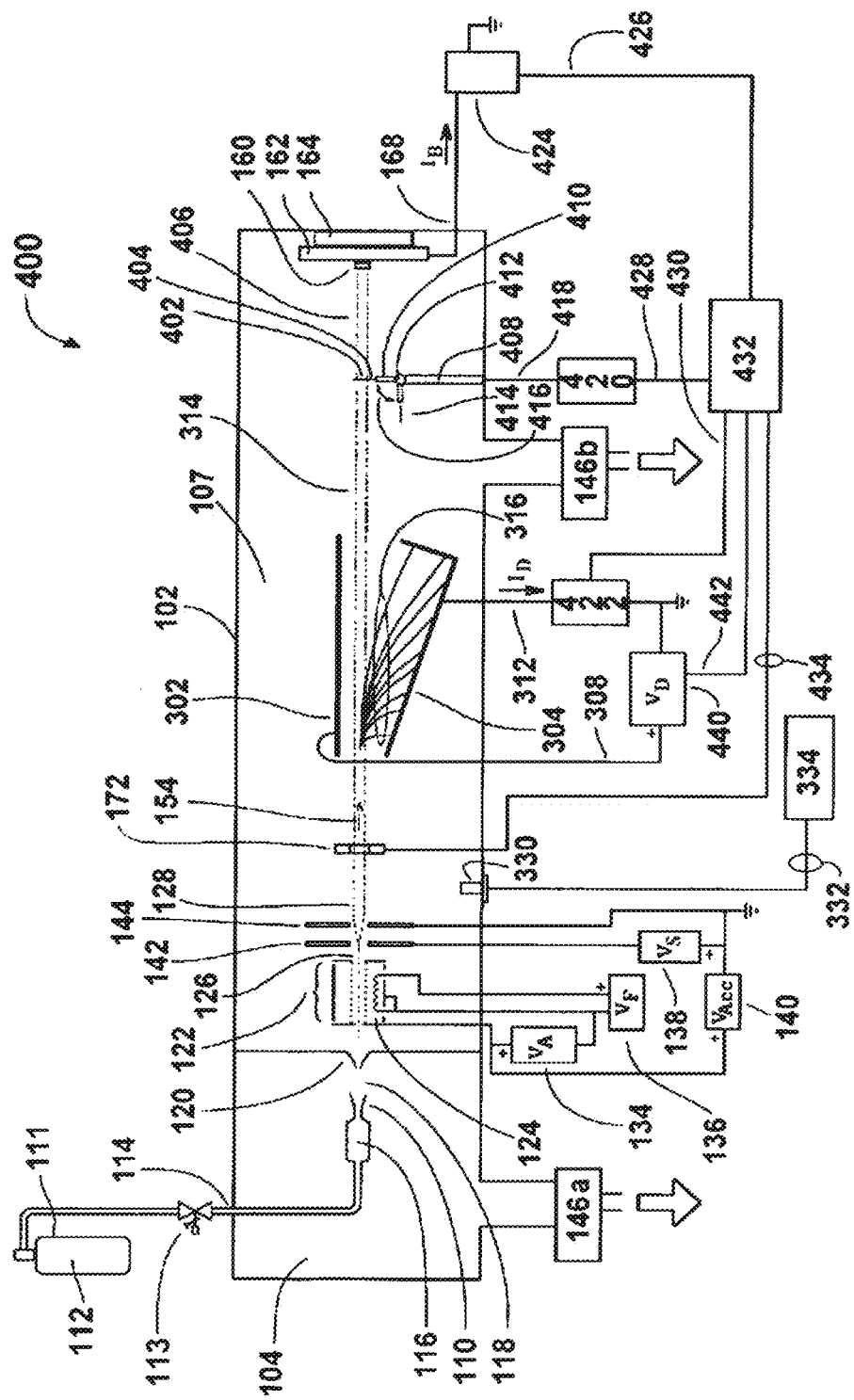
FIG. 4 is a schematic of an apparatus according to an embodiment of the invention, using a thermal sensor for Neutral Beam measurement.

FIG. 4 is a schematic of a Neutral Beam processing apparatus 400 according to an embodiment of the invention, which uses a thermal sensor for Neutral Beam measurement. A thermal sensor 402 attaches via low thermal conductivity attachment 404 to a rotating support arm 410 attached to a pivot 412. Actuator 408 moves thermal sensor 402 via a reversible rotary motion 416 between positions that intercept the Neutral Beam 314 or GCIB 128 and a parked position indicated by 414 where the thermal sensor 402 does not intercept any beam When thermal sensor 402 is in the parked position (indicated by 414) the GCIB 128 or Neutral Beam 314 continues along path 406 for irradiation of the workpiece 160 and/or workpiece holder 162. A thermal sensor controller 420 controls positioning of the thermal 5 sensor 402 and performs processing of the signal generated by thermal sensor 402. Thermal sensor 402 communicates with the thermal sensor controller 420 through an electrical cable 418.

Thermal sensor controller 420 communicates with a dosimetry controller 432 through an electrical cable 428. A beam current measurement device 424 measures beam current 1B flowing in electrical lead 168 when the GCIB 128 strikes the workpiece 160 and/or the workpiece holder 162. Beam current measurement device 424 communicates a beam current measurement signal to dosimetry controller 432 via electrical cable 426. Dosimetry controller 432 controls setting of open and closed states for beam gate 172 by control signals transmitted via linkage 434. Dosimetry controller 432 controls deflector power supply 440 via electrical cable 442 and can control the deflection voltage Vo between voltages of zero and a positive voltage adequate to completely deflect the ionized portion 316 of the GCIB 128 to the deflection plate 304. When the ionized portion 316 of the GCIB 128 strikes deflection plate 304, the resulting current Io is measured by current sensor 422 and communicated to the dosimetry controller 432 via electrical cable 430. In operation dosimetry controller 432 sets the thermal sensor 402 to the parked position 414, opens beam gate 172, sets Vo to zero so that the full GCIB 128 strikes the workpiece holder 162 and/or workpiece 160. The dosimetry controller 432 records the beam current 1B transmitted from beam current measurement device 424. The dosimetry controller 432 then moves the thermal sensor 402 from the parked position 414 to intercept the GCIB 128 by commands relayed through thermal sensor controller 420. Thermal sensor controller 420 measures the beam energy flux of GCIB 128 by calculation based on the heat capacity of the sensor and measured rate of temperature rise of the thermal sensor 402 as its temperature rises through a predetermined measurement temperature (for example 70 degrees C.) and communicates the calculated beam energy flux to the dosimetry controller 432 which then calculates a calibration of the beam energy flux as measured by the thermal sensor 402 and the corresponding beam current measured by the beam current measurement device 424. The dosimetry controller 432 then parks the thermal sensor 402 at parked position 414, allowing it to cool and commands application of positive Vo to deflection plate 302 until all of the current Io due to the ionized portion of the GCIB 128 is transferred to the deflection plate 304. The current sensor 422 measures the corresponding Io and communicates it to the dosimetry controller 432. The dosimetry controller also moves the thermal sensor 402 from parked position 414 to intercept the Neutral Beam 314 by commands relayed through thermal sensor controller 420. Thermal sensor controller 420 measures the beam energy flux of the Neutral Beam 314 using the previously determined calibration factor and the rate of temperature rise of the thermal sensor 402 as its temperature rises through the predetermined measurement temperature and communicates the Neutral Beam energy flux to the dosimetry controller 432. The dosimetry controller 432 calculates a neutral beam fraction, which is the ratio of the thermal measurement of the Neutral Beam 314 energy flux to the thermal measurement of the full GCIB 128 energy flux at sensor 402. Under typical operation, a neutral beam fraction of about 5% to about 95% is achieved. Before beginning processing, the dosimetry controller 432 also measures the current, Io, and determines a current ratio between the initial values of fa and Io. During processing, the instantaneous Io measurement multiplied by the initial fa/Io ratio may be used as a proxy for continuous measurement of the fa and employed for dosimetry during control of processing by the dosimetry controller 432. Thus, the dosimetry controller 432 can compensate any beam fluctuation during workpiece processing, just as if an actual beam current measurement for the full GCIB 128 were available. The dosimetry controller uses the neutral beam fraction to compute a desired processing time for a particular beam process. During the process, the processing time can be adjusted based on the calibrated measurement of Io for correction of any beam fluctuation during the process.

Figure 5:
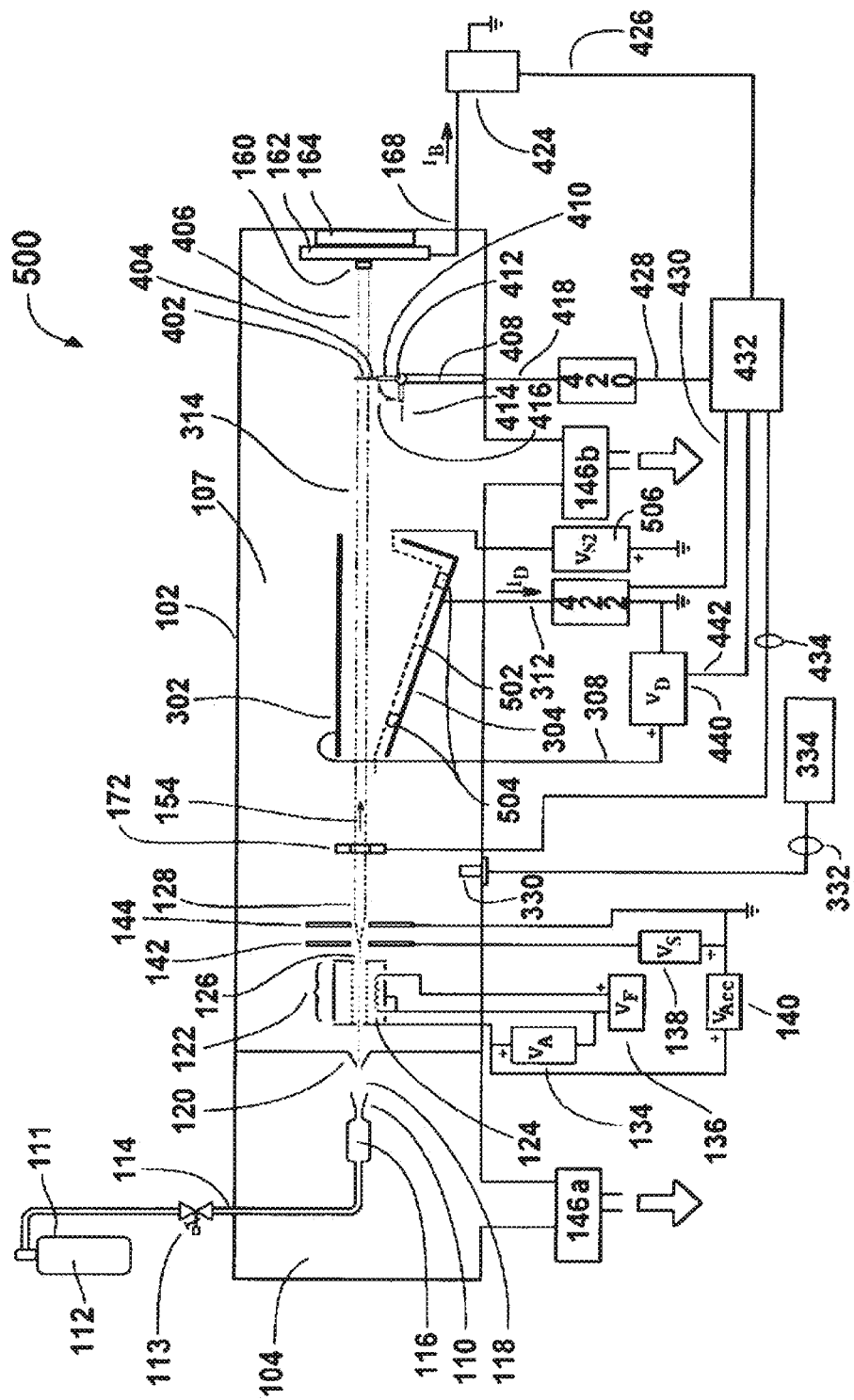
FIG. 5 is a schematic of an apparatus according to an embodiment of the invention which uses deflected ion beam current collected on a suppressed deflection plate as a component of a dosimetry scheme.

FIG. 5 is a schematic of a Neutral Beam processing apparatus 500 according to an embodiment of the invention that uses deflected ion beam current collected on a suppressed deflection plate as a component of a dosimetry scheme. Referring briefly to FIG. 4, the dosimetry scheme shown in FIG. 4 can suffer from the fact that the current, Io, includes the current due to the ionized portion 316 of the GCIB 128 as well as secondary electron currents resulting from ejection of secondary electrons emitted when the ionized portion 316 of the beam strikes deflection plate 304. The secondary electron yield can vary depending on the distribution of cluster ion sizes in the ionized portion 316. It can also vary depending on the surface state (cleanliness, etc.) of the impacted surface of the deflection plate 304. Thus, in the scheme described in FIG. 4, the magnitude of Io is not a precise representation of the current due to the ionized portion 316 of the GCIB 128. Referring again now to FIG. 5, an improved measurement of the ionized portion 316 of GCIB 128 can be realized at deflection plate 304 by adding an electron suppressor grid electrode 502 proximal to the surface of deflection plate 304 that receives the ionized portion 316. The electron suppressor grid electrode 502 is highly transparent to the ionized portion 316 but is biased negative with respect to the deflection plate 304 by second suppressor voltage Vs2 provided by second suppressor power supply 506. Effective suppression of secondary electrons is typically achieved by a Vs2 on the order of several tens of volts. By suppressing the emission of secondary electrons, the current loading of deflector power supply 440 is reduced and the precision of the Io representation of the current in the ionized portion 316 of the GCIB 128 is increased. Electron suppressor grid 502 is insulated from and maintained in proximity to deflection plate 304 by insulating supports 504.

Figure 6:
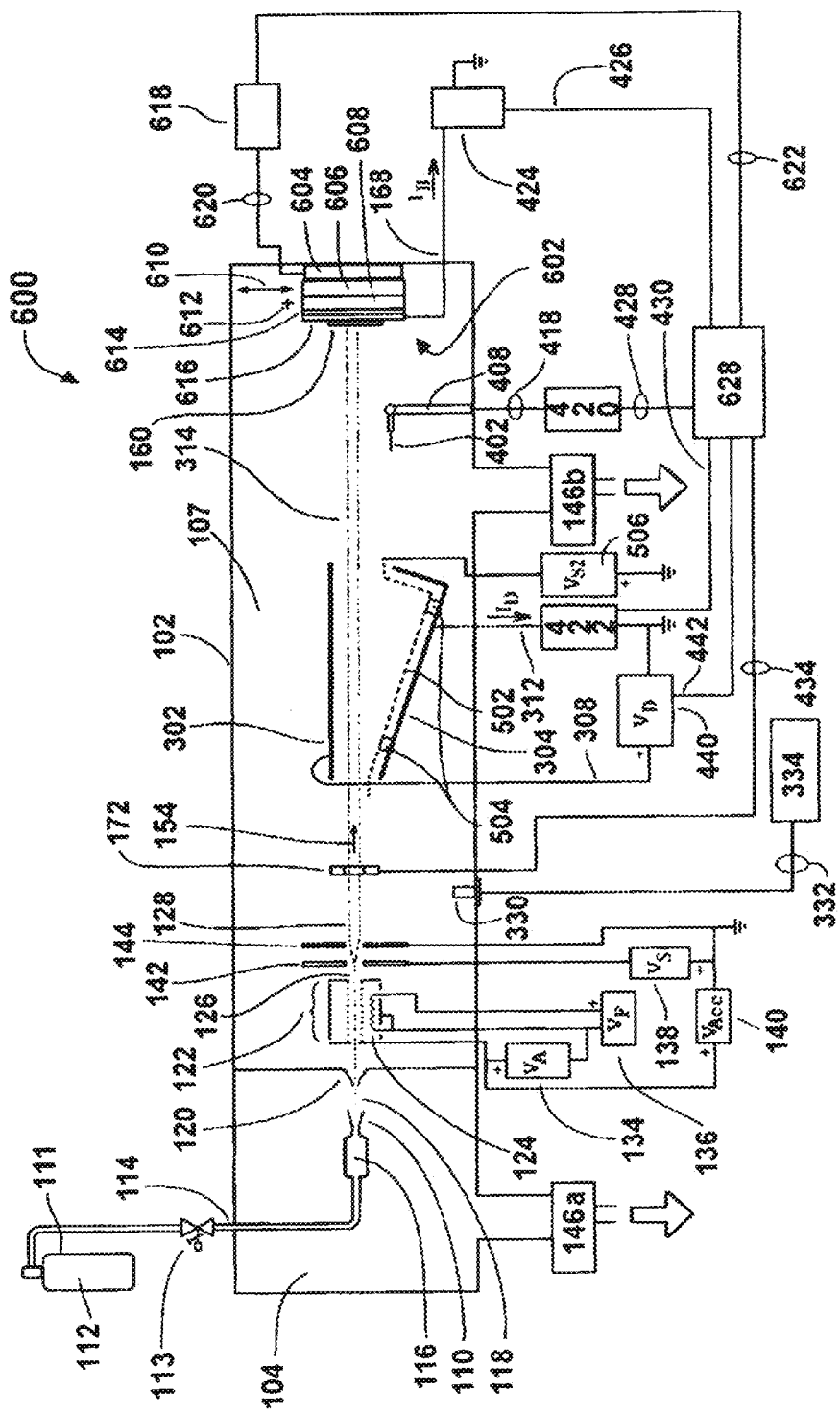
FIG. 6 shows a schematic of an apparatus according to an embodiment of the invention, employing mechanical scanning for irradiating an extended workpiece uniformly with a Neutral Beam.

FIG. 6 is a schematic of a Neutral Beam processing apparatus 550 according to an embodiment of the invention that uses a sample of deflected ion beam current collected in a faraday cup as a component of a dosimetry scheme. In this embodiment of the invention, a sample 556 of the ionized portion 316 (as shown in FIG. 5) is captured in a faraday cup 558. Sample current, Is, collected in the faraday cup 558 is conducted via electrical lead 560 to current sensor 562 for measurement, and the measurement is communicated to a dosimetry controller 566 via electrical cable 564. Faraday cup 558 provides a superior current measurement to that obtained by measuring the current Io collected by deflection plate 304 (as shown in FIG. 5). Current sensor 562 operates substantially as previously described for the current sensor 422 (as shown in FIG. 5) except that current sensor 562 has increased sensitivity to accommodate the smaller magnitude offs as compared to Io. Dosimetry controller 566 operates substantially as previously described for dosimetry controller 432 (as shown in FIG. 5) except that it is designed to accommodate a smaller current measurement Is (as compared to Io of FIG. 5).

FIG. 6 is a schematic of a Neutral Beam processing apparatus 600 according to an embodiment of the invention that uses mechanical scanner 602 to scan a spatially extended workpiece 160 through the Neutral Beam 314 to facilitate uniform Neutral Beam scanning of a large workpiece. Since the Neutral Beam 314 cannot be scanned by magnetic or electrostatic techniques, when the workpiece 160 to be processed is spatially larger than the extent of the Neutral Beam 314 and uniform processing of the workpiece 160 is required, a mechanical scanner 602 is employed to scan the workpiece 160 through the Neutral Beam 314. Mechanical scanner 602 has a workpiece holder 616 for holding workpiece 160. The mechanical scanner 602 is disposed so that either the Neutral Beam 314 or the GCIB 128 can be incident on the workpiece 160 and/or the workpiece holder 616. When the deflection plates (302,304) deflect the ionized portion 316 out of the GCIB 128, the workpiece 160 and/or the workpiece holder 616 receive only the Neutral Beam 314. When the deflection plates (302, 304) do not deflect the ionized portion 316 of the GCIB 128, the workpiece 160 and/or the workpiece holder 616 receives the full GCIB 128. Workpiece holder 616 is electrically conductive and is insulated from ground by insulator 614. Beam current (fa) due to GCIB 128 incident on the workpiece 160 and/or the workpiece holder 616 is conducted to beam current measurement device 424 via electrical lead 168. Beam current measurement device 424 measures fa and communicates the measurement to dosimetry controller 628. Mechanical scanner 602 has an actuator base 604 containing actuators controlled by mechanical scan controller 618 via electrical cable 620. Mechanical scanner 602 has a Y-displacement table 606 capable of reversible motion in an Y-direction 610, and it has an X-displacement table 608 capable of reversible motion in an X-direction 612, indicated as in and out of the plane of the paper of FIG. 6. Movements of the Y-displacement table 606 and of the X-displacement table 608 are actuated by actuators in the actuator base 604 under control of the mechanical scan controller 618. Mechanical scan controller 618 communicates via electrical cable 622 with dosimetry controller 628. Function of dosimetry controller 628 includes all functions previously described for dosimetry controller 432, with additional function for controlling the mechanical scanner 602 via communication with mechanical scan controller 618. Based on measured Neutral Beam energy flux rate, dosimetry controller 628 calculates and communicates to mechanical scan controller 618 the Y- and X-scanning rates for causing an integral number of complete scans of the workpiece 160 to be completed during processing of a workpiece 160, insuring complete and uniform processing of the workpiece and insures a predetermined energy flux dose to the workpiece 160. Except for the use of a Neutral Beam, and the use of a Neutral Beam energy flux rate measurement, such scanning control algorithms are conventional and commonly employed in, for examples, conventional GCIB processing tools and in ion implantation tools. It is noted that the Neutral Beam processing apparatus 600 can be used as a conventional GCIB processing tool by controlling the deflection plates (302, 304) so that GCIB 128 passes without deflection, allowing the full GCIB 128 to irradiate the workpiece 160 and/or the workpiece holder 616.

Figure 7:
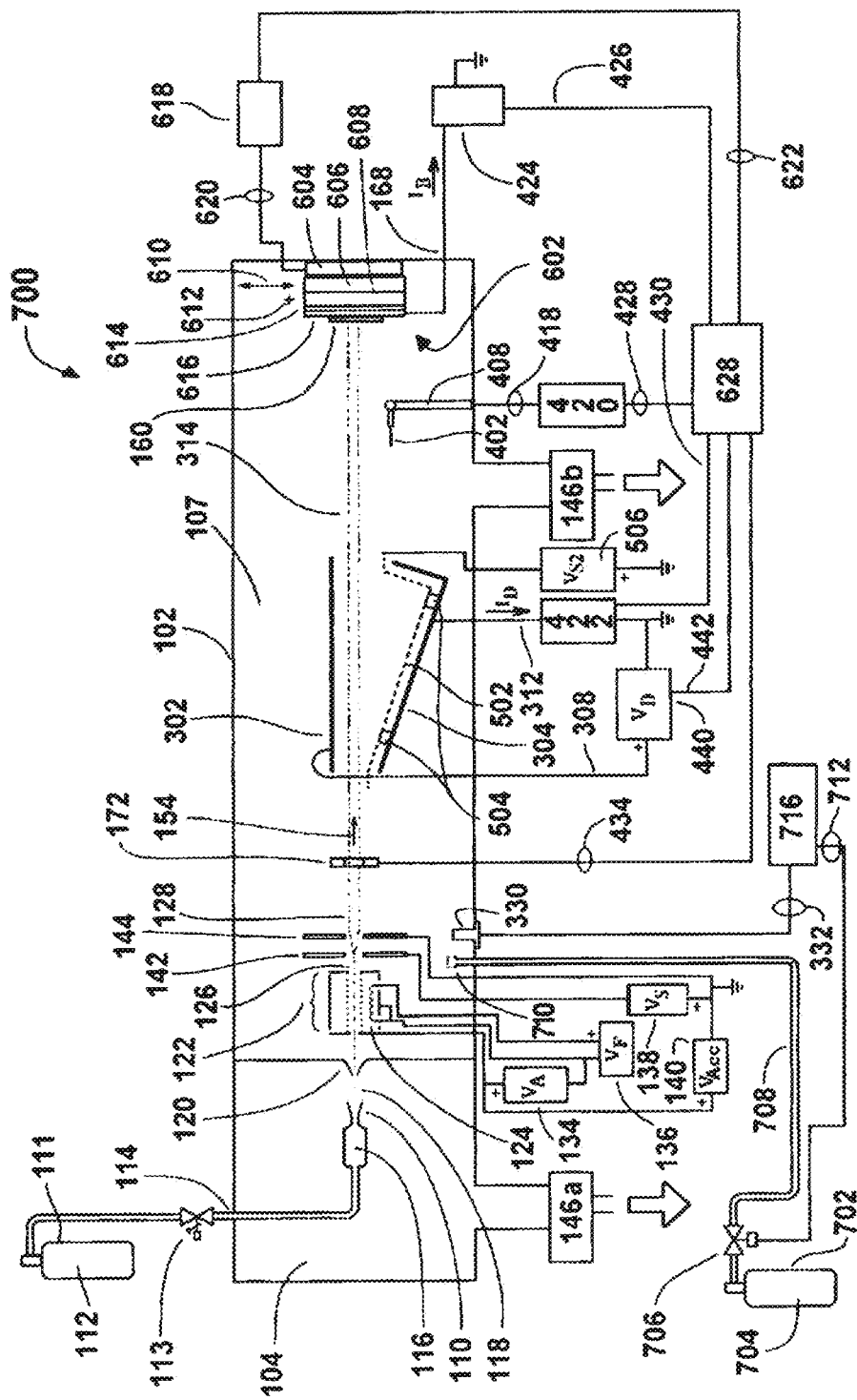
FIG. 7 shows a schematic of an apparatus according to an embodiment of the invention with means for controlling the gas target thickness by injecting gas into the beamline chamber.

FIG. 7 is a schematic of a Neutral Beam processing apparatus 700 according to an embodiment of the invention that provides active setting and control of the gas pressure in the beamline chamber 107. A pressure sensor 330 transmits pressure measurement data from the beamline chamber 107 through an electrical cable 332 to a pressure controller 716, which measures and displays pressure in the beamline chamber. The pressure in the beamline chamber 107 depends on the balance of gas flow into the beamline chamber 107 and the pumping speed of the vacuum pump 146*b*. A gas bottle 702 contains a beamline gas 704 that is preferably the same gas species as the source gas 112. Gas bottle 702 has a remotely operable leak valve 706 and a gas feed tube 708 for leaking beamline gas 704 into the beamline chamber 107 through a gas diffuser 710 in the beamline chamber 107. The pressure controller 716 is capable of receiving an input set point (by manual entry or by automatic entry from an system controller (not shown)) in the form of a pressure set point, a pressure times beam path length set point (based on predetermined beam path length), or a gas target thickness set point. Once a set point has been established for the pressure controller 716, it regulates the flow of beamline gas 704 into the beamline chamber 107 to maintain the set point during operation of the Neutral Beam processing apparatus. When such a beamline pressure regulation system is employed, the vacuum pump 146*b* is normally sized so that in the absence of beamline gas 704 being introduced into the beamline chamber 107, the baseline pressure in the beamline chamber 107 is lower than the desired operating pressure. If the baseline pressure is chosen so that the conventional GCIB 128 can propagate the length of the beam path without excessive dissociation, then the Neutral Beam processing apparatus 700 can also be used as a conventional GCIB processing tool.

Figure 8:
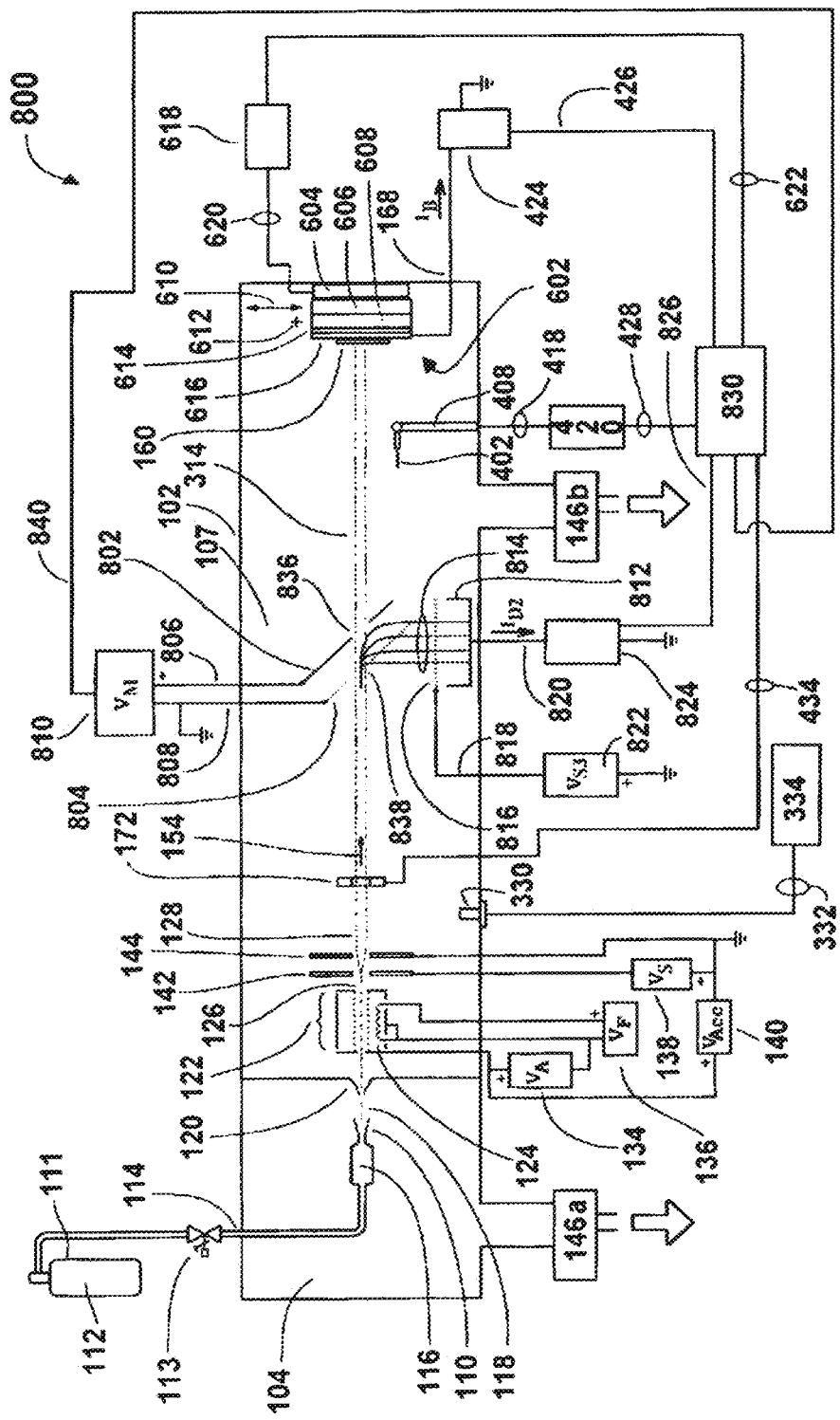
FIG. 8 shows a schematic of an apparatus according to an embodiment of the invention, which uses an electrostatic mirror to separate charged and neutral beam components.

FIG. 8 is a schematic of a Neutral Beam processing apparatus 800 according to an embodiment of the invention that employs an electrostatic mirror for separation of the charged and neutral beam portions. A reflecting electrode 802 and a substantially transparent electrical grid electrode 804 are disposed displaced from each other, parallel to each other, and at a 45-degree angle to the beam axis 154. The reflecting electrode 802 and the substantially transparent electrical grid electrode 804 both have holes (836 and 838 respectively) centered on the beam axis 154 for permitting passage of the Neutral Beam 314 through the two electrodes. A mirror power supply 810 provides a mirror electrical potential VM across the gap between the reflecting electrode 802 and the substantially transparent electrical grid electrode 804 via electrical leads 806 and 808, with polarity as indicated in FIG. 8. VM is selected to be slightly greater than VAce+VR (VR being the retarding potential required to overcome the thermal energy the gas cluster jet has before ionization and acceleration—VR is typically on the order of a few kV). The electric field generated between the reflecting electrode 802 and the substantially transparent electrical grid electrode 804 deflects the ionized portion 814 of the GCIB 128 through approximately a 90-degree angle with respect to the axis 154. A faraday cup 812 is disposed to collect the ionized portion 814 of the GCIB 128. A suppressor electrode grid electrode 816 prevents escape of secondary electrons from the faraday cup 812. The suppressor grid electrode 816 is biased with a negative third suppressor voltage VS3 provided by third suppressor power supply 822. VS3 is typically on the order of several tens of volts. The faraday cup current, 102, representing current in the deflected ionized portion 814 of the GCIB 128 (and thus the current in the GCIB 128) flows through electrical lead 820 to current sensor 824. Current sensor 824 measures the current 102 and transmits the measurement to dosimetry controller 830 via electrical lead 826. The function of dosimetry controller 830 is as previously described for dosimetry controller 432, except that dosimetry controller 830 receives 102 current measurement information from current sensor 824 and dosimetry controller 830 does not control deflector power supply 440, but instead controls mirror power supply 810 via electrical cable 840. By setting mirror power supply 810 to output either zero volts or VM, dosimetry controller 830 controls whether the full GCIB 128, or only the Neutral Beam 314 of GCIB 128 is transmitted to the workpiece 160 and/or workpiece holder 616 for measurement and/or processing.

Figure 9:
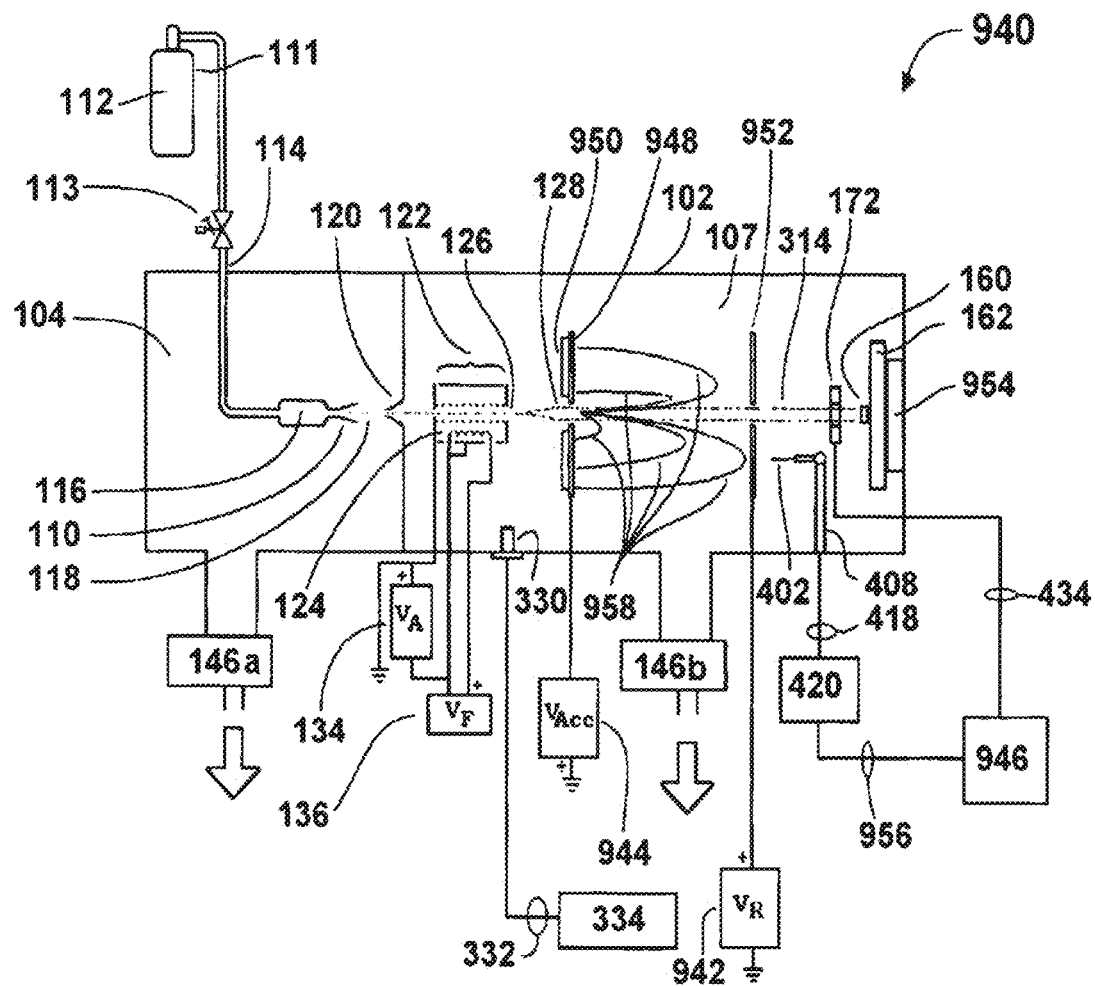
FIG. 9 shows a schematic of an apparatus according to an embodiment of the invention wherein an accelerate-decelerate configuration is used to separate the charged beam from the neutral beam components.

FIG. 9 is a schematic of a Neutral Beam processing apparatus 940 according to an embodiment of the invention, which has the advantage of both the ionizer 122 and the workpiece 160 operating at ground potential. The workpiece 160 is held in the path of Neutral Beam 314 by electrically conductive workpiece holder 162, which in turn is supported by electrically conductive support member 954 attached to a wall of the low-pressure vessel 102. Accordingly, workpiece holder 162 and the workpiece 160 are electrically grounded. An acceleration electrode 948 extracts gas cluster ions from ionizer exit aperture 126 and accelerates the gas cluster ions through a voltage potential VAce provided by acceleration power supply 944 to form a GCIB 128. The body of ionizer 122 is grounded and VAcc is of negative polarity. Neutral gas atoms in the gas jet 118 have a small energy on the order of several tens of milli-electron-volts. As they condense into clusters, this energy accumulates proportional to cluster size, N. Sufficiently large clusters gain non-negligible energies from the condensation process and when accelerated through a voltage potential of VAcc, the final energy of each ion exceeds VAce by its neutral cluster jet energy.

Downstream of the acceleration electrode 948, a retarding electrode 952 is employed to ensure deceleration of the ionized portion 958 of the GCIB 128. Retarding electrode 952 is biased at a positive retarding voltage, VR, by retarding voltage power supply 942. A retarding voltage VR of a few kV is generally adequate to ensure that all ions in the GCIB 128 are decelerated and returned to the acceleration electrode 948. Permanent magnet arrays 950 are attached to the acceleration electrode 948 to provide magnetic suppression of secondary electrons that would otherwise be emitted as a result of the returned ions striking the acceleration electrode 948. A beam gate 172 is a mechanical beam gate and is located upstream of the workpiece 160. A dosimetry controller 946 controls the process dose received by the workpiece. A thermal sensor 402 is placed into a position that intercepts the Neutral Beam 314 for Neutral Beam energy flux measurement or in the parked position for Neutral Beam processing of the workpiece under control of the thermal sensor controller 420. When thermal sensor 402 is in the beam sensing position, the Neutral Beam energy flux is measured and transmitted to the dosimetry controller 946 over electrical cable 956. In normal use, the dosimetry controller 946 closes the beam gate 172 and commands the thermal sensor controller 420 to measure and report the energy flux of the Neutral Beam 314. Next, a conventional workpiece loading mechanism (not shown) places a new workpiece on the workpiece holder. Based on the measured Neutral Beam energy flux, the dosimetry controller 946 calculates an irradiation time for providing a predetermined desired Neutral Beam energy dose. The dosimetry controller 946 commands the thermal sensor 402 out of the Neutral Beam 314 and opens the beam gate 172 for the calculated irradiation time and then closes the beam gate 172 at the end of the calculated irradiation time to terminate the processing of the workpiece 160.

Figure 10:
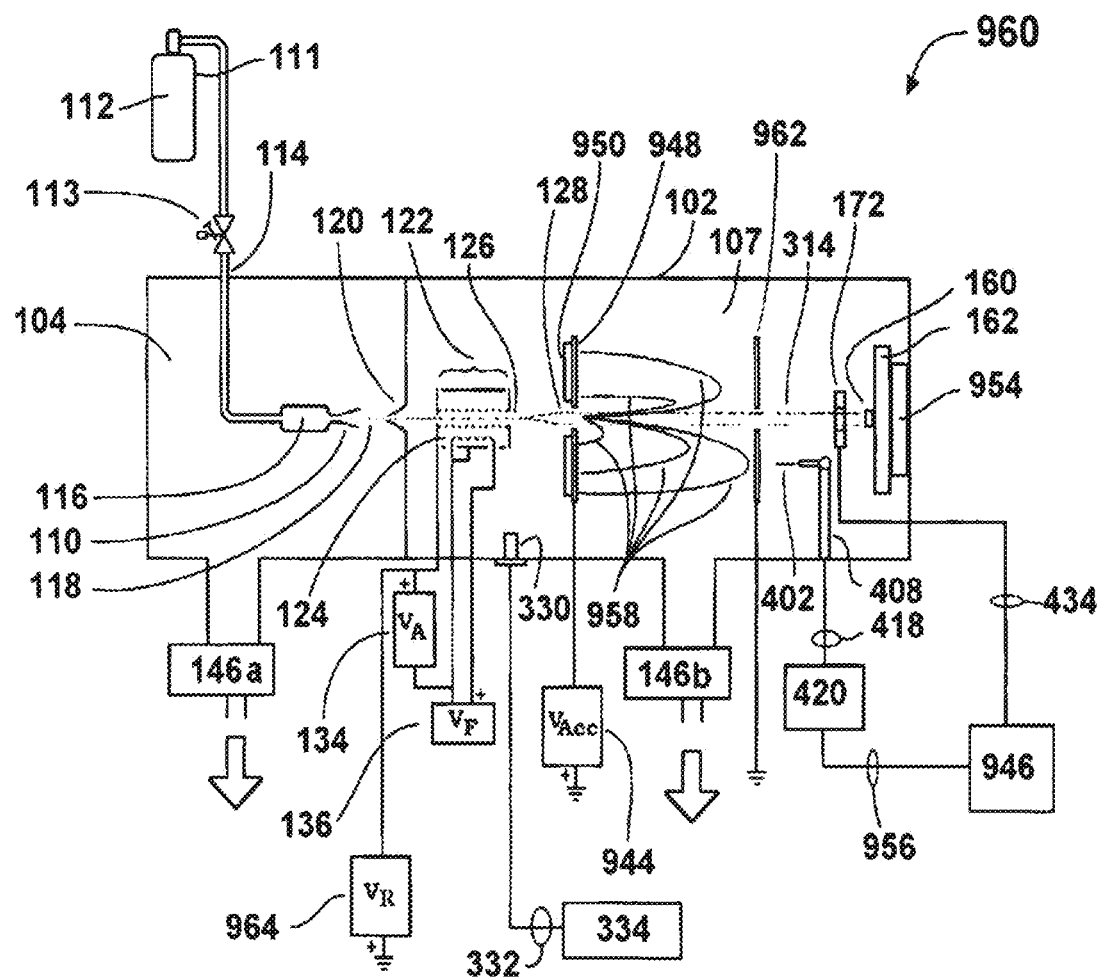
FIG. 10 shows a schematic of an apparatus according to an embodiment of the invention wherein an alternate accelerate-decelerate configuration is used to separate the charged beam from the neutral beam components.

FIG. 10 is a schematic of a Neutral Beam processing apparatus 960 according to an embodiment of the invention, wherein the ionizer 122 operates at a negative potential VR and wherein the workpiece operates at ground potential. An acceleration electrode 948 extracts gas cluster ions from ionizer exit aperture 126 and accelerates the gas cluster ions toward a potential of VAcc provided by acceleration power supply 944 to form a GCIB 128. The resulting GCIB 128 is accelerated by a potential VAcc-VR. A ground electrode 962 decelerates the ionized portion 958 of the GCIB 128 and returns it to the acceleration electrode 948.

Figure 11:
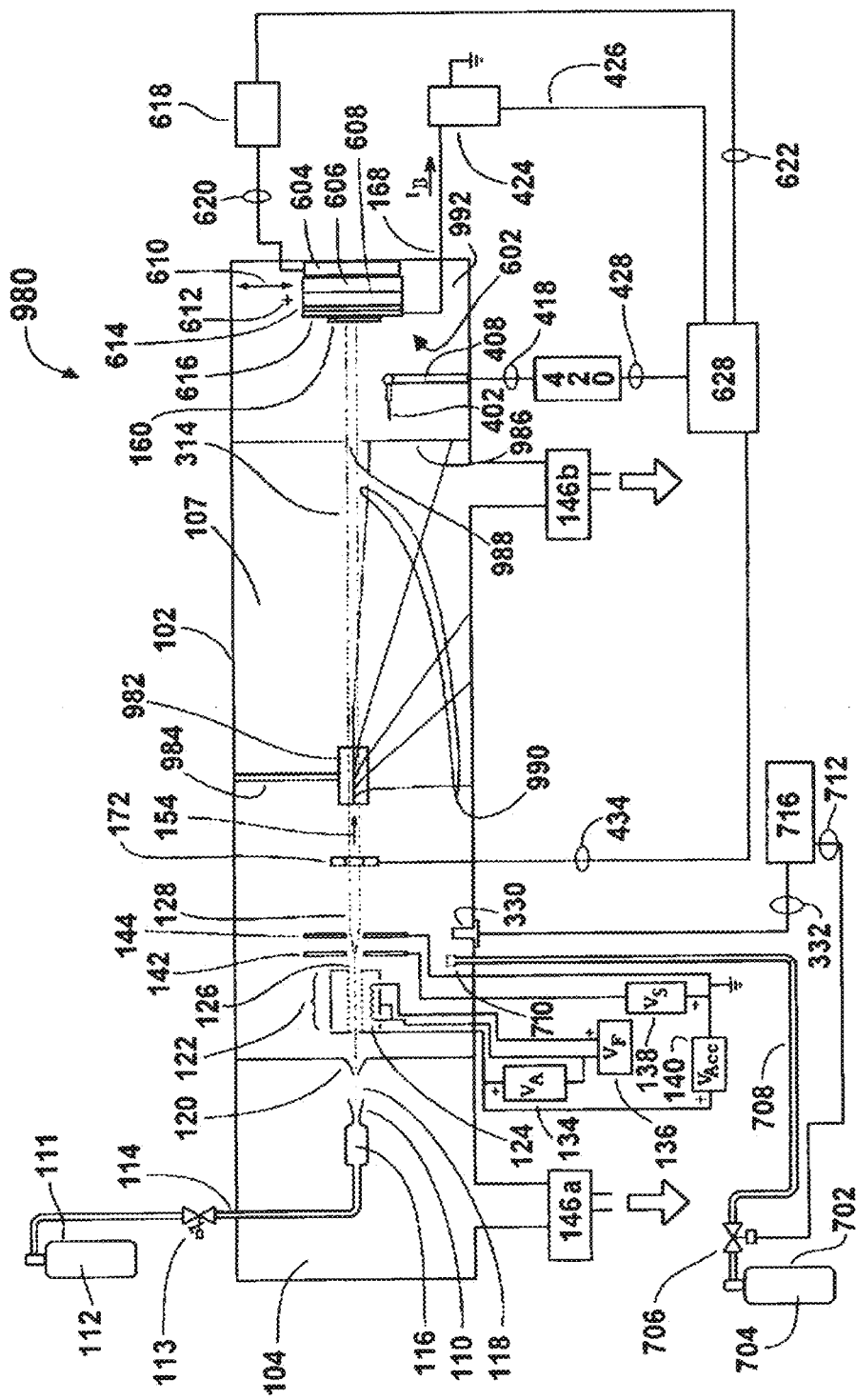
FIG. 11 is a schematic of a Neutral Beam processing apparatus according to an embodiment of the invention wherein magnetic separation is employed.

FIG. 11 is a schematic of a Neutral Beam processing apparatus 980 according to an embodiment of the invention. This embodiment is similar to that shown in FIG. 7, except that the separation of the charged beam components from the neutral beam components is done by means of a magnetic field, rather than an electrostatic field. Referring again to FIG. 11, a magnetic analyzer 982 has magnetic pole faces separated by a gap in which a magnetic B-field is present. Support 984 disposes the magnetic analyzer 982 relative to the GCIB 128 such that the GCIB 128 enters the gap of the magnetic analyzer 982 such that the vector of the B-field is transverse to the axis 154 of the GCIB 128. The ionized portion 990 of the GCIB 128 is deflected by the magnetic analyzer 982. A baffle 986 with a Neutral Beam aperture 988 is disposed with respect to the axis 154 so that the Neutral Beam 314 can pass through the Neutral Beam aperture 988 to the workpiece 160. The ionized portion 990 of the GCIB 128 strikes the baffle 986 and/or the walls of the low-pressure vessel 102 where it dissociates to gas that is pumped away by the vacuum pump 146b.

Figure 12A:
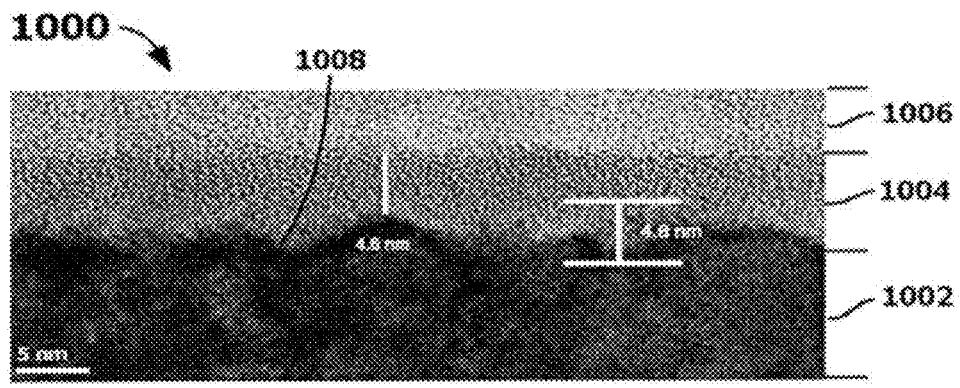
FIGS. 12A, 12B, and 12C are TEM images illustrating the superior interfaces produced when using Neutral Beam embodiments of the invention as compared to gas cluster ion beams.
Figure 12B:
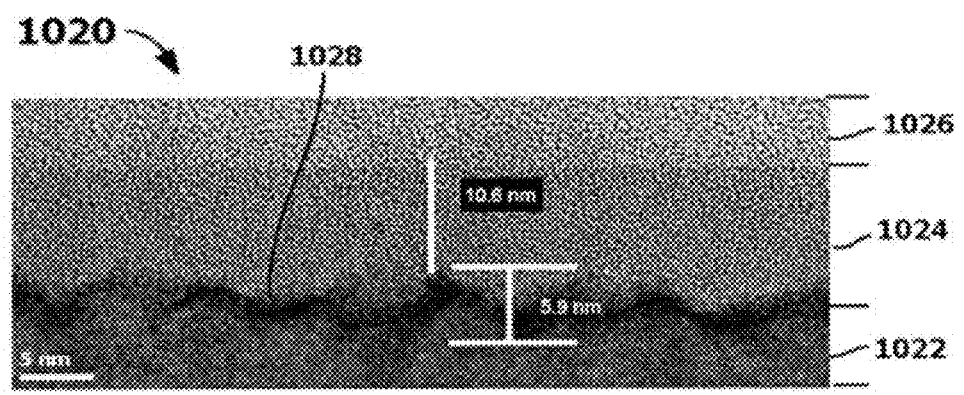
Figure 12C:
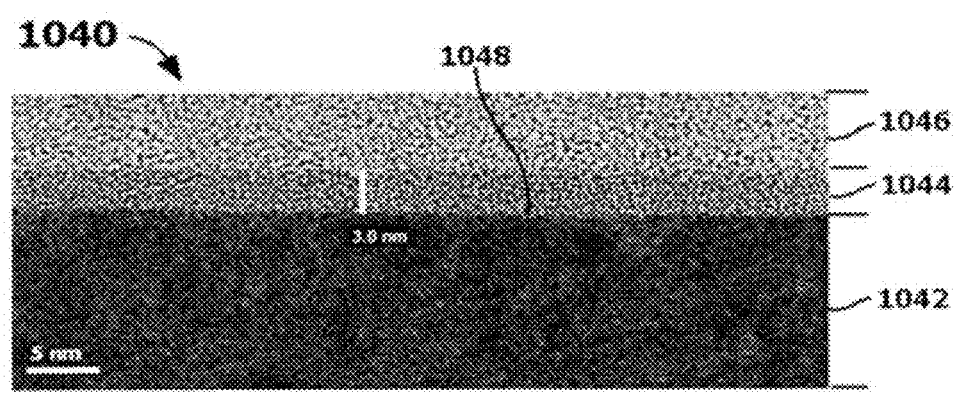

FIGS. 12A through 12C show the comparative effects of full and charge separated beams on a gold thin film. In an experimental setup, a gold film deposited on a silicon substrate was processed by a full GCIB (charged and neutral components), a Neutral Beam (charged components deflected out of the beam), and a deflected beam comprising only charged components. All three conditions are derived from the same initial GCIB, a 30 kV accelerated Ar GCIB. Gas target thickness for the beam path after acceleration was approximately $2 \times 10^{14}$ argon gas atoms per cm2. For each of the three beams, exposures were matched to the total energy carried by the full beam (charged plus neutral) at an ion dose of $2 \times 10^{15}$ gas cluster ions per cm2. Energy flux rates of each beam were measured using a thermal sensor and process durations were adjusted to ensure that each sample received the same total thermal energy dose equivalent to that of the full (charged plus neutral) GCIB dose.

To further illustrate the ability of an accelerated Neutral Beam derived from an accelerated GCIB to aid in attachment of a drug to a surface and to provide drug modification in such a way that it results in delayed drug elution, an additional test was performed. Silicon coupons approximately 1 cm by 1 cm (1 cm2) were prepared from highly polished clean semiconductor-quality silicon wafers for use as drug deposition substrates. A solution of the drug Rapamycin (Catalog number R-5000, LC Laboratories, Woburn, Mass. 01801, USA) was formed by dissolving 500 mg of Rapamycin in 20 ml of acetone. A pipette was then used to dispense approximately 5 micro-liter droplets of the drug solution onto each coupon.

Following atmospheric evaporation and vacuum drying of the solution, this left approximately 5 mm diameter circular Rapamycin deposits on each of the silicon coupons. Coupons were divided into groups and either left un-irradiated (controls) or irradiated with various conditions of Neutral Beam irradiation. The groups were then placed in individual baths (bath per coupon) of human plasma for 4.5 hours to allow elution of the drug into the plasma. After 4.5 hours, the coupons were removed from the plasma baths, rinsed in deionized water and vacuum dried. Weight measurements were made at the following stages in the process: 1) pre-deposition clean silicon coupon weight; 2) following deposition and drying, weight of coupon plus deposited drug; 3) post-irradiation weight; and 4) post plasma-elution and vacuum drying weight. Thus, for each coupon the following information is available: 1) initial weight of the deposited drug load on each coupon; 2) the weight of drug lost during irradiation of each coupon; and 3) the weight of drug lost during plasma elution for each coupon. For each irradiated coupon it was confirmed that drug loss during irradiation was negligible. Drug loss during elution in human plasma is shown in Table 1. The groups were as follows: Control Group—no irradiation was performed; Group 1—irradiated with a Neutral Beam derived from a GCIB accelerated with a VAcc of 30 kV. The Group 1 irradiated beam energy dose was equivalent to that of a 30 kV accelerated, $5 \times 10^{14}$ gas cluster ion per cm2 dose (energy equivalence determined by beam thermal energy flux sensor); Group 2—irradiated with a Neutral Beam derived from a GCIB accelerated with a VAcc of 30 kV. The Group 2 irradiated beam energy dose was equivalent to that of a 30 kV accelerated, $1 \times 10^{14}$ gas cluster ion per cm2 dose (energy equivalence determined by beam thermal energy flux sensor); and Group 3—irradiated with a Neutral Beam derived from a GCIB accelerated with a VAcc of 25 kV. The Group 3 irradiated beam energy dose was equivalent to that of a 25 kV accelerated, $5 \times 10^{14}$ gas cluster ion per cm2 dose (energy equivalence determined by beam thermal energy flux sensor).

that for each of the Neutral Beam irradiated Groups 1 through 3, relative to the Control Group, the difference in the drug retention following elution in human plasma was statistically significant.

FIGS. 12A through 12C show the comparative effects of full beam (charged plus uncharged components) and charge separated beam on a single crystal silicon wafer as may be typically employed in semiconductor applications. The silicon substrate had an initial native oxide layer of approximately 1.3 nm In separate instances, the silicon substrate was processed using a full GCIB (charged and neutral components), a Neutral Beam derived from a GCIB (charged components removed from the beam by deflection), and a charged cluster beam comprising only the charged components of a GCIB following their separation from the neutral components. All three conditions were derived from the same initial GCIB conditions, a 30 kV accelerated GCIB formed from a mixture of 98% Ar with 2% O2. For each of the three beams, irradiated doses were matched to the total energy carried by the full beam (charged plus neutral) at an ion dose of $2 \times 10^{15}$ gas cluster ions per cm2. Energy flux rates of each beam were measured using a thermal sensor and process durations were adjusted to ensure that each sample received the same total thermal energy dose equivalent to that of the full (charged plus neutral) GCIB. The three samples were evaluated by sectioning followed by imaging by transmission electron microscopy (TEM).

FIG. 12A is a TEM image 1000 of a section of a silicon substrate irradiated by the full GCIB (charged and neutral beam components). The irradiation was incident on the silicon substrate from the direction of the top of the image toward the bottom of the image. Prior to sectioning for TEM imaging, the top surface (irradiated surface) of the silicon substrate was coated with an epoxy overcoat to facilitate the sectioning operation and to avoid damage to the substrate during the sectioning process. In the TEM image 1000, the epoxy overcoat 1006 is seen at the top of the image. The irradiation formed an amorphous region 1004 comprising silicon and oxygen having a minimum thickness of approximately 4.6 nm A rough interface 1008 having a peak-to-peak variation of approximately 4.8 nm was formed between the

TABLE 1

| Group [Dose] {VAcc} Coupon # | Control | | Group 1 [5X 1Q14] {30 kV} | | | | Group 2 [1X 1Q14] {30 kV} | | | Group 3 [5X 1Q14] {25 kV} | | |
|---|---|---|---|---|---|---|---|---|---|---|---|---|
| | Start Load (ua) | Elution Loss (ua) | Elution Loss % | Start oad (uq) | Elution Loss (ua) | Elution Loss | Start Load (ual) | Elution oss (uq) | Loss | Start Load (uq) | Elution Loss (ua) | Elution Loss % |
| 1 | 83 | 60 | 2 | 8 | 4 | | 93 | 10 | 11 | 88 | — | 0 |
| 2 | 87 | 55 | 3 | 100 | 7 | | 102 | 16 | 16 | 82 | 5 | 6 |
| 3 | 88 | 61 | 69 | 83 | 2 | | 81 | 5 | 43 | 93 | 1 | 1 |
| 4 | 96 | 72 | 75 | — | — | | 93 | 7 | 8 | 84 | 3 | 4 |
| Mean | 89 | 62 | 70 | 90 | 4 | | 92 | 17 | 19 | 87 | 2 | 3 |
| a | 5 | 7 | | | 3 | | 9 | 13 | | | 2 | |
| p value | | | | | | 0.00048 | | | 0.014 | | | 0.00003 |

Table 1 shows that for every case of Neutral Beam irradiation (Groups 1 through 3), the drug lost during a 4.5-hour elution into human plasma was much lower than for the un-irradiated Control Group. This indicates that the Neutral Beam irradiation results in better drug adhesion and/or reduced elution rate as compared to the un-irradiated drug. The p values (heterogeneous unpaired T-test) indicate amorphous egion 1004 and the underlying single crystalline silicon 1002, as a result of the irradiation process.

FIG. 12B is a TEM image 1020 of a section of a silicon substrate irradiated by the separated charged component of the GCIB (charged portion only). The irradiation was incident on the silicon substrate from the direction of the top of the image toward the bottom of the image. Prior to sectioning for TEM imaging, the top surface (irradiated surface) of the silicon substrate was coated with an epoxy overcoat to facilitate the sectioning operation and to avoid damage to the substrate during the sectioning process. In the TEM image 1020, the epoxy overcoat 1026 is seen at the top of the image. The irradiation formed an amorphous region 1024 comprising silicon and oxygen having a minimum thickness of approximately 10.6 nm A rough interface 1028 having a peak-to-peak variation of approximately 5.9 nm was formed between the amorphous region 1024 and the underlying single crystalline silicon 1022, as a result of the irradiation process.

FIG. 12C is a TEM image 1040 of a section of a silicon substrate irradiated by the neutral portion (charged components separated by deflection and discarded). The irradiation was incident on the silicon substrate from the direction of the top of the image toward the bottom of the image. Prior to sectioning for TEM imaging, the top surface (irradiated surface) of the silicon substrate was coated with an epoxy overcoat to facilitate the sectioning operation and to avoid damage to the substrate during the sectioning process. In the TEM image 1040, the epoxy overcoat 1046 is seen at the top of the image. The irradiation formed an amorphous region 1044 comprising silicon and oxygen having a substantially uniform thickness of approximately 3.0 nm A smooth interface 1048 having a peak-to-peak variation on an atomic scale was formed between the amorphous region 1044 and the underlying single crystalline silicon 1042, as a result of the irradiation process.

The results of processing shown in FIGS. 12A through 12C indicate that in semiconductor applications, the use of an accelerated Neutral Beam derived from accelerated GCIB by charge separation results in superior interfaces between the irradiation processed and unprocessed regions as compared to either a full GCIB or only the charged portion of a GCIB. The data also shows that a smooth uniform oxide film can be formed on silicon using a Neutral Beam derived from a GCIB and that such film is free of the rough interface often associated with the use of conventional GCIB. Without wishing to be bound to a particular theory, it is believed that the improvement likely results from the elimination of intermediate size clusters or from the elimination of all or most clusters from the beam.

Figure 13:
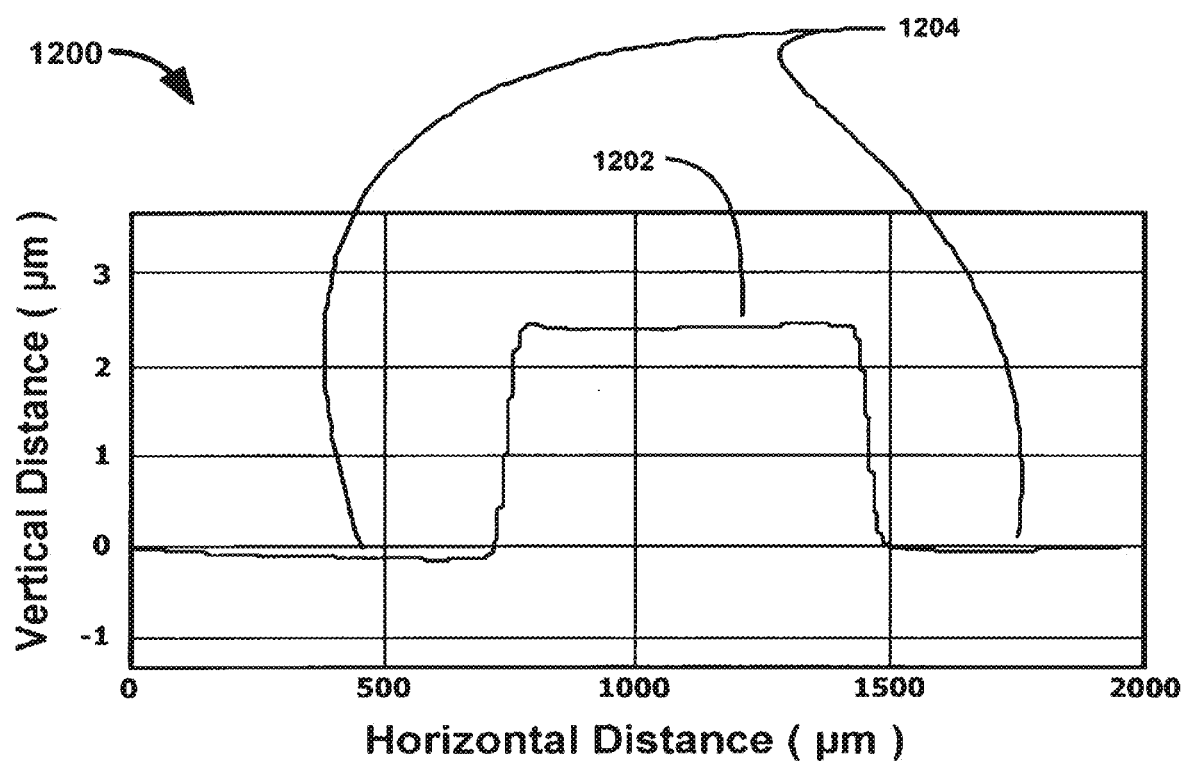
FIG. 13 is a graph illustrating the etching of SiO2 and Si using an embodiment of the invention.

FIG. 13 illustrates a depth profile measurement graph 1200 obtained after using an accelerated Neutral Beam derived from a GCIB to etch a silicon dioxide ($SiO_2$) film on a silicon substrate and to etch the silicon substrate. Using apparatus similar to that shown in FIG. 4, a 30 kV accelerated GCIB was formed using argon. Stagnation chamber pressure was 28 psi ($1.93 \times 10^5$ pascal), nozzle flow was 200 standard cm3/minute (3.3 standard cm3/sec). Full beam current (charged plus neutral components prior to separation by deflection was approximately 0.50 microA (µA). The argon gas target thickness for the region between the accelerator and the workpiece was approximately $1.49 \times 10^{14}$ argon gas monomers/cm2, and the accelerated Neutral Beam was observed to consist essentially of fully dissociated neutral monomers at the target. Using electrostatic deflection all charged particles were deflected away from the beam axis and out of the beam, forming a Neutral Beam. Thus the Neutral Beam was essentially an accelerated neutral argon monomer beam Dosimetry was done using a thermal sensor to calibrate the total Neutral Beam dose delivered to the silicon substrate such that a Neutral Beam deposited energy equivalent to that energy which would be deposited by a $2.16 \times 10^{16}$ gas cluster ions/cm2 irradiation dose by an accelerated (30 kV) GCM including both the charged and uncharged particles (without neutralization by charge separation). A silicon dioxide ($SiO_2$) film (approximately 0.5 micron [µm] thick) on a silicon substrate was partially masked with a narrow (approximately 0.7 mm wide) strip of polyimide film tape and then irradiated with the accelerated Neutral Beam. Following the irradiation the polyimide tape was removed. Referring again to FIG. 13, the depth profile measurement graph 1200 was generated using a TENCOR Alpha-Step 250 profilometer to measure the step profile, in a direction along the surface of the SiO2 film (on silicon substrate) and across the region masked by the polyimide film tape, due to the etching resulting from the accelerated Neutral Beam Plateau 1202 represents the unetched surface of the SiO2 film beneath the polyimide film (after film removal and cleaning), while the regions 1204 represent the etched portion. The accelerated Neutral Beam produced an etch depth of approximately 2.4 microns (µm), etching all the way through the 0.5 micron SiO2 film and an additional 1.9 microns into the underlying crystalline silicon substrate, producing the step shown in depth profile measurement graph 1200. Argon and other inert gases may be used as source gases to etch by physical means. By using a reactive source gas or using a source gas incorporating a reactive gas in a mixture, reactive etching can also be performed using a Neutral Beam. Typical reactive gases that may be used alone or in mixture with inert gases are (without limitation) oxygen (O2), carbon dioxide (CO2), nitrogen (N2), ammonia (NH3), fluorine (F2), chlorine (Ch), sulfur hexafluoride (SF6), tetrafluoromethane (CF4), and other condensable halogen-containing gases.

Figure 14A:
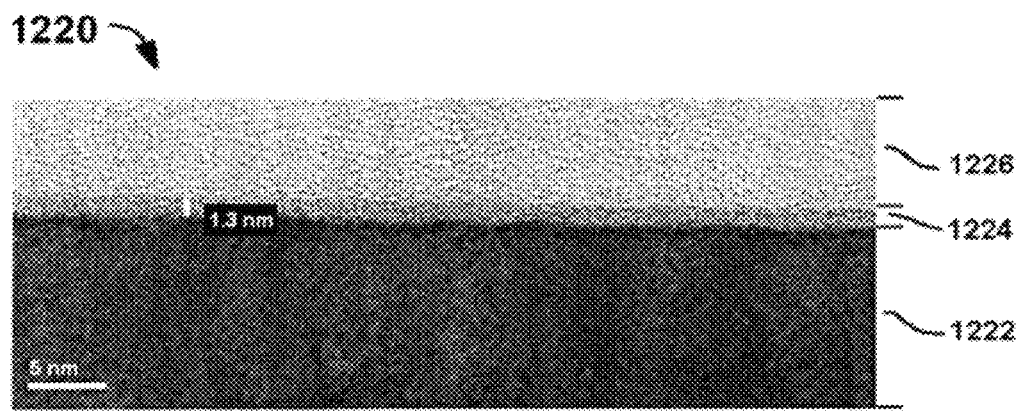
FIGS. 14A and 14B are TEM images illustrating the use of embodiments of the invention in forming amorphous layers in semiconductor materials.
Figure 14B:
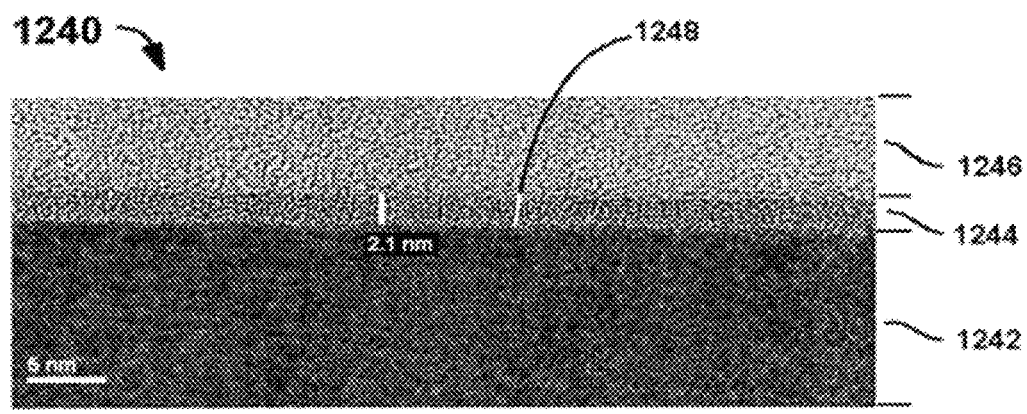

FIGS. 14A and 14B are TEM images illustrating production of amorphous layers in crystalline semiconductor material by irradiating with accelerated Neutral Beams derived from GCIBs. Prior to sectioning for TEM imaging, the top surface of each sample was coated with an epoxy overcoat to facilitate the sectioning operation and to avoid damage to the surface during the sectioning process. Native oxide forms spontaneously in air or water when bare silicon is exposed.

FIG. 14A is a TEM image 1220 of a section of a silicon substrate with a film of native $SiO_2$. In the TEM image 1220, the epoxy overcoat 1226 is seen at the top of the image. A thin (approximately 1.3 nm) native oxide film 1224 is seen on the underlying silicon substrate 1222.

FIG. 14B is a TEM image 1240 showing results of irradiation of a silicon substrate by an accelerated argon Neutral Beam derived from a GCIB. A silicon wafer having a native oxide film similar to that shown in FIG. 14A was cleaned in 1% aqueous solution of hydrofluoric acid to remove the native oxide. The cleaned silicon substrate was irradiated using a Neutral Beam derived from a 30 kV accelerated GCIB (charged components removed from the beam by deflection) formed from argon. The irradiated dose was matched in energy to the total energy carried by a full beam (charged plus neutral) at an ion dose of $5 \times 10^{14}$ gas-cluster ions per cm2 by using a thermal sensor to match the total energy deposited by the Neutral Beam to that of the full $5 \times 10^{14}$ gas-cluster ions per cm2 beam Referring again to FIG. 14B, the TEM image 1240 shows the epoxy overcoat 1246, a 2.1 nm thick amorphous film 1244 in the surface of the silicon formed by the accelerated Neutral Beam irradiation, overlying the crystalline silicon substrate material 1242. A smooth interface 1248 having a peak-to-peak variation on an atomic scale was formed between the amorphous film 1244 and the underlying crystalline silicon material 1242, as a result of the irradiation process. This shows that the noble gas, argon (Ar), may be employed to form an amorphous layer in a crystalline semiconductor material. Some other gases (without limitation) that may be used to form amorphous layers by employing them in formation of accelerated Neutral Beams for embodiments of the invention include, xenon (Xe), germane (GeH4), and germanium tetrafluoride (GeF4). Such source gases may be used alone or in mixtures with argon or other noble gases. In FIG. 14B, the lead line connecting the numeric designator 1248 to its object changes color to maintain contrast on regions in the figure having differing backgrounds.

Figure 15A:
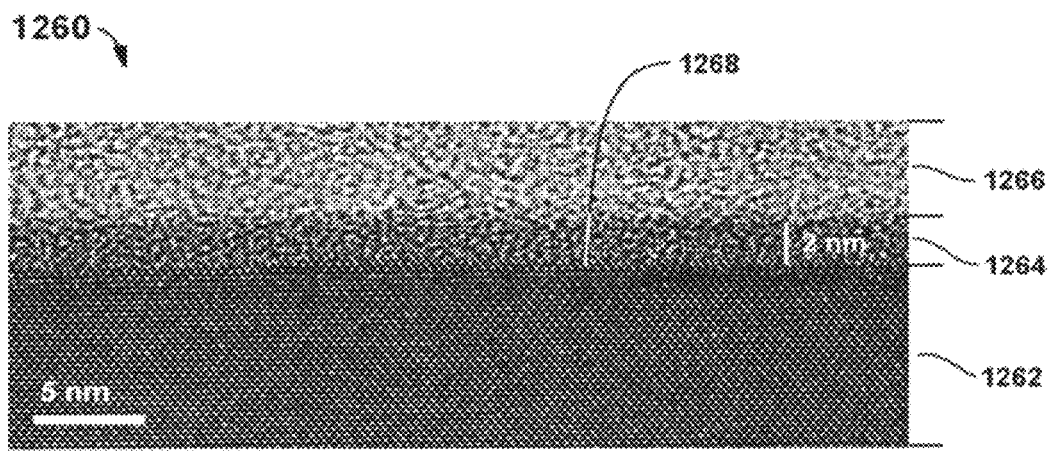
FIGS. 15A and 15B are TEM images illustrating the application of accelerated Neutral Beams derived from GCIBs for forming films in semiconductors.
Figure 15B:
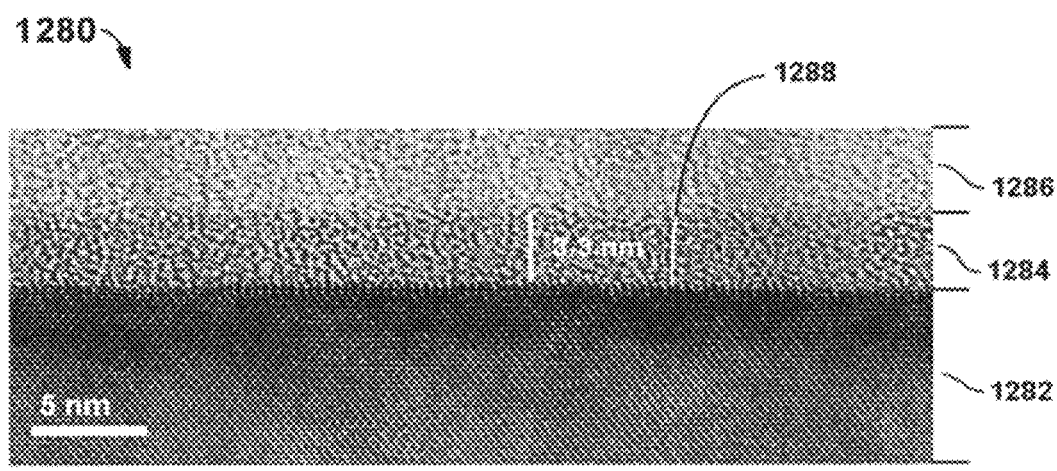

FIGS. 15A and 15B are TEM images illustrating the growth of an oxide film on silicon by the use of accelerated Neutral Beams derived from GCIBs. Prior to sectioning for TEM imaging, the top surface of each sample was coated with an epoxy overcoat to facilitate the sectioning operation and to avoid damage to the surface during the sectioning process.

FIG. 15A is a TEM image 1260 showing results of irradiation of a silicon substrate by an accelerated Neutral Beam derived from a GCIB. A silicon wafer having a native oxide film similar to that shown in FIG. 14A was cleaned in 1% aqueous solution of hydrofluoric acid to remove the native oxide. The cleaned, bare silicon substrate was then irradiated using a Neutral Beam derived from a 30 kV accelerated GCIB (charged components removed from the beam by deflection) formed from a source gas mixture of 98% Ar with 2% O2. The irradiated Neutral Beam dose was energetically equivalent (energy equivalence determined by beam thermal energy flux sensor) to a 30 kV accelerated GCIB at an ion dose of $2.4 \times 10^{13}$ gas cluster ions per cm2. Referring again to FIG. 15A, the TEM image 1260 shows the epoxy overcoat 1266, a 2 nm thick oxide film 1264 in the surface of the silicon formed by the accelerated Neutral Beam irradiation, overlying the crystalline silicon substrate material 1262. A smooth interface 1268 having a peak-to-peak variation on an atomic scale was formed between the oxide film 1264 and the underlying crystalline silicon material 1262, as a result of the irradiation process. In FIG. 15A, the lead line connecting the numeric designator 1268 to its object changes color to maintain contrast on regions in the figure having differing backgrounds.

FIG. 15B is a TEM image 1280 showing results of irradiation of a silicon substrate by an accelerated Neutral Beam derived from a GCIB. A silicon wafer having a native oxide film similar to that shown in FIG. 14A was cleaned in 1% aqueous solution of hydrofluoric acid to remove the native oxide. The cleaned, bare silicon substrate was then irradiated using a Neutral Beam derived from a 30 kV accelerated GCIB (charged components removed from the beam by deflection) formed from a source gas mixture of 98% Ar with 2% O2. The irradiated Neutral Beam dose was energetically equivalent (energy equivalence determined by beam thermal energy flux sensor) to a 30 kV accelerated GCIB at an ion dose of $4.7 \times 10^{14}$ gas cluster ions per cm2. Referring again to FIG. 15B, the TEM image 1280 shows the epoxy overcoat 1286, a 3.3 nm thick oxide film 1284 in the surface of the silicon formed by the accelerated Neutral Beam irradiation, overlying the crystalline silicon substrate material 1282. A smooth interface 1288 having a peak-to-peak variation on an atomic scale was formed between the oxide film 1284 and the underlying crystalline silicon material 1282, as a result of the irradiation process. This shows that a Neutral Beam comprising oxygen may be employed to form an oxide layer at the surface of a semiconductor material. The thickness of the film grown may be varied by varying the irradiated dose. By using source gases comprising other reactive species in forming the accelerated Neutral Beam, other types of films may be grown on semiconductor or other surfaces, for examples (without limitation), oxygen (O2), nitrogen (N2), or ammonia (NH3), alone or in mixture with argon (Ar) or other noble gas may be employed. In FIG. 15B, the lead line connecting the numeric designator 1288 to its object changes color to maintain contrast on regions in the figure having differing backgrounds.

Figure 16:
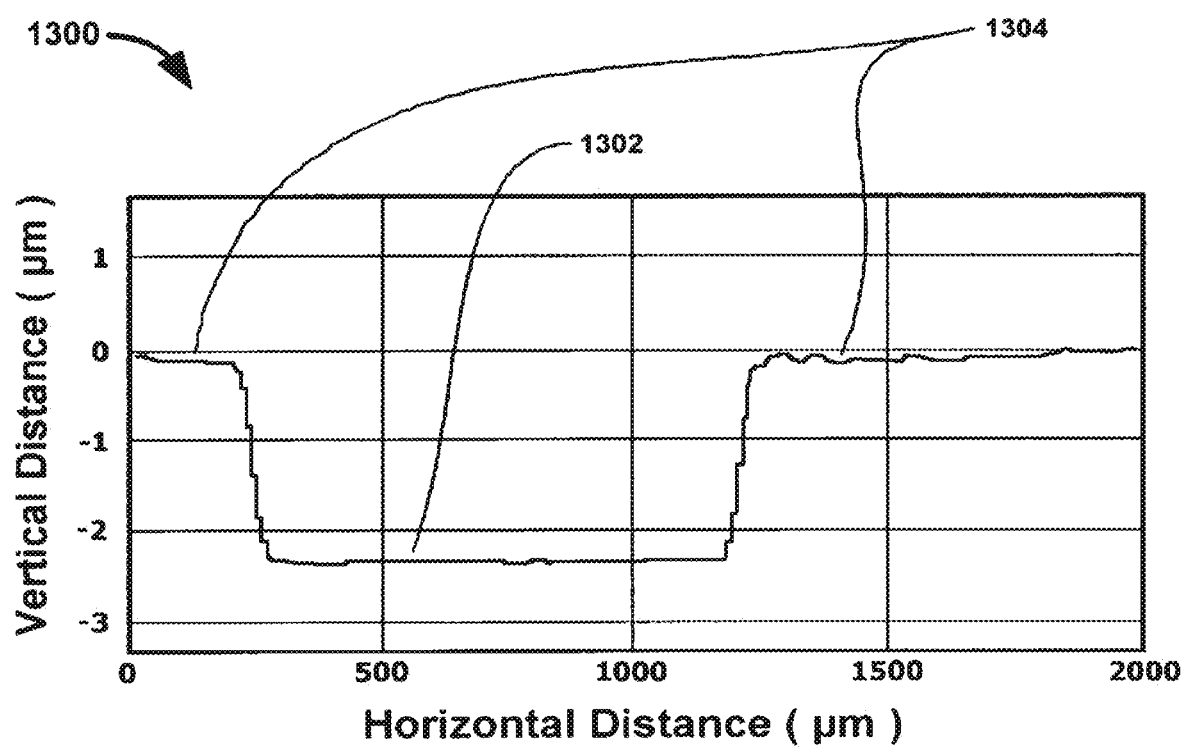
FIG. 16 is a graph illustrating the deposition of a diamond-like carbon film on a silicon substrate using an accelerated Neutral Beam derived from an accelerated GCIB.

FIG. 16 illustrates a depth profile measurement graph 1300 obtained after using an accelerated Neutral Beam derived from a GCIB to deposit a diamond-like carbon film on a silicon substrate. Using apparatus similar to that shown in FIG. 4, a 30 kV accelerated GCIB was formed using a source gas mixture of 10% methane (CH4) with 90% argon. The accelerated Neutral Beam was observed to consist essentially of fully dissociated neutral monomers at the target. Using electrostatic deflection all charged particles were deflected away from the beam axis and out of the beam, forming a neutral methane/argon beam Thus the Neutral Beam was essentially an accelerated neutral methane/argon monomer beam Dosimetry was done using a thermal sensor to calibrate the total Neutral Beam delivered to the silicon substrate such that the Neutral Beam deposited energy equivalent to that energy which would be deposited by a 2.8 microA gas cluster ions/cm2 irradiation dose by an accelerated (30 kV) GCIB, including both the charged and uncharged particles (without neutralization by charge separation). A silicon substrate was partially masked with a narrow (approximately 1 mm wide) strip of polyimide film tape and then the substrate and mask were irradiated with the accelerated Neutral Beam for 30 minutes, depositing a diamond-like carbon film Following irradiation the mask was removed. Referring again to FIG. 16, the depth profile measurement graph 1300 was generated using a TENCOR Alpha-Step 250 profilometer to measure the step profile, in a direction along the surface of the silicon substrate and across the region masked by the polyimide film tape, due to the deposition resulting from the accelerated Neutral Beam Flat region 1302 represents the original surface of the silicon substrate beneath the polyimide film (after film removal and cleaning), while the regions 1304 represent the deposited diamond-like carbon portion. The accelerated Neutral Beam produced a deposition thickness of approximately 2.2 microns (µm), producing the step shown in depth profile measurement graph 1300. The deposition rate was approximately 0.45 nm/sec for each microA/cm2 of GCIB current (the energetic equivalent, as determined by thermal sensor as mentioned above in this paragraph). In other tests, 5% mixture and 7.5% mixtures of CH4 in argon, gave similar results, but with lower deposition rates resulting from lower CH4 percentage in the source gas. Selection of gas mixture and dose permit repeatable deposition of films with predetermined thicknesses. CH4, alone or in mixture with argon or other noble gas is an effective source gas for depositing carbon using an accelerated neutral monomer beam Other typical gases that may be used alone or in mixture with inert gases for film deposition using accelerated neutral monomer beams are (without limitation) germane (GeH4), germanium tetrafluoride (GeF4), silane (SiH4), and silicon tetrafluoride (SiF4).

A further application that benefits from Neutral Beam processing is related to the formation of a SiC or SiCx ($0.05 < X < 3$) layer on a silicon substrate for providing a surface that is harder, that is more heat resistant, that is less damage prone, that is more refractory, that has improved chemical properties, that has different lattice constants, that may serve as a base for subsequent layer growth, that may serve as a substrate for deposition of subsequent material (lattice matching or improved bonding), to serve as a silicon-carbide semiconductor layer on a silicon substrate or to otherwise improve the silicon substrate.

FIG. 17A is a schematic 1500 showing a silicon substrate 1502, which may be a single crystal silicon substrate and may be of high purity as is used for semiconductor manufacturing. The thickness of the silicon substrate 1502 is not necessarily shown to scale. Neutral Beams have penetration characteristics dependent on the beam source materials, the beam acceleration potentials used, and the range of sizes of any clusters present in the beam (though in a fully dissociated Neutral Beam, clusters are not present). Dissociated Neutral Beams may, for example, have penetration depths into a typical optical coating material on the order of from about 1 to 3 nm, while Neutral Beams containing clusters may have penetration depths on the order of from about 2 to 20 nm (dependent on the target material and beam parameters.)

FIG. 17B is a schematic 1510 showing irradiation of the silicon substrate 1502 with a beam 1512, which is a Neutral Beam (preferably a Dissociated Neutral Beam The beam 1512 characteristics (including acceleration potential and dose and source gas) are selected so that it penetrates the silicon substrate 1502 a predetermined desired depth so that it implants a quantity of carbon atoms appropriate to make the C:Si ratio in the implanted region between about 0.05 to about 3 carbon atoms per silicon atom A carbon-containing source gas (preferably methane) is used to provide carbon atoms in the beam The implantation forms an implanted layer (which may be amorphous) having the desired thickness and carbon:silicon atomic ratio. The preferred range for irradiated Neutral Beam dose and acceleration potential is, for example, about $1 \times 10^{14}$ to about $5 \times 10^{16}$ carbon atoms per cm2 (for a beam comprising neutral methane clusters and/or monomers) formed from gas-cluster ions accelerated using 5 to 50 kV acceleration potential prior to forming the Neutral Beam or Dissociated Neutral Beam from the gas-cluster ions.

Figure 17C:
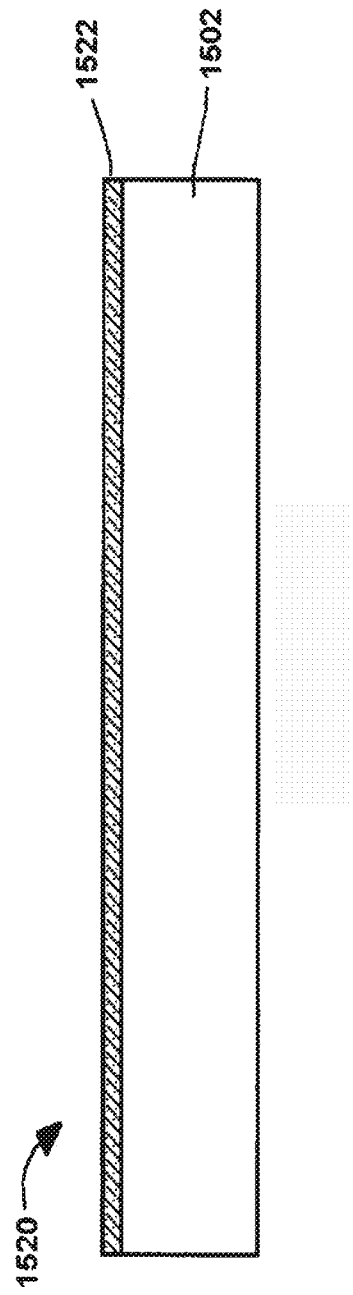

FIG. 17C is a schematic 1520 showing the structure which results from the irradiation described above. Interaction of the beam with the surface of the silicon substrate 1502 implants carbon and hydrogen atoms into the silicon substrate 1502, forming implanted layer 1522, wherein the atoms of the carbon and the silicon substrate 1502 are mixed. The hydrogen atoms from the beam are volatile and escape the implanted layer, leaving carbon and silicon atoms in the layer. The implanted layer will be disrupted by the carbon atoms and may be amorphous if the carbon:silicon ratio is sufficiently high.

Figure 17D:
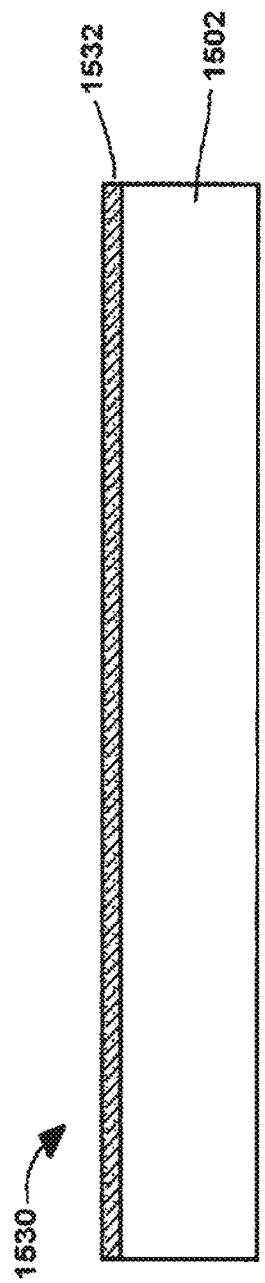

FIG. 17D is a schematic 1530 illustrating the effect of heat treatment (annealing) on the implanted layer 1522 (FIG. 17C) following a heat-treating step. The heat treating is preferably in an argon atmosphere or other inert atmosphere using a furnace or radiant heating apparatus capable of providing sufficient temperature-time treatment (according to known techniques) to anneal the implantation damage and move the implanted carbon to lattice substitutional sites. The annealed heat-treated layer 1532 is restored to a substantially crystalline form. A further application that benefits from Neutral Beam processing is also related to the \formation of a SiC or SiCx (0.05<X<3) layer on a silicon substrate for practical method for resist-less lithography as may be applied in the course of fabricating silicon devices or with other materials and processes that utilize lithography for transferring patterns in the course of fabrication a device and which are hardened by forming a carbide surface (especially for microfabrication with a limited heat budget). FIGS. 18A, 18B, 18C, 18D, 18E, 18F, and 18G are schematics that show steps in processes for using an accelerated Neutral Beam derived from a GCIB to form a hard mask pattern on a substrate without the use of photoresists as is required for advanced micro-fabrication of some devices.

FIG. 18A is a schematic 1600 showing (for example) a silicon substrate 1602, which may be a single crystal silicon substrate and may be of high purity as is used for semiconductor manufacturing or other micro-fabrication. The thickness of the silicon substrate 1602 is not necessarily shown to scale. A contact template 1604 is on and in contact with the silicon substrate 1602. The openings in the contact template 1604 carry a pattern that it is desired to transfer to the substrate 1602 for subsequent patterned processing of the substrate 1602.

FIG. 18B is a schematic 1610 showing irradiation of the silicon substrate 1602 with a beam 1612, which is a Neutral Beam (preferably a Dissociated Neutral Beam The beam 1612 characteristics (including acceleration potential and dose and source gas) are selected so that where it passes through openings in the contact template 1604 it penetrates the silicon substrate 1602 a predetermined desired depth so that it implants a quantity of carbon atoms appropriate to make the C:Si ratio in the implanted region between about 0.05 to about 3 carbon atoms per silicon atom (preferably about 0.5 to 1.5 carbon atoms per silicon atom). A carbon-containing source gas (preferably methane) is used to provide carbon atoms in the beam The implantation forms an implanted layer (which may be amorphous) having the desired thickness and carbon:silicon atomic ratio in patterned areas and/or regions 1614 on the silicon substrate 1602. The range for irradiated Neutral Beam dose and acceleration potential is, for example, about $1 \times 10^{14}$ to about $5 \times 10^{16}$ carbon atoms per cm2 (for a beam comprising neutral methane clusters and/or monomers) formed from gas-cluster ions accelerated using 5 to 50 kV acceleration potential prior to forming the Neutral Beam or Dissociated Neutral Beam from the gas-cluster ions. After formation of the carbon-containing patterned areas and/or regions 1614 on the silicon substrate 1602, the contact template 1604 is removed before additional processing.

FIG. 18C is a schematic 1620 showing an alternate arrangement for the pattern template. Rather than a contact template, a projection template 1622 is spaced away from the silicon substrate 1602 during irradiation of irradiation of the silicon substrate 1602 with the beam 1612. Neutral particles in the beam 1612 pass through the openings in the template 1622 and irradiate the silicon substrate 1602 to form implanted areas and/or regions 1614 where it passes through openings in the contact template 1604 when it penetrates the silicon substrate 1602 a predetermined desired depth so that it implants a quantity of carbon atoms appropriate to make the C:Si ratio in the implanted region between about 0.05 to about 3 carbon atoms per silicon atom (preferably about 0.5 to 1.5 carbon atoms per silicon atom). After formation of the carbon-containing patterned areas and/or regions 1614 on the silicon substrate 1602, the projection template 1622 is removed before additional processing.

Following formation of the carbon-containing patterned areas and or regions as illustrated in FIG. 18B or 18C, are used as an etching mask to control further processing of the substrate.

FIG. 18D is a schematic 1530 showing subsequent processing of the structure which results from the patterning illustrated in FIG. 18B or 18C above. A second beam, preferably a Neutral Beam or Dissociated Neutral Beam 1634 is used to etch the surface of the substrate, including both the areas and/or regions 1614 and the un-irradiated surfaces. The harder and/or denser areas and/or regions 1614 are more resistant to beam etching than the un-irradiated surfaces and the un-irradiated surfaces are etched preferentially (more rapidly) than the areas and/or regions 1614. Beam 1634 is preferably an argon Neutral Beam or Dissociated Neutral Beam having been formed from an argon GCM having had an acceleration of 10 to 70 kV prior to neutralization and separation. Such a beam has a differential etching rate for silicon and SiC that is typically about 10:1 or 20:1 dependent on neutral beam energy and the quality of the SiC. For 30 kV acceleration, the inventors have measured 16:1 and for 50 kV acceleration the inventors have measured about 8:1 (Si:SiCx etch rate). The etching by beam 1634 is controlled to create trenches 1632 in the silicon substrate 1602 while minimally etching the harder and/or denser areas and/or regions 1614, as illustrated in FIG. 18D.

FIG. 18E is a schematic 1640 illustrating an alternate etching technique to that illustrated in FIG. 18D. In FIG. 18E, the etching beam 1642 is controlled so as to completely etch away the harder and/or denser areas and/or regions 1614, leaving plateaus 1644 and trenches 1632, both of which have upper surfaces consisting of the pure substrate 1602 material. Although etching using an argon Neutral Beam or Dissociated Neutral Beam has been described, it is understood that any conventional etching method having a favorable differential etch rate for Si:SiC may be employed to form the trenches 1632.

FIG. 18F is a schematic 1650 illustrating a step of oxide formation following the trench etching. A conventional (preferably low temperature) method is used to form a silicon dioxide layer 1652 on the substrate 1602, overlying the plateaus 1644 and the trenches 1632. It is desirable, but not essential that the oxide 1652 thickness be only slightly thicker than the depth of the trenches 1632. Other materials than silicon dioxide may be employed, the requirement is that it be a non-contaminating material that will perform well as a hard mask for subsequent processing. Following oxide formation, the substrate surface is planarized using a conventional process such as CMP (chemical mechanical polishing).

FIG. 18G is a schematic 1660 illustrating the configuration following CMP planarization. Hard mask regions 1664 alternate with areas 1662 of exposed silicon substrate 1602 material in a surface planarized configuration. In some situations, where elevated silicon islands may be desirable, this may be the final step, with the silicon exposed for patterned subsequent processing. In other processes, it may be desirable that the upper silicon surface be planar with the bottoms of the hard mask regions 1664. In such cases additional etching is required.

FIG. 18H is a schematic 1670 illustrating the configuration following an additional etch step. A conventional etching step having a differential etching rate favorable to etching silicon faster than oxide is employed. Examples are plasma etching with for example Ch or CChFs or similar plasma materials. By controlling the etch end-point to coincide with the occurrence of planarization of the upper surface of the silicon substrate 1602, the surfaces 1672 of the silicon in the openings in the hard mask 1664 is made planar with the upper surface of the silicon substrate 1602, and the configuration illustrated is obtained.

As taught herein in connection with discussion of FIGS. 12A, 12B, 12C, 17, 14A and 14B, accelerated Neutral Beam (preferably a dissociated or fully dissociated Neutral Beam) can be employed to amorphize and/or oxidize shallow surface layers with exceptionally smooth interfacial regions between the treated and untreated layers. The treated layers are modified so as to become more susceptible to chemical etching using etching agents that otherwise are not highly active or are inactive for etching the untreated material. Thus a differential etching process is enabled that can remove material treated by the Neutral Beam but that can utilize the untreated material below the penetration depth of the Neutral Beam as an etch stop layer, permitting uniform, controllable shallow etching without significant undercutting or other directional etching effects. Argon or other inert gases may be used as the source gas for forming the accelerated GCIB from which the accelerated Neutral Beam is derived. The process is most effective at forming smooth interfacial zones between the irradiated and unirradiated regions of the substrate material when fully or essentially fully dissociated Neutral Beams (accelerated neutral monomer beams derived from a GCIB) are employed. It has generally been found beneficial by the inventors to incorporate oxygen in the Neutral Beam or to otherwise arrange a degree of oxidation into the Neutral Beam irradiated layer to facilitate a larger differential in the etch rate between the treated and untreated portions of the substrate material. The technique has been employed successfully for metal, semiconducting and dielectric substrate materials.

FIGS. 19A, 19B, 19C, 19D, and 19E are schematics that show steps in an embodiment of a process for using an accelerated Neutral Beam derived from a GCIB to form controlled ultra-shallow etched regions in materials as is required for advanced micro-fabrication of some devices.

Figure 19A:

FIG. 19A is a schematic 1700 of a substrate 1702 for controlled shallow etching.

Substrates of copper metal, silicon (semiconductor) and silicon nitride (SiN, a dielectric) have been tested with equally successful results.

Figure 19B:
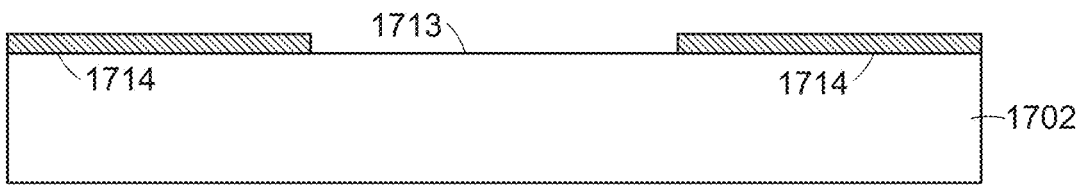

FIG. 19B is a schematic 1710 showing the substrate 1702 after an optional step of applying a mask 1714 to control beam exposure for patterned etching as is often required for microelectronic or micromechanical etching processes. The mask 1714 may be for example a photoresist or hard mask. Open region(s) 1713 of the substrate 1702 which are not covered by the mask 1714 are exposed for Neutral Beam irradiation and other processing.

Figure 19C:
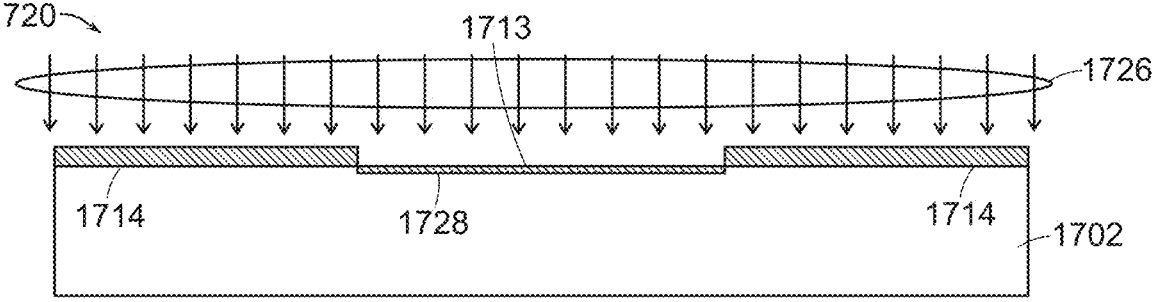

FIG. 19C is a schematic 1720 showing a step of irradiating the substrate 1702 through the open region(s) 1713 of the mask 1714 with a dissociated Neutral Beam 1726. In one exemplary case (not for limitation) the Neutral Beam was a fully dissociated neutral monomer beam formed from an accelerated GCIB accelerated through 10 kV potential, with a dose chosen to provide an modified layer 1728 of about 3 nm in thickness on the substrate 1702. The accelerating potential, selection of source gas for the GCIB used to form the Neutral Beam, and the irradiated dose all affect the depth of the modified layer 1728 and these parameters may readily be chosen by routine experimentation to provide the desired thickness of the modified layer 1728. Once chosen the results are repeatable. Experience has shown the inventors that incorporating oxygen in the beam in the range of from 1 to 20 atomic percent result in production of greater differential etching rates between the modified layer 1728 and the substrate 1702. In this example an argon plus oxygen mixture of approximately 5 atomic percent oxygen was employed for the GCIB source gas. Following this irradiation step, the surface is chemically etched. In the case of copper, silicon, and SiN substrates, for example, a 1% aqueous solution of hydrofluoric acid has been successfully employed, allowing the modified layer 1728 to be etched away until the process stops on the unmodified substrate 1702. Other concentrations of aqueous solutions of hydrofluoric acid and other etchants containing hydrofluoric acid are also known to be effective. The inventors understand that different chemical etchants may be employed on different substrate materials, using this same treatment method.

FIG. 19D is a schematic 1730 showing the etched substrate 1732 following the chemical etching completion. An ultra-shallow etched region 1734 has been formed in the etched substrate 1732. The depth of the ultra-shallow etched region 1734 has a thickness of 3 nm, the irradiation depth of the Neutral Beam The upper surface of the ultra-shallow etched region 1734 is extremely smooth having an average roughness, Ra, of about 8 angstroms (0.8 nm). The mask may be removed or stripped from the surface of the etched substrate 1732.

FIG. 19E is a schematic 1740 showing the finished etched substrate 1732 following stripping of the mask.

In this (above) example, an argon plus oxygen source gas was employed. Argon alone or another inert gas also has been shown to be effective in the process, but incorporation of oxygen into the modified layer typically provides a greater differential etch rate between modified layer and unmodified substrate for many materials.

FIGS. 20A, 20B, 20C, 20D, 20E, and 20F are schematics that show steps in an alternate embodiment of a process for using an accelerated Neutral Beam derived from a GCIB to form controlled ultra-shallow etched regions in materials as is required for advanced micro-fabrication of some devices. The process uses direct oxidation of the Neutral Beam irradiated region.

FIG. 20A is a schematic 1800 of a substrate 1802 for controlled shallow etching.

Substrates of copper metal, silicon (semiconductor) and silicon nitride (SiN) have been tested with equally successful results.

FIG. 20B is a schematic 1810 showing the substrate 1802 after an optional step of applying a mask 1814 to control beam exposure for patterned etching as is often required for microelectronic or micromechanical etching processes. The mask 1814 may be for example a photoresist or hard mask. Open region(s) 1812 of the substrate 1802 which are not covered by the mask 1814 are exposed for Neutral Beam irradiation and other processing.

FIG. 20C is a schematic 1820 showing a step of irradiating the substrate 1802 through the open region(s) 1812 of the mask 1814 with a dissociated Neutral Beam 1826. In one exemplary case (not for limitation) the Neutral Beam was a fully dissociated neutral argon monomer beam formed from an accelerated GCIB accelerated through 10 kV potential, with a dose chosen to provide an modified layer 1828 of about 3 nm in thickness on the substrate 1802. The accelerating potential, selection of source gas for the GCIB used to form the Neutral Beam, and the irradiated dose all affect the depth of the modified layer 1828 and these parameters may readily be chosen by routine experimentation to provide the desired thickness of the modified layer 1828. Once chosen the results are repeatable. Experience has shown the inventors that incorporating oxygen into the modified layer 1828 results in production of greater differential etching rates between the modified layer 1828 and the substrate 1802.

FIG. 20D is a schematic 1830 showing the formation of an oxidized modified layer 1838 formed exposure of the by argon Neutral Beam irradiated to an oxidizing atmosphere 1832. Since the modified layer 1828 is very shallow it is readily oxidized by exposure to an oxygen containing mixture of gas. The oxidizing atmosphere may be normal earth atmosphere or may be a mixture of an inert gas such as argon and oxygen. Oxygen mixtures in the range of from 5 to 50% oxygen have been shown effective. The exposure of the irradiated modified layer to earth's atmosphere for ten minutes is adequate to provide the desired degree of oxidation. Following this oxidation step, the surface is chemically etched. In the case of copper, silicon, and SiN substrates, a 1% aqueous solution of hydrofluoric acid has been successfully employed, allowing the etching of the oxidized modified layer 1838 to be etched away until the process stops on the unmodified substrate 1802. The inventors understand that different chemical etchants may be employed on different substrate materials, using this same treatment method.

FIG. 20E is a schematic 1840 showing the etched substrate 1842 following the chemical etching completion. An ultra-shallow etched region 1844 has been formed in the etched substrate 1842. The depth of the ultra-shallow etched region 1844 has a thickness of 3 nm, the irradiation depth of the Neutral Beam The upper surface of the ultra-shallow etched region 1844 is extremely smooth having an average roughness, Ra, of less than 10 angstroms (1 nm). The mask 1814 may be removed or stripped from the surface of the etched substrate 1842.

FIG. 20F is a schematic 1850 showing the finished etched substrate 1842 following stripping of the mask.

FIGS. 21A, 21B, 21C, 21D, 21E, and 21F are schematics that show steps in another alternate embodiment of a process for using an accelerated Neutral Beam derived from a GCIB to form controlled ultra-shallow etched regions in materials as is required for advanced micro-fabrication of some devices. The process uses an inert Neutral Beam to drive surface oxygen into the irradiated region.

Figure 21A:
FIGS. 21A, 21B, 21C, 21D, 21E, and 21F are schematics that show steps in another alternate embodiment of a process for using an accelerated Neutral Beam derived from a GCIB to form controlled ultra-shallow etched regions in materials as is required for advanced micro-fabrication of some devices.

FIG. 21A is a schematic 1900 of a substrate 1902 for controlled shallow etching.

Substrates of copper metal, silicon (semiconductor) and silicon nitride (SiN) have been tested with equally successful results.

Figure 21B:
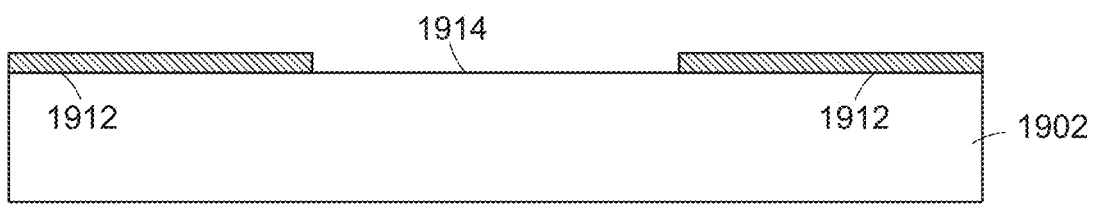

FIG. 21B is a schematic 1910 showing the substrate 1902 after an optional step of applying a mask 1912 to control beam exposure for patterned etching as is often required for microelectronic or micromechanical etching processes. The mask 1912 may be for example a photoresist or hard mask. Open region(s) 1914 of the substrate 1902 which are not covered by the mask 1912 are exposed for Neutral Beam irradiation and other processing.

Figure 21C:
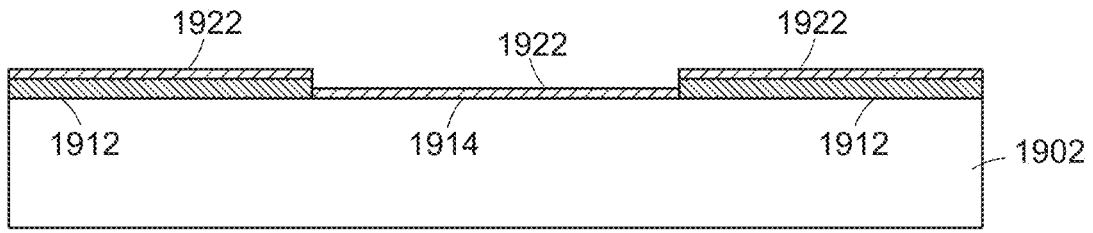

FIG. 21C is a schematic 1920 showing the formation of a thin coating of an oxygen-containing layer 1922 formed on the surface of the open region(s) 1914 and optionally on the mask 1912. The oxygen-containing layer 1922 is a layer of a few mono-layers, less than 5, of an oxygen-containing material (for example, not for limitation, O2, hydrogen peroxide, or water vapor) formed by exposure of the surface of the surfaces of the open region(s) 1914 and the optional mask 1912 to an atmosphere containing a significant partial pressure of the oxygen-containing layer. Under such conditions a oxygen-containing layer 1922 of several mono-layers forms in a few seconds. Since oxygen-containing layer 1922 is very thin it is readily driven into the surface by subsequent Neutral Beam irradiation, providing oxygen to the layer formed by the irradiation.

Figure 21D:
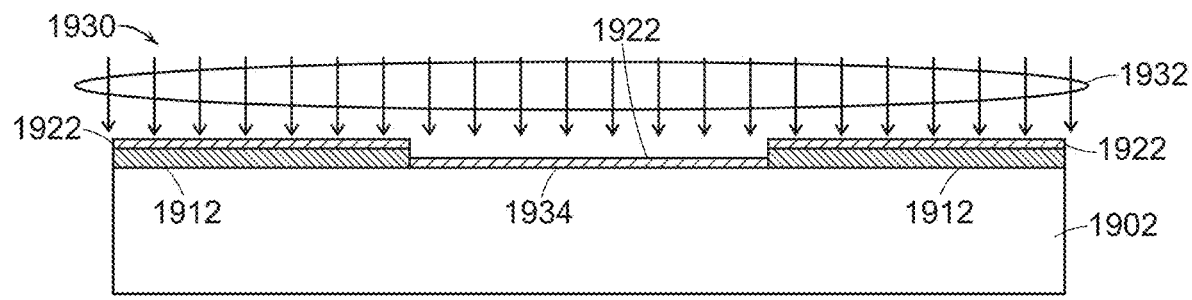

FIG. 21D is a schematic 1930 showing a step of irradiating the substrate 1902 through the oxygen-containing layer 1922 and the open region(s) 1914 of the mask 1912 with a dissociated Neutral Beam 1932. In one exemplary case (not for limitation) the Neutral Beam was a fully dissociated neutral argon monomer beam formed from an accelerated GCIB accelerated through 10 kV potential, with a dose chosen to provide a modified layer 1934 of about 3 nm in thickness on the substrate 1902. The accelerating potential, selection of source gas for the GCIB used to form the Neutral Beam, and the irradiated dose all affect the depth of the modified layer 1934 and these parameters may readily be chosen by routine experimentation to provide the desired thickness of the modified layer 1934. Once chosen the results are repeatable. Following this irradiation step, the surface is chemically etched. In the case of copper, silicon, and SiN substrates, a 1% aqueous solution of hydrofluoric acid has been successfully employed, allowing the etching of the modified layer 1934 to be etched away until the process stops on the unmodified substrate 1902. The inventors understand that different chemical etchants may be employed on different substrate materials, using this same treatment method.

Figure 21E:
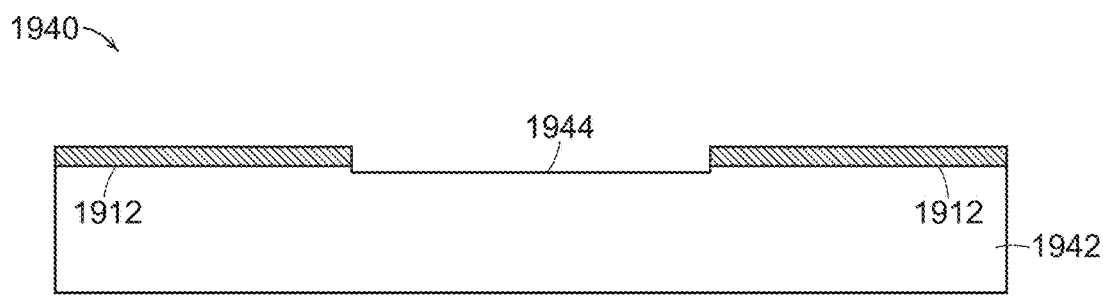

FIG. 21E is a schematic 1940 showing the etched substrate 1942 following the chemical etching completion. An ultra-shallow etched region 1944 has been formed in the etched substrate 1942. The depth of the ultra-shallow etched region 1944 has a thickness of 3 nm, the irradiation depth of the Neutral Beam The upper surface of the ultra-shallow etched region 1944 is extremely smooth having an average roughness, Ra, of less than 10 angstroms (1 nm). The mask 1912 may be removed or stripped from the surface of the etched substrate 1942.

Figure 21F:
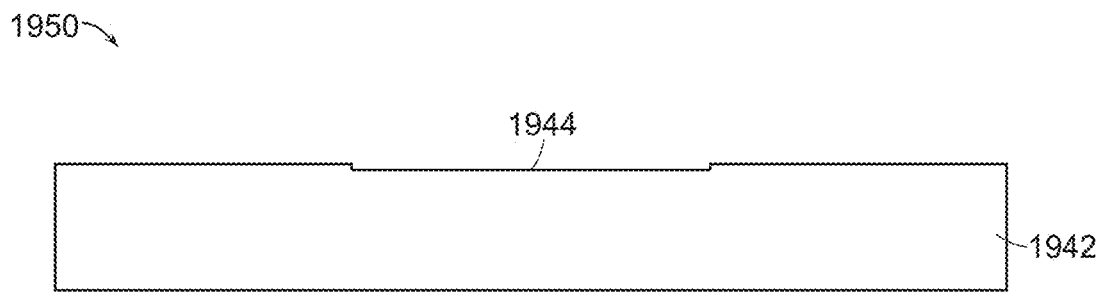

FIG. 21F is a schematic 1950 showing the finished etched substrate 1942 following stripping of the mask.

Figure 22:
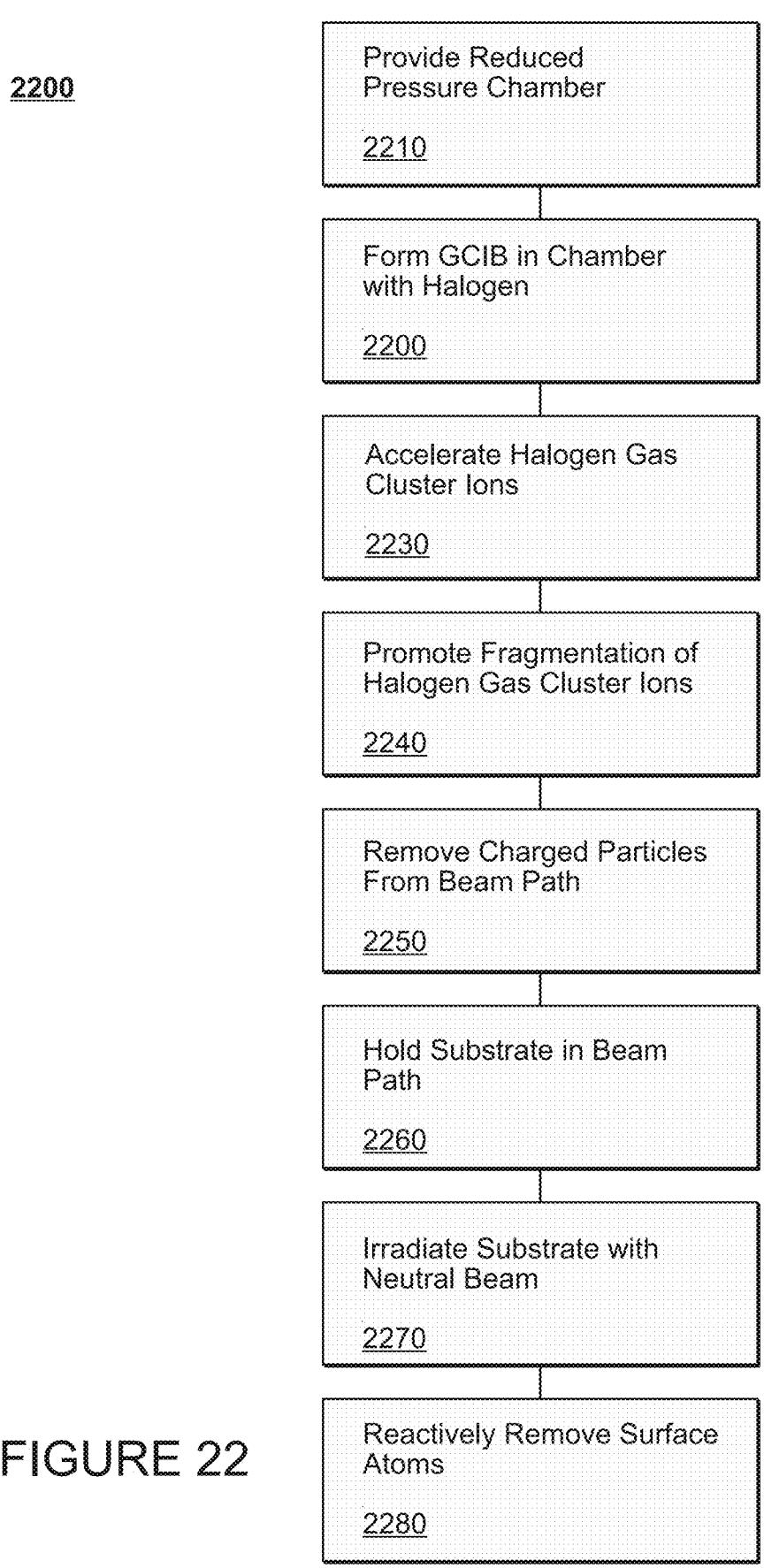
FIG. 22 is a process flow diagram showing steps of a method for reactively preparing a surface of a substrate according to an aspect of the present disclosure

FIG. 22 is a process flow diagram showing steps of a method for reactively preparing a surface of a substrate according to an aspect of the present disclosure. In an illustrative embodiment, the substrate includes a crystalline structure having surface irregularities. The method for reactively preparing a surface of a substrate 2200 includes steps of providing a reduced pressure chamber 2210 and forming a gas cluster ion beam within the reduced pressure chamber 2220. In an illustrative embodiment the gas cluster ion beam includes halogen gas cluster ions. The method then includes steps of accelerating the halogen gas cluster ions 2230 to form an accelerated halogen gas cluster ion beam along a beam path within the reduced pressure chamber and promoting fragmentation and/or dissociation of at least a portion of the accelerated halogen gas cluster ions along the beam path 2240. The method further includes steps of removing charged particles from the beam path 2250 to form an accelerated neutral halogen beam along the beam path in the reduced pressure chamber. According to an aspect of the present disclosure the substrate is held in the beam path at step 2260. At step 2270, a portion of a surface of the substrate is then irradiated with the accelerated neutral halogen beam. According to this aspect of the present disclosure, at step 2280 the neutral halogen beam reactively removes surface atoms and exposes an underlying crystalline surface interface region of the substrate.

In an illustrative embodiment of the disclosed method for reactively preparing a surface of a substrate, the step of removing removes essentially all charged particles from the beam path. In another illustrative embodiment, the removing step forms an accelerated neutral beam that is fully dissociated. In another illustrative embodiment, the step of promoting includes increasing the range of velocities of ions in the accelerated gas cluster ion beam. In an illustrative embodiment, the step of promoting includes introducing one or more gaseous elements used in forming the gas cluster ion beam into the reduced pressure chamber to increase pressure along the beam path. In another illustrative embodiment, the acceleration step accelerates the gas cluster ions through a potential of from 5 kV to 50 kV.

Figure 23:
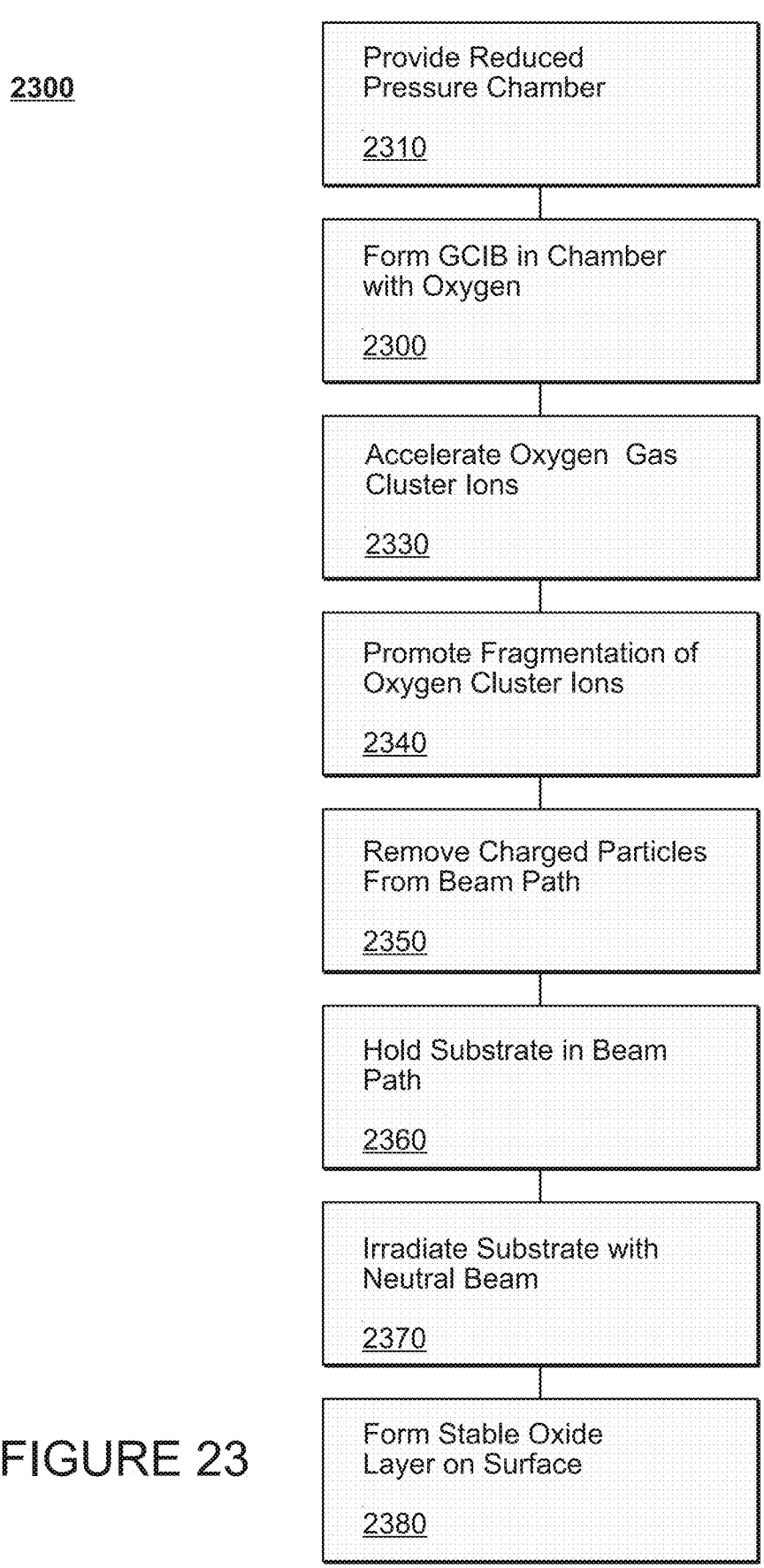
FIG. 23 is a process flow diagram showing steps of a method of a method for additively preparing a surface of a substrate according to another aspect of the present disclosure

FIG. 23 is a process flow diagram showing steps of a method for additively preparing a surface of a substrate according to another aspect of the present disclosure. In an illustrative embodiment, the substrate includes a crystalline structure having surface irregularities The method for additively preparing a surface of a substrate 2300 includes steps of providing a reduced pressure chamber 2310 and forming a gas cluster ion beam within the reduced pressure chamber 2320. In an illustrative embodiment, the gas cluster ion beam includes oxygen gas cluster ions. The method then includes steps of accelerating the oxygen gas cluster ions 2330 to form an accelerated oxygen gas cluster ion beam along a beam path within the reduced pressure chamber and promoting fragmentation and/or dissociation of at least a portion of the accelerated oxygen gas cluster ions along the beam path 2340. The method further includes steps of removing charged particles from the beam path to form an accelerated neutral oxygen beam along the beam path in the reduced pressure chamber 2350. According to an aspect of the present disclosure the substrate is held in the beam path at step 2360. At step 2370, a portion of a surface of the substrate is then irradiated with the accelerated neutral oxygen beam. At step 2380 the neutral oxygen beam reactively interacts with the substrate to form a stable oxide layer on the surface of the substrate.

In an illustrative embodiment of the disclosed method for additively preparing a surface of a substrate, the thickness of the stable oxide layer is controlled by controlling a dosage of the irradiating. In an illustrative embodiment, the thickness of the stable oxide layer is controlled to be 1-3 nm, for example.

In another illustrative embodiment, the disclosed method for additively preparing a surface of a substrate includes exposing the substrate to the atmosphere after the stable oxide layer is formed. In another illustrative embodiment, the disclosed method for additively preparing a surface of a substrate includes chemically removing the stable oxide layer, wherein the removing of the stable oxide layer exposes a surface crystal lattice of the of the substrate.

According to another illustrative embodiment of the disclosed method for additively preparing a surface of a substrate, the step of removing the stable oxide layer is performed immediately prior to next step processing. According to another illustrative embodiment, the removing step removes essentially all charged particles from the beam path. According to another illustrative embodiment, the removing step forms an accelerated neutral beam that is fully dissociated. According to another illustrative embodiment, the step of promoting includes increasing the range of velocities of ions in the accelerated gas cluster ion beam. According to another illustrative embodiment, the step of promoting includes introducing one or more gaseous elements used in forming the gas cluster ion beam into the reduced pressure chamber to increase pressure along the beam path. According to another illustrative embodiment, the acceleration step accelerates the gas cluster ions through a potential of from 5 kV to 50 kV.

Although embodiments of the present disclosure are described with reference to the inclusion of oxygen gas cluster ions to form an accelerated neutral oxygen beam for forming a stable oxide layer on a substrate, it should be understood that according to alternative embodiments of the present disclosure other gases such as nitrogen could be incorporated into an accelerated neutral ion beam to form other protective barrier layers on a substrate, wherein the other gasses form a material that could be reactively removed at a later time, for example.

Although embodiments of the invention have been described with respect to a hygroscopic LBO optical material, it is understood by the inventors that it is equally applicable to other hygroscopic crystalline materials as may be employed in optical and other applications. For examples hygroscopic thallium-doped sodium iodide crystals and slightly hygroscopic thallium- or sodium-doped cesium iodide crystals are used in gamma ray scintillation spectroscopy and are subject to degradation due to moisture absorption. Such degradation may be delayed or reduced by irradiation. Although the example described above utilized Neutral Beam irradiation of LBO, it is understood by the inventors that GCIB irradiation may also be applied effectively, though Neutral Beam irradiation is considered preferable in the case of materials having low electrical conductivity. It is also understood by the inventors that prior to irradiation to reduce surface degradation of hygroscopic materials, it may be useful to use a pretreatment of GCIB or Neutral beam to smooth the surface and remove existing surface degradation.

Although embodiments of the invention have been described with respect to silicon semiconductor materials, it is understood by the inventors that it is equally applicable to other semiconductor materials including germanium, and compound semiconductors including, without limitation, group 111-V and group II-VI and related materials and it is intended that the scope of the invention is intended to include those materials. It is understood by the inventors that although embodiments of the invention has been shown for exemplary purposes to be useful for processes such a smoothing, etching, film growth, film deposition, amorphization, and doping by using silicon semiconductor wafers, it is understood by the inventors that the benefits of the invention are not limited only to processes done on bare semiconductor surfaces, but are equally useful for processing portions of electrical circuits, electrical devices, optical elements, integrated circuits, micro-electrical mechanical systems (MEMS) devices (and portions thereof) and other devices that are commonly constructed using conventional modem technologies on silicon substrates, other semiconductor substrates, and substrates of other materials, and it is intended that the scope of the invention includes such applications. Although the benefits of applying the Neutral Beam of the invention for electrical charging-free processing have been described with respect to processing various electrically insulating and/or non-electrically-conductive materials such as insulating drug coatings, dielectric films such as oxides and nitrides, insulating corrosion inhibitor coatings, polymers, organic films, glasses, ceramics, it is understood by the inventors that all materials of poor or low electrical conductivity may benefit from using the Neutral Beam disclosed herein as a substitute for processing with charge transferring processing techniques like ion beams, plasmas, etc., and it is intended that the scope of the invention includes such materials. It is further understood by the inventors that Neutral Beam processing is advantageous not only because of its reduced charging characteristics, but also for processing many materials that are electrically conductive, where other advantages of Neutral Beam processing, especially neutral monomer beam processing, which produces less surface damage, better smoothing, and smoother interfaces between processed and underlying unprocessed regions, even in metals and highly conductive materials. It is intended that the scope of the invention includes processing of such materials.

Although the benefits of applying the Neutral Beam disclosed herein for electrical charging-free processing have been described with respect to processing various insulating and/or non-electrically-conductive materials, it is understood by the inventors that the charge-free Neutral Beam processing benefits apply equally to the processing of electrically conductive, semiconductive, or slightly conductive materials that exist in the form of coatings or layers or other forms overlying insulating layers or disposed upon insulating substrates, wherein the at least slightly conductive materials have no reliable ground connection or other pathway for removing surface charges that may be induced by processing using charge transferring processing techniques. In such cases, charging of the at least slightly conductive materials during processing may produce damage to those materials or to the underlying insulating materials. The charging and damage may be avoided by using the Neutral Beam processing of the invention. It is intended by the inventors that the scope of the invention includes processing of such dissimilar material arrangements where an at least slightly conductive material overlays an insulating material.

Although the benefits of applying the Neutral Beam of the invention for smoothing optical materials have been described with respect to processing Coming type 0211 optical glass, an amorphous material it is understood by the inventors that the charge-free Neutral Beam processing benefits apply equally to the processing other optical materials, amorphous or crystalline, including without limit, glasses, quartz, sapphire, diamond, and other hard, transparent optical materials (either employed as optical elements or as gem [natural or synthetic] materials). It is further understood by the inventors that Neutral Beam processing may be used for also applying optical coatings to such materials and for affecting optical characteristics of such materials, such as the refractive index. It is intended by the inventors that the scope of the invention includes processing of such materials for optical and gem applications.

Although the invention has been described with respect to various embodiments, it should be realized this invention is also capable of a wide variety of further and other embodiments within the spirit and scope of the invention.

The invention claimed is:

1. A method for reactively preparing a surface of a substrate comprising the steps of: providing a reduced pressure chamber;
   forming a gas cluster ion beam comprising halogen gas cluster ions within the reduced pressure chamber;
   accelerating the halogen gas cluster ions to form an accelerated halogen gas cluster ion beam along a beam path within the reduced pressure chamber;
   promoting fragmentation and/or dissociation of at least a portion of the accelerated halogen gas cluster ions along the beam path;
   removing charged particles from the beam path to form an accelerated neutral halogen beam along the beam path in the reduced pressure chamber;
   holding the substrate in the beam path;
   irradiating a portion of a surface of the substrate with the accelerated neutral halogen beam, wherein the accelerated neutral halogen beam reactively removes surface atoms and exposes an underlying crystalline surface interface region of the substrate.

2. The method of claim 1, wherein the substrate comprises a crystalline structure having surface irregularities.

3. The method of claim 1, wherein the step of removing removes essentially all charged particles from the beam path.

4. The method of claim 1, wherein the removing step forms an accelerated neutral beam that is fully dissociated.

5. The method of claim 1, wherein the step of promoting includes increasing the range of velocities of ions in the accelerated gas cluster ion beam.

6. The method of claim 1, wherein the step of promoting includes introducing one or more gaseous elements used in forming the gas cluster ion beam into the reduced pressure chamber to increase pressure along the beam path.

7. The method of claim 1, wherein the acceleration step accelerates the gas cluster ions through a potential of from 5 to 50 kV.

8. A method for additively preparing a surface of a substrate, the method comprising the steps of:
providing a reduced pressure chamber;
forming a gas cluster ion beam comprising oxygen gas cluster ions within the reduced pressure chamber;
accelerating the oxygen gas cluster ions to form an accelerated oxygen gas cluster ion beam along a beam path within the reduced pressure chamber;
promoting fragmentation and/or dissociation of at least a portion of the accelerated oxygen gas cluster ions along the beam path;
removing charged particles from the beam path to form an accelerated neutral oxygen beam along the beam path in the reduced pressure chamber;
holding the substrate in the beam path;
irradiating at least a portion of a surface of the substrate with the accelerated neutral oxygen beam, wherein the accelerated neutral oxygen beam reactively interacts with the substrate to form a stable oxide layer on the surface of the substrate.

9. The method of claim 8, wherein the substrate comprises a crystalline structure having surface irregularities.

10. The method of claim 8, comprising controlling the thickness of the stable oxide layer by controlling a dosage of the irradiating.

11. The method of claim 8, wherein the thickness of the stable oxide layer is 1-3 nm.

12. The method of claim 8, comprising exposing the substrate to the atmosphere after the stable oxide layer is formed.

13. The method of claim 8 comprising, chemically removing the stable oxide layer, wherein the removing of the stable oxide layer exposes a surface crystal lattice of the of the substrate.

14. The method of claim 8, wherein the removing of the stable oxide layer is performed immediately prior to next step processing.

15. The method of claim 8, wherein the step of removing removes essentially all charged particles from the beam path.

16. The method of claim 8, wherein the removing step forms an accelerated neutral beam that is fully dissociated.

17. The method of claim 8, wherein the step of promoting includes increasing the range of velocities of ions in the accelerated gas cluster ion beam.

18. The method of claim 8, wherein the step of promoting includes introducing one or more gaseous elements used in forming the gas cluster ion beam into the reduced pressure chamber to increase pressure along the beam path.

19. The method of claim 8, wherein the acceleration step accelerates the gas cluster ions through a potential of from 5 to 50 kV.

* * * * *